(12) United States Patent
Takagi et al.

(10) Patent No.: US 6,753,555 B2
(45) Date of Patent: Jun. 22, 2004

(54) DTMOS DEVICE HAVING LOW THRESHOLD VOLTAGE

(75) Inventors: Takeshi Takagi, Kyoto (JP); Akira Inoue, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/268,905

(22) Filed: Oct. 11, 2002

(65) Prior Publication Data
US 2003/0052348 A1 Mar. 20, 2003

Related U.S. Application Data

(63) Continuation of application No. 09/712,223, filed on Nov. 15, 2000, now Pat. No. 6,512,252.

(30) Foreign Application Priority Data
Nov. 15, 1999 (JP) .............................. 11-324009

(51) Int. Cl.[7] .................. H01L 31/0328; H01L 31/0312
(52) U.S. Cl. .......................... 257/192; 257/77; 257/616; 257/347; 257/349; 257/352
(58) Field of Search .......................... 257/192, 77, 616, 257/347, 349, 352, 190, 194, 19, 288

(56) References Cited

U.S. PATENT DOCUMENTS

| | | | |
|---|---|---|---|
| 5,780,899 A | | 7/1998 | Hu et al. |
| 5,936,278 A | * | 8/1999 | Hu et al. ................. 257/336 |
| 6,204,138 B1 | * | 3/2001 | Krishnan et al. ........... 438/307 |
| 6,380,590 B1 | | 4/2002 | Yu |
| 6,414,353 B2 | * | 7/2002 | Maeda et al. ............. 257/347 |
| 2001/0001483 A1 | | 5/2001 | Bryant et al. |

OTHER PUBLICATIONS

F. Assaderaghi et al., "Dynamic Threshold–Voltage MOSFET (DTMOS) for Ultra–Low Voltage VLSI", IEEE Transactions on Electron Devices, vol. 44. No. 3, pp. 414–422, Mar. 1997.

* cited by examiner

Primary Examiner—Minhloan Tran
Assistant Examiner—Tan Tran
(74) Attorney, Agent, or Firm—McDermott, Will & Emery

(57) ABSTRACT

A HDTMOS includes a Si substrate, a buried oxide film and a semiconductor layer. The semiconductor layer includes an upper Si film, an epitaxially grown Si buffer layer, an epitaxially grown SiGe film, and an epitaxially grown Si film. Furthermore, the HDTMOS includes an n-type high concentration Si body region, an $n^-$ Si region, a SiGe channel region containing n-type low concentration impurities, an n-type low concentration Si cap layer, and a contact which is a conductor member for electrically connecting the gate electrode and the Si body region. The present invention extends the operation range while keeping the threshold voltage small by using, for the channel layer, a material having a smaller potential at the band edge where carriers travel than that of a material constituting the body region.

24 Claims, 37 Drawing Sheets

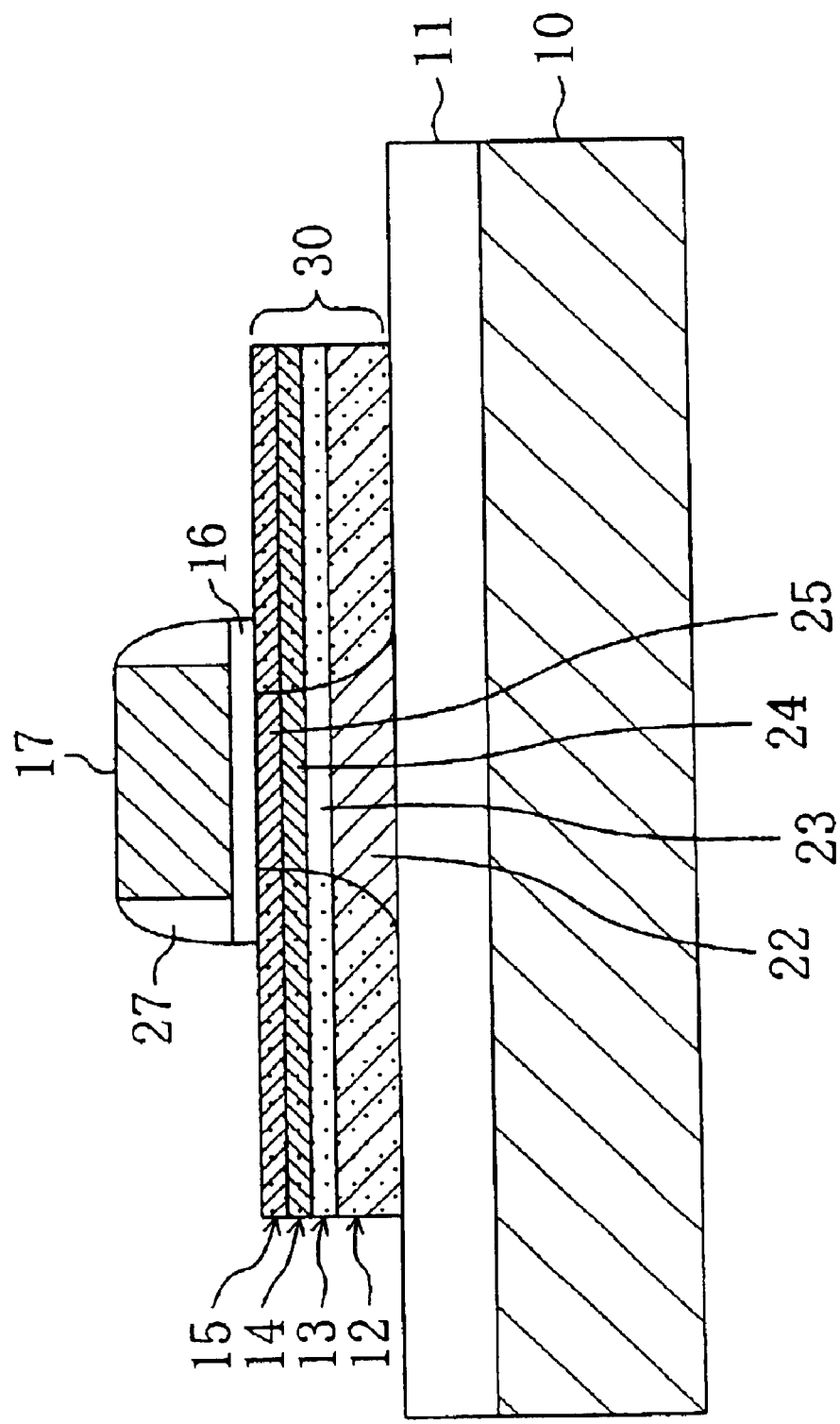

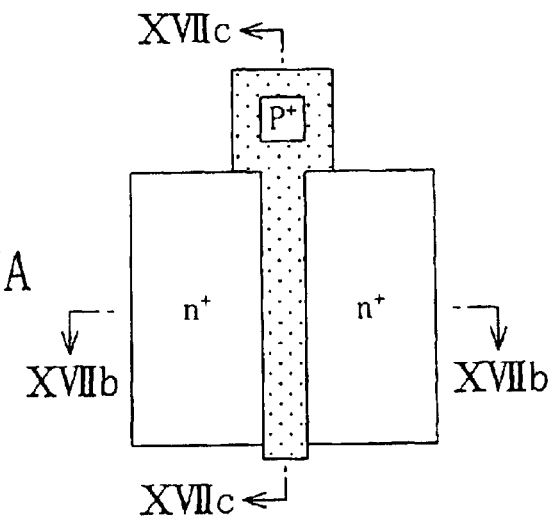
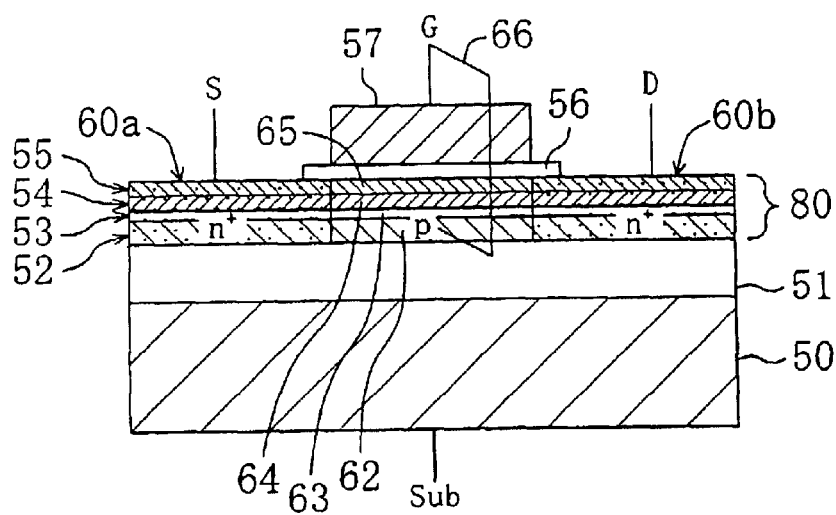
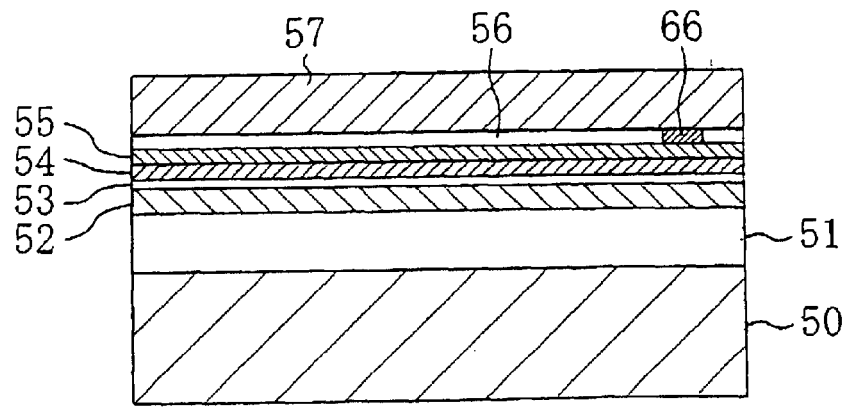

FIG. 40
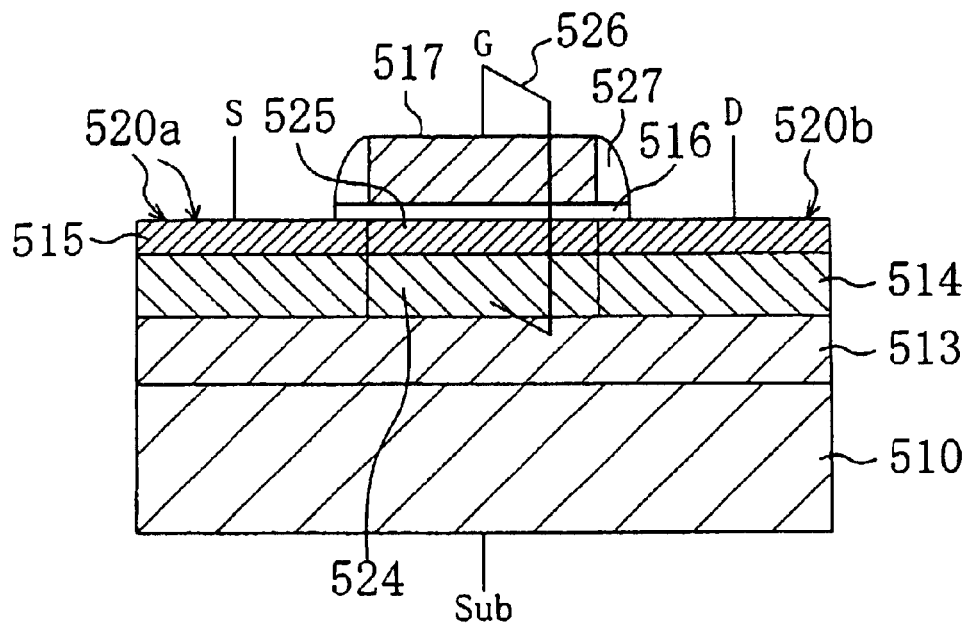
FIG. 41
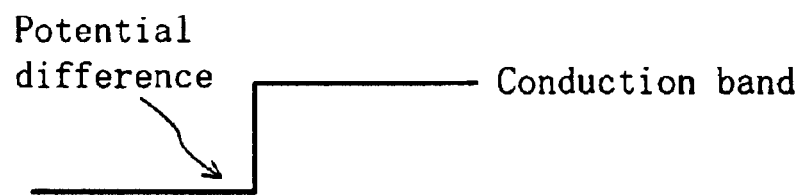
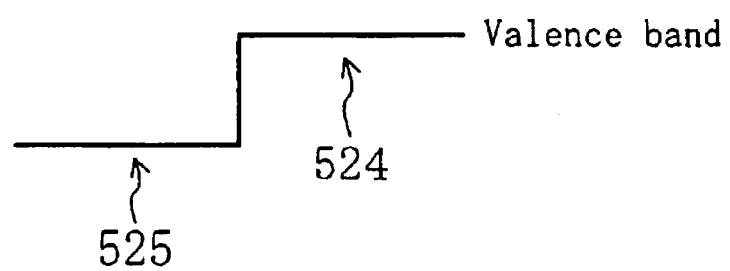

DTMOS DEVICE HAVING LOW THRESHOLD VOLTAGE

BACKGROUND OF THE INVENTION

The present invention relates to a semiconductor device that functions as a DTMOS or a MISFET having a heterojunction active region.

In recent years, portable information terminal units driven by a battery are widely used. In such units, there is a strong demand for reducing the power supply voltage without compromising high speed operations in order to prolong the battery lifetime. Reducing the threshold voltage is effective in realizing high speed operations. In this case, however, the leakage current at the time when the gate is off becomes large, so that it is inevitable that there should be a lower limit for threshold voltage.

As a device that can solve this problem and has a small leakage current at a low voltage and high driving ability, a device called DTMOS (Dynamic Threshold Voltage MOSFET) has been proposed, as disclosed in, for example, a literature "A Dynamic Threshold Voltage MOSFET (DTMOS) for Ultra-Low Voltage Operation", by F. Assaderaghi et. al., IEDM94 Ext. Abst. P.809.

FIGS. 1 and 2 are a cross-sectional view and a plan view schematically showing a conventional DTMOS structure, respectively. As shown in FIG. 1, the conventional DTMOS uses a SOI substrate including a p-type silicon substrate (p$^-$ Si Sub), a buried oxide film layer (Buried Oxide) and a semiconductor layer, which serves as a substrate active region. The conventional DTMOS further includes a gate insulator film ($SiO_2$) on the substrate active region, a gate (n$^+$ poly-Si), source and drain regions (n$^+$ layer) in regions on both sides of the gate of the substrate active region, a channel region (a surface portion of the p layer) in a region between the source and drain regions of the substrate active region. A substrate region below and on the sides of the channel region (body) is connected to the gate electrode by wiring for electrical short-circuit. When a bias voltage Vg is applied to the gate while the gate is tied to the body, a forward bias voltage having the same magnitude as that of the gate bias voltage Vg is applied to the channel region via the body. Thus, this DTMOS has the same state as that of a regular MOS transistor at the time when the gate bias is off, and the body is biased in the forward direction as the gate bias voltage Vg is increased at the time when the gate bias is on (this occurs because the energy level of the conduction band edge of the channel region is decreased in the n-channel type MOS transistor shown in FIG. 1. Therefore, the threshold voltage Vt drops.

When such a DTMOS is compared with a regular MOS transistor (transistor where the gate and the body are not short-circuited) formed on a SOI substrate, the leakage current of the DTMOS is equal to that of the regular transistor at the time when the gate bias is off. On the other hand, since the threshold voltage drops at the time when the gate bias is on, as described above, the gate over drive effect increases, so that the driving ability increases significantly. Furthermore, in the DTMOS, there is substantially no electric potential difference between the gate and the channel region, and therefore the electric field in the vertical direction on the surface of the substrate is significantly small, compared with that of the regular transistor. As a result, the degradation of the mobility of carriers due to an increase of the electric filed in the vertical direction is suppressed, so that the driving ability is increased significantly.

Thus, the DTMOS functions as a transistor that can operate at high speed at a low threshold voltage, i.e., a low power supply voltage, as long as the operating voltage is in the range within which a parasitic bipolar transistor in the lateral direction generated between the n-type gate, the p-type body (base), and the n-type source (emitter) and drain regions (collector) is not on, and therefore the body current is not so large as to cause a practical problem.

However, in the case of such a DTMOS structure, in order to suppress standby current, it is necessary to limit the voltage to be applied to the gate to up to about 0.6V, at which a parasitic bipolar transistor in the lateral direction is on. This is because the base current (the gate current or the body current that flows between the gate and the body in the DTMOS) of the parasitic bipolar transistor in the lateral direction is determined substantially by the built-in potential of the silicon, and therefore the gate current or the body current (base current) becomes significantly large when the gate bias voltage Vg (base voltage) is about 0.6V.

FIG. 7 is a graph showing simulation results of the gate bias voltage dependence of the drain current and the body current. The bold broken line in FIG. 7 shows the drain current Id of the conventional DTMOS, and the thin broken line in FIG. 7 shows the body current Ib of the conventional DTMOS. In FIG. 7, simulation is conducted with respect to the DTMOS that operates as a p-channel type MOS transistor, and therefore the gate bias voltage is negative values. However, in the case of an n-channel type DTMOS, the gate bias voltage is positive. These simulation results were obtained, assuming that the impurity concentration of the body is $1 \times 10^{18}$ atoms·cm$^{-3}$, the gate length is 0.5 μm, and the thickness Tox of the gate insulator film is 10 nm. As seen from the curves of the broken lines in FIG. 7, in the conventional DTMOS shown in FIG. 1, the body current Ib is equal to or larger than the value (about $10^{-9}$A) that causes a practical problem at 0.6V or more of the gate bias voltage. Therefore, in order to avoid this problem, the operating voltage range is limited to very narrow.

Furthermore, in the conventional DTMOS, the necessity of reducing the threshold voltage does not allow the impurity concentration of the body to be high. In fact, the above-described literature states that the concentration of the p-type impurity of the body is about 1.5 to $3 \times 10^{17}$ cm$^{-3}$. As a result, the resistance of the body becomes significantly high, so that the voltage drop at the body prevents efficient conduction of the electric potential of the gate to the channel region. As a result, a CR delay becomes detrimental to dynamic operations and inhibits high speed operations.

Moreover, since the concentration of the impurity of the body is low, the short channel effect that occurs when the gate length is made short becomes significant. This is because, when the gate length is short, the punch-through occurs readily between the source and the drain regions because of expansion of the depletion layer in the body. In other words, in the conventional DTMOS, it was practically difficult to improve the device performance or the integration degree by miniaturization of the size (miniaturization of the gate length) of the transistor.

SUMMARY OF THE INVENTION

It is an object of the present invention to provide a semiconductor device functioning as a DTMOS that has a low threshold voltage, can operate at a high speed, and has a wide operation range.

A semiconductor device of the present invention includes a substrate, a semiconductor layer provided in a part of the substrate, a gate insulator film provided on the semiconductor layer, a gate electrode provided on the gate insulator film, source and drain regions of a first conductivity type provided in regions on both sides of the gate electrode of the semiconductor layer, a channel region made of a first semiconductor provided in a region between the source and drain regions of the semiconductor layer, a body region of the second conductivity type made of a second semiconductor having a larger potential at a band edge where carriers travel than that of the first semiconductor, provided in a region below the channel region of the semiconductor layer; and a conductor member for electrically connecting the gate electrode and the body region.

Thus, the gate electrode and the body region are electrically connected, so that even if a voltage is applied to the gate electrode, the body region is maintained at substantially the same electric potential as that of the gate electrode. Therefore, no inversion layer is generated in a region other than the channel region of the semiconductor layer, and thus formation of a parasitic channel is suppressed. In addition, the channel region is constituted by the first semiconductor having a smaller potential at a band edge where carriers travel than that of the second semiconductor constituting the body region. Therefore, the gate bias necessary for inversion of the channel region, that is, the threshold voltage can be decreased. Consequently, the drain current is increased, and the difference between the drain current and the body (gate) current flowing in the channel region increases. Thus, the operating voltage range can be extended. This is the same principle that is used for the hetero bipolar transistor in order to increase collector current while keeping the base current at the same level by using a material having a small band gap for the base layer in a bipolar transistor.

The present invention further includes a cap layer made of a semiconductor having a larger potential at a band edge where carriers travel than that of the first semiconductor, provided in a region between the channel region and the gate insulator film of the semiconductor layer. Thus, the gate insulator film can be constituted by an oxide film having good electric characteristics. On the other hand, since the gate electrode and the body region are electrically connected, even if the gate bias is increased, no parasitic channel is generated between the gate insulator film and the cap layer.

The operation speed of the semiconductor can be higher by constituting at least the uppermost portion of the substrate by an insulator, because the parasitic capacitance is reduced.

The increase of the threshold voltage can be suppressed, and impurity scattering can be suppressed by having the channel region contain impurities in a lower concentration than that of the body region by $\frac{1}{10}$ or less. Therefore, a reduction of the speed at which carriers travel can be suppressed.

A built-in potential is formed between the gate electrode and the channel region by constituting the gate electrode by polysilicon or polysilicon germanium containing impurities of the first conductivity. Thus, a band structure suitable for carrier confine can be obtained.

The first semiconductor constituting the channel region contains at least Si as a constituent element, and a portion of the semiconductor layer further includes a region for preventing impurities from diffusing to the channel that contains carbon in a concentration from 0.01% to 2%. With this embodiment, a semiconductor device that can operate at a high speed can be obtained, where scattering of impurities from the body region containing high concentration impurities to the channel region is suppressed, and impurity scattering hardly occurs in the channel region.

The first semiconductor is a semiconductor containing Si (silicon) and Ge (germanium) as constituent elements, and the second semiconductor is Si. With this embodiment, a channel region suitable for p-channel in which holes travel can be obtained by utilizing a band offset generated in the valence band edge of the first semiconductor pair.

The present invention further includes a cap layer made of Si, provided between the gate insulator film and the channel region. Thus, the region in contact with the band offset generated between the cap layer and the channel region of the channel region can be used as a channel. Moreover, the gate insulator film can be constituted by a silicon oxide film having good electric characteristics obtained by oxidizing the surface of the cap layer.

The source and drain regions may be p-type source and drain regions, the channel region may be a channel region for p-channel, and the body region may be an n-type body region. Alternatively, the source and drain regions may be n-type source and drain regions, the channel region may a channel region for n-channel, and the body region may be a p-type body region. With these components, a complementary transistor can be formed.

The first semiconductor is a semiconductor containing Si, Ge and C as constituent elements, and the second semiconductor is Si. Thus, a channel region that can be used both for n-channel and p-channel can be obtained, utilizing the band offsets at the conduction band edge and the valence band edge formed in the Si/SiGeC junction portion.

The first semiconductor may be Si under tensile strain, and the second semiconductor may be SiGe where lattice strain is relaxed.

A second semiconductor device of the present invention includes a substrate, a semiconductor layer provided in a part of the substrate, a gate insulator film provided on the semiconductor layer, a gate electrode provided on the gate insulator film, n-type source and drain regions provided in regions on both sides of the gate electrode of the semiconductor layer, a channel region for n-channel made of a first semiconductor containing Si and Ge as constituent elements and containing p-type impurities, provided in a region between the source and drain regions of the semiconductor layer, and a body region made of a second semiconductor containing Si as a constituent element and having a larger potential at a band edge where carriers travel than that of the first semiconductor, and containing p-type impurities, provided in a region below the channel region of the semiconductor layer.

The semiconductor device of the present invention further includes a cap layer containing Si as a constituent element and containing p-type impurities, provided in a region between the channel region and the gate insulator film of the semiconductor layer. Thus, a well suitable for confining electrons can be formed, utilizing the band offset at the conduction band edge formed between the cap layer and the channel region. Then, an n-channel type MIS transistor utilizing Si/SiGe junction can be obtained.

The semiconductor device of the present invention further includes a conductor member for electrically connecting the gate electrode and the body region. Thus, a semiconductor device that functions as a DTMOS can be obtained.

At least the uppermost portion of the substrate is constituted by an insulator. Thus, a transistor utilizing a so-called SOI substrate that has a small parasitic capacitance and can operate in a high speed can be obtained.

It is preferable that the gate electrode is constituted by polysilicon or polysilicon germanium containing impurities of the first conductivity.

The first semiconductor may be SiGeC, and the second semiconductor may be Si.

This and other advantages of the present invention will become apparent to those skilled in the art upon reading and understanding the following detailed description with reference to the accompanying figures.

BRIEF DESCRIPTION OF THE DRAWINGS

FIG. 4 is a cross-sectional view showing the structure of a HDTMOS of the first embodiment in greater detail.

FIG. 17A is a plan view schematically showing the structure of a HDTMOS of a second embodiment.

FIG. 17B is a cross-sectional view taken along line XVIIb—XVIIb of FIG. 17A.

FIG. 17C is a cross-sectional view taken along line XVIIc—XVIIc of FIG. 17A.

FIG. 40 is a cross-sectional view of a HDTMOS that functions as an n-channel type transistor of an eighth embodiment.

FIG. 41 is an energy band diagram showing a band structure across a body region made of a relaxed SiGe film and a Si channel region made of a Si film under tensile strain.

DETAILED DESCRIPTION OF THE INVENTION

First Embodiment

In this embodiment, examples of DTMOS utilizing a Si/SiGe heterojunction using SiGe as a material constituting a channel region.

Figure 1:
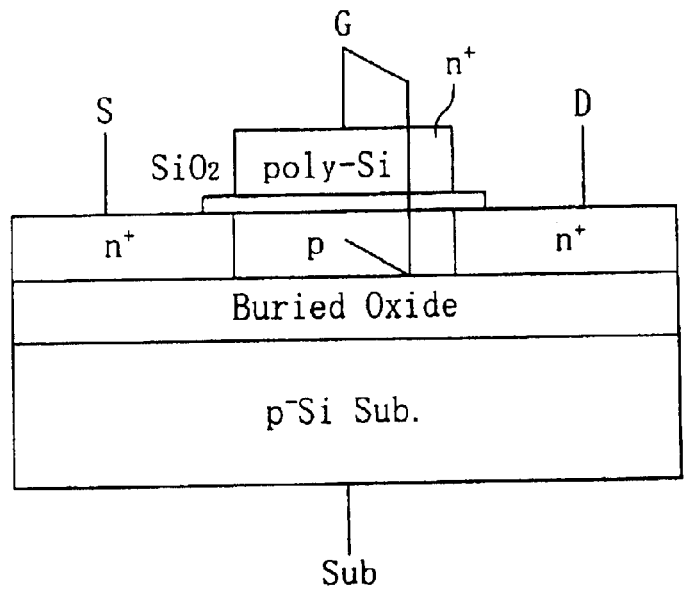
FIG. 1 is a cross-sectional view schematically showing the structure of a conventional DTMOS.
Figure 2:
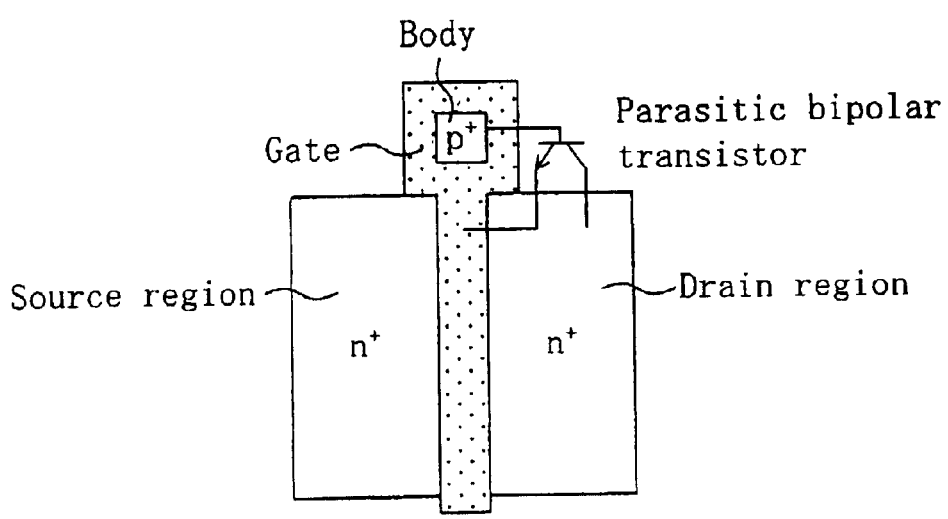
FIG. 2 is a plan view schematically showing the structure of a conventional DTMOS.
Figure 3A:
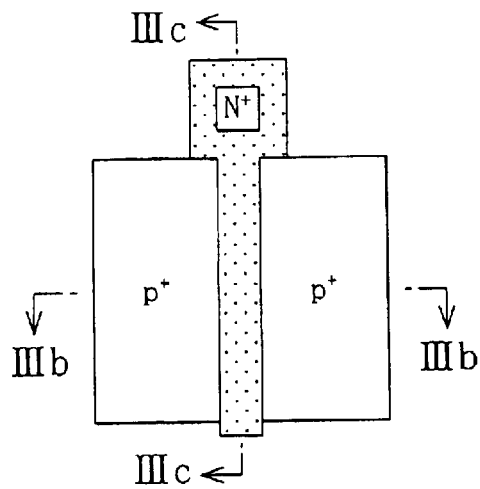
FIG. 3A is a plan view schematically showing the structure of a HDTMOS of a first embodiment.
Figure 3B:
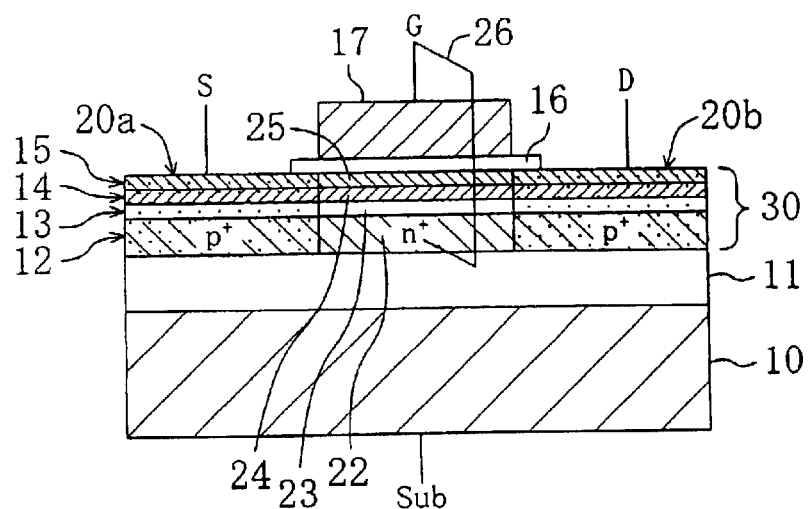
FIG. 3B is a cross-sectional view taken along line IIIb—IIIb of FIG. 3A.
Figure 3C:
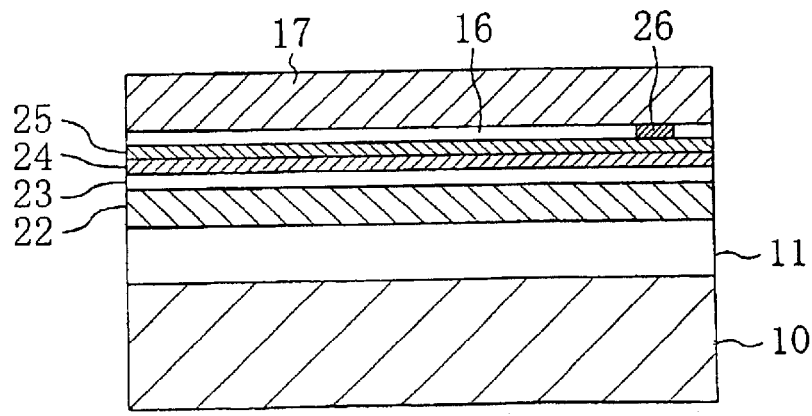
FIG. 3C is a cross-sectional view taken along line IIIc—IIIc of FIG. 3A.

FIG. 3A is a plan view schematically showing the structure of a HDTMOS of this Embodiment. FIG. 3B is a cross-sectional view taken along line IIIb—IIIb of FIG. 3A. FIG. 3C is a cross-sectional view taken along line IIIc—IIIc of FIG. 3A. As shown in FIGS. 3A to 3C, the HDTMOS of this embodiment includes a p-type Si substrate 10, a buried oxide film 11 formed on the Si substrate, for example by a method of implanting oxygen ions, and a semiconductor layer 30 provided on the buried oxide film 11. The semiconductor layer 30 includes an upper Si film 12 constituting an upper portion of the SOI substrate, a Si buffer layer 13 epitaxially grown by a UHV-CVD method on the upper Si film 12, a SiGe film 14 epitaxially grown by a UHV-CVD method on the Si buffer layer 13, and a Si film 15 epitaxially grown by a UHV-CVD method on the SiGe film 14. Furthermore, the HDTMOS includes a gate insulator film 16 formed of a silicon oxide film provided on the Si film 15 and a gate electrode 17 provided on the gate insulator film 16. A source region 20a and a drain region 20b containing p-type high concentration impurities are provided in regions on both sides of the gate electrode 17 of the semiconductor layer 30, i.e., the upper Si film 12, the Si buffer layer 13, the SiGe film 14 and the Si film 15. Furthermore, a Si body region 22 containing n-type high concentration impurities is formed in a region between the source region 20a and the drain region 20b of the upper Si film 12. An n⁻ Si region 23 containing n-type low concentration impurities is formed in a region immediately above the Si body region 22 of the Si buffer layer 13. A SiGe channel region 24 containing relatively n-type low concentration impurities is formed in a region between the source region 20a and the drain region 20b of the SiGe film 14. A Si cap layer 25 containing n-type low concentration impurities is formed in a region immediately below the gate insulator film 16 of the Si film 15. Furthermore, a contact 26 as a conductor member that electrically connects the gate electrode 17 and the Si body region 22 is provided.

FIG. 4 is a cross-sectional view showing the structure of the HDTMOS of this embodiment in greater detail. In this example, the buried oxide film 11 is about 100 nm thick. The upper Si film 12 is about 100 nm thick. The Si buffer layer 13 is about 10 nm thick. The SiGe film 14 is about 15 nm thick. The Si film 15 is about 5 nm thick. The Si body region 22 contains n-type impurities (e.g., arsenic or phosphorus) in a concentration of about $1 \times 10^{19}$ atoms·cm⁻³ by performing ion implantation before epitaxial growth of the Si buffer layer 13. The n⁻ Si region 23 contains n-type low concentration impurities (e.g., arsenic or phosphorus). The Ge content of the SiGe channel region 24 is about 40%, and the SiGe channel region 24 contains n-type impurities (e.g., arsenic or phosphorus. The Si cap layer 25 contains n-type low concentration impurities (e.g., arsenic or phosphorus). The gate insulator film 16 is formed by thermally oxidizing the Si film 15. The gate electrode 17 is doped with p-type impurities (e.g., boron) in a concentration of about $1 \times 10^{20}$ atoms·cm⁻³. Side walls 27 made of silicon oxide films are provided on the sides of the gate electrode 17.

Figure 5:
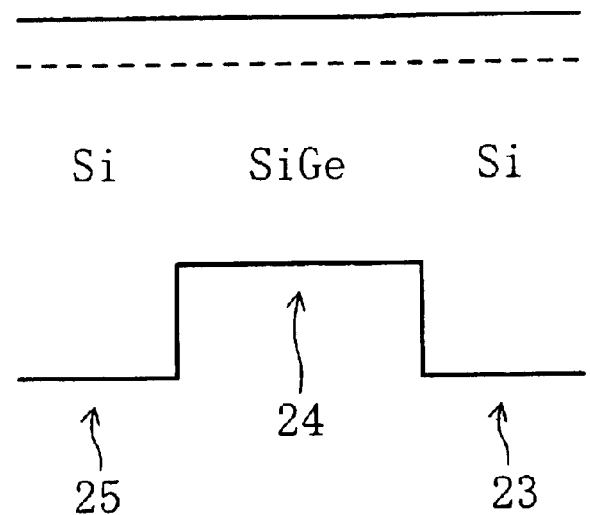
FIG. 5 is an energy band diagram showing band alignment in the cross section taken across a Si cap layer, a SiGe channel region and an n⁻ Si region.

FIG. 5 is an energy band diagram showing the band alignment in the cross-section taken across the Si cap layer 25, the SiGe channel region 24 and the n⁻ Si region 23. The band gap of the SiGe channel region 24 having a Ge content of 40% is smaller by about 300 meV than those of the Si cap layer 25 and the n⁻ Si region 23. Therefore, a heterobarrier at the valence band edge that can confine holes can be formed between the SiGe channel region 24 and the Si cap layer 25 and between the SiGe channel region 24 and the n⁻ Si region 23.

Figure 6:
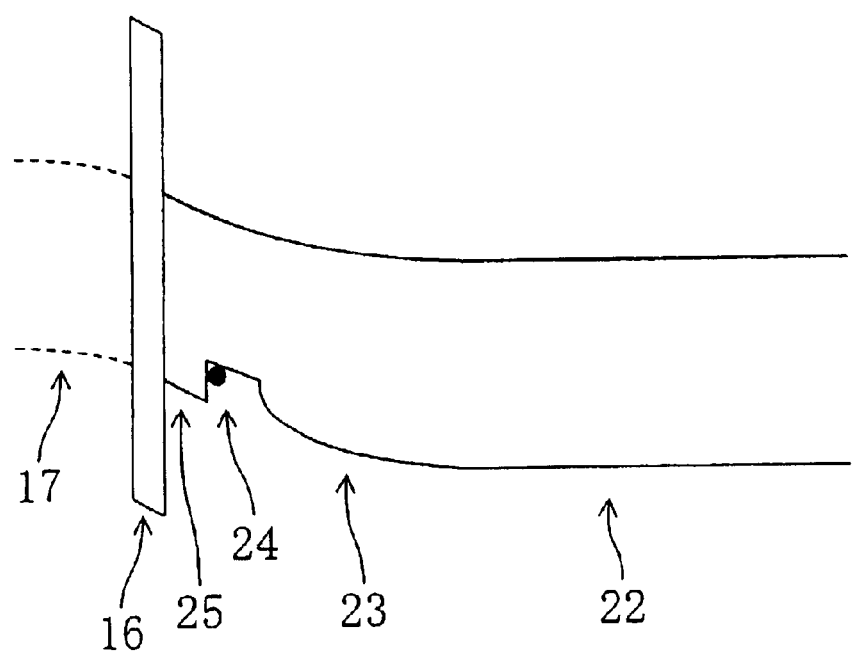
FIG. 6 is an energy band diagram showing built-in band structure in the cross section taken from a gate electrode to a Si body region in the first embodiment.

FIG. 6 is an energy band diagram showing a built-in band structure in the cross-section taken across the gate electrode 17, the gate insulator film 16, the Si cap layer 25, the SiGe channel region 24, the n⁻ Si layer 23 and the Si body region 22. As shown in FIG. 6, by doping the gate electrode 17 with p-type impurities, the energy at the valence band edge of a portion of the SiGe channel region 24 that is in contact with the Si cap layer 25 is particularly high under no application of bias, and a recess suitable for hole confine is formed between the heterobarriers. Therefore, even if a gate bias voltage is applied to the gate electrode 17 while the gate electrode 17 and the Si body region 22 are electrically connected, the gate electrode 17 and the Si body region 22 are maintained at substantially the same electric potential. Therefore, the band shape shown in FIG. 6 is unchanged, and only the overall potential is changed with respect to the source and drain regions. Consequently, an inversion layer that is generated in a portion of the Si cap layer 25 that is in contact with the gate insulator film 16 in a conventional Si/SiGe-hetero MOSFET is not generated in the HDTMOS of the present invention. As a result, formation of a so-called parasitic channel, which may be formed in another portion than the SiGe channel region 24, can be prevented effectively.

Figure 7:
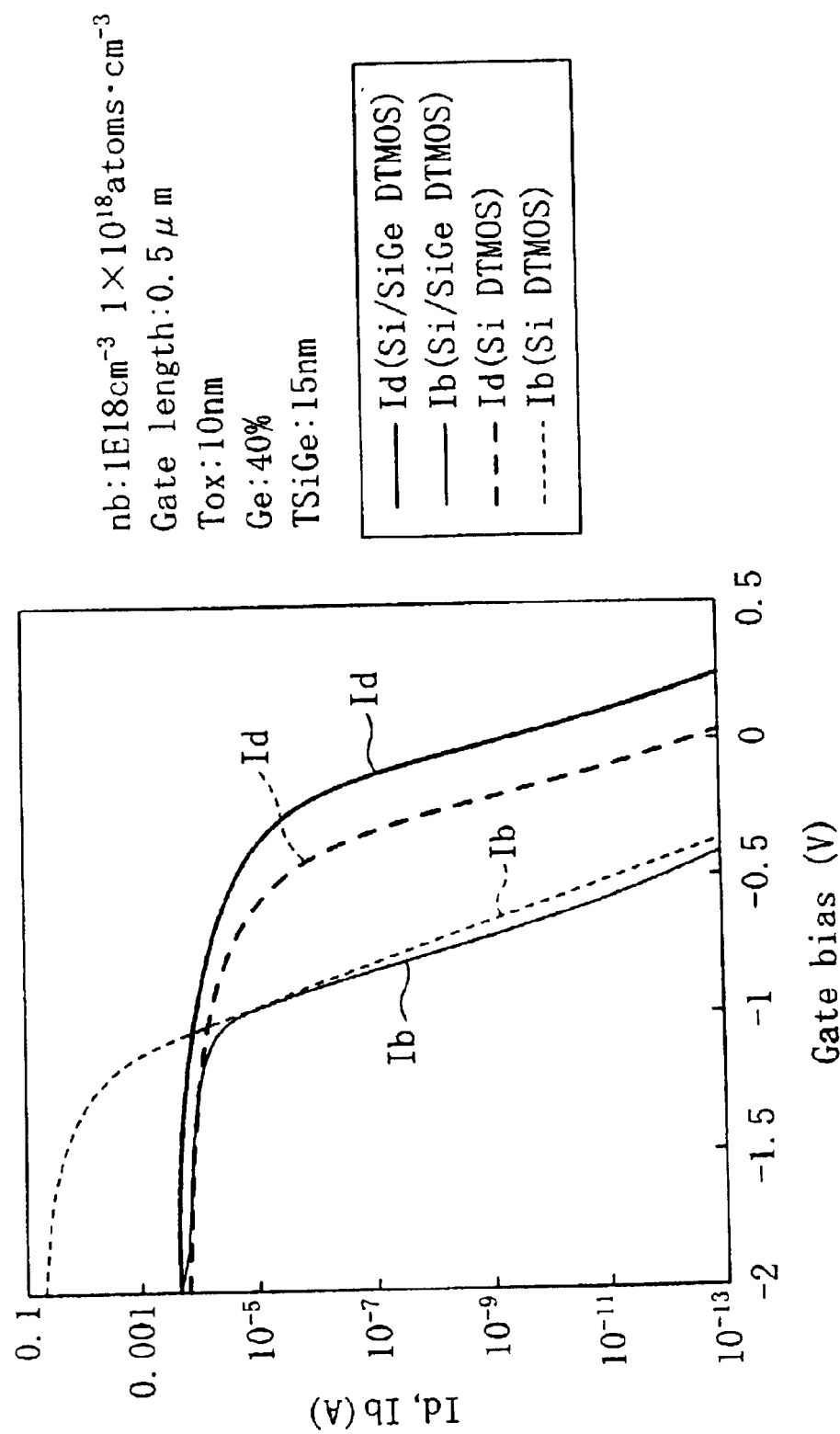
FIG. 7 is a graph showing simulation results of the gate bias dependence of the drain current and the body current of a p-channel type HDTMOS of the present invention and a conventional p-channel type DTMOS.

FIG. 7 is a graph showing simulation results of the gate bias dependence of the drain current Id and the body current Ib of the p-channel type HDTMOS having the Si/SiGe heterojunction structure of the present invention and a conventional p-channel type DTMOS having a Si homojunction structure. For both the drain current Id and the body current Ib, the impurity concentration nb in the Si body region is $1 \times 10^{18}$ cm⁻³. The bold broken line in FIG. 7 shows the drain current Id of the conventional DTMOS, and the thin broken line shows the body current Ib of the conventional DTMOS. The bold solid line shows the drain current Id of the HDTMOS of the present invention, and the thin solid line shows the body current Ib of the HDTMOS of the present invention. This simulation results were obtained, assuming that for both the drain current Id and the body current Ib, the impurity concentration nb in the Si body region is $1\times10^{18}$ atoms·cm$^{-3}$, the gate length is 0.5 μm, the thickness Tox of the gate insulator film is 10 nm.

As shown in FIG. 7, when the channel region is constituted by SiGe having a small band gap (small potential for carriers), the gate bias value at which the body current (gate current) shown by the thin solid line rises is not significantly changed. However, the threshold voltage, which is the gate bias value at which the drain current Id rises, is about 0.2V lower. In other words, when the energy level at the valence band edge in the SiGe channel region 24 as shown in FIG. 6 is increased from that of the conventional DTMOS, the threshold voltage drops. On the other hand, the energy level of the valence band edge of the Si body region 22 is the same as that of the conventional DTMOS, and therefore with the operations of the parasitic bipolar transistor, the gate bias value at which the body current Ib rises is unchanged from the conventional DTMOS. This results in the HDTMOS of the present invention having an operating voltage range wider than that of the conventional Si homojunction type DTMOS. The value of the body current Ib of the HDTMOS of the present invention after rising is lower than that of the conventional DTMOS.

Figure 8:
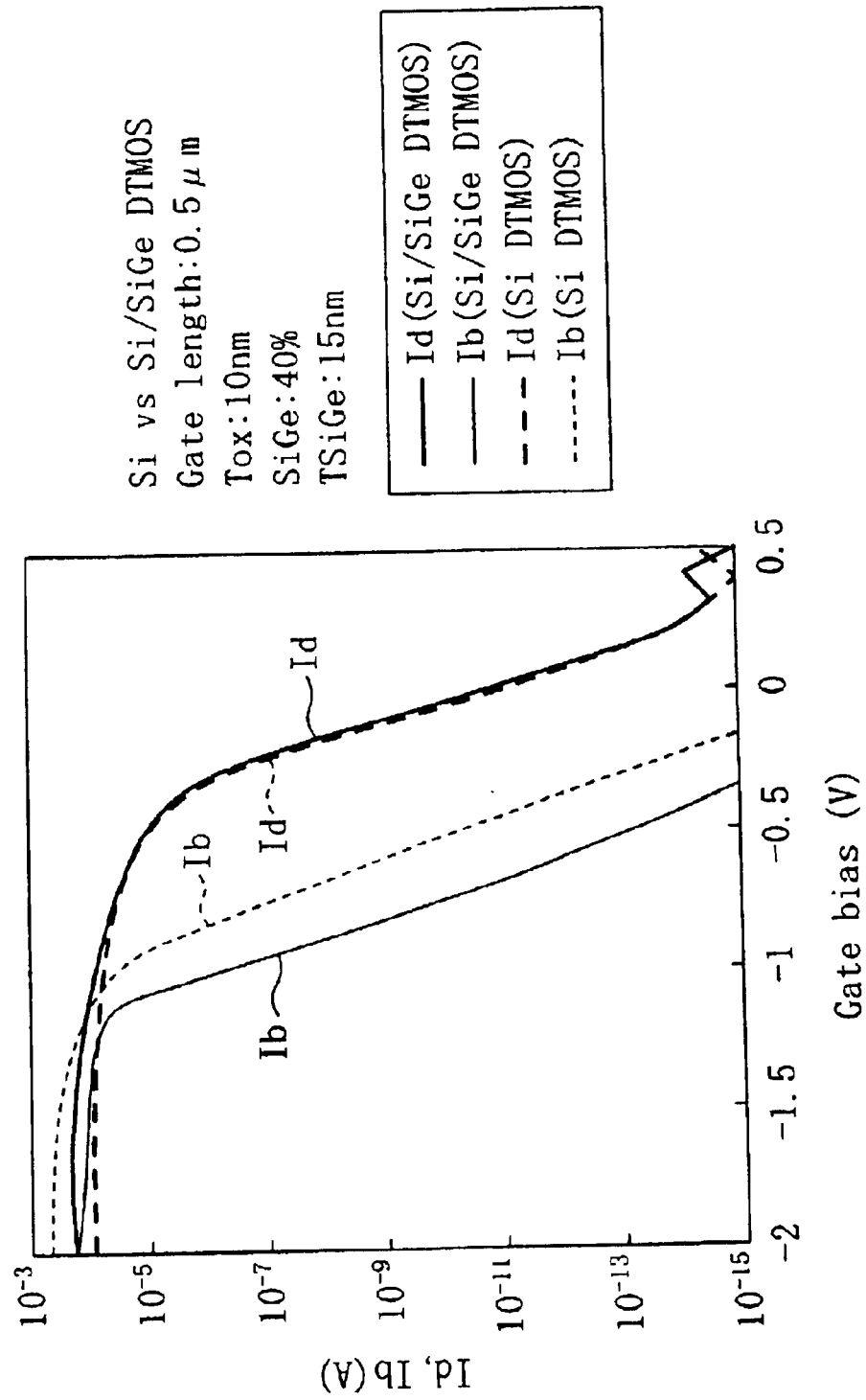
FIG. 8 is a graph showing simulation results of the gate bias dependence of the drain current and the body current when the impurity concentration of the body region is adjusted in order to equalize the threshold voltages of the HDTMOS of the present invention and the conventional DTMOS.

FIG. 8 is a graph showing simulation results of the gate bias dependence of the drain current Id and the body current Ib when the impurity concentration nb of the body region is adjusted in order to equalize the threshold voltages of the Si/SiGe-HDTMOS of the present invention and the conventional Si homojunction type DTMOS. The bold broken line in FIG. 8 shows the drain current Id of the conventional DTMOS, and the thin broken line shows the body current Ib of the conventional DTMOS. The bold solid line shows the drain current Id of the HDTMOS of the present invention, and the thin solid line shows the body current Ib of the HDTMOS of the present invention. This simulation results were obtained, assuming that for both the drain current Id and the body current Ib, the gate length is 0.5 μm, and the thickness Tox of the gate insulator film is 10 nm. However, the impurity concentration nb in the Si body region in the Si/SiGe-HDTMOS of the present invention is $1\times10^{19}$ atoms·cm$^{-3}$, and the impurity concentration nb in the Si body region in the conventional Si homojunction type DTMOS is $2\times10^{17}$ atoms·cm$^{-3}$.

As shown in FIG. 8, when the gate bias dependence of the drain current Id is made substantially equal between the HDTMOS of the present invention and the conventional DTMOS, the gate bias value at which the body current Ib causes a practical problem in the HDTMOS of the present invention is about 0.2V lower than that of the conventional DTMOS. In other words, according to the HDTMOS of the present invention, by constituting the channel region by SiGe having a small band gap, with adjustment of the impurity concentration, the operating voltage range is extended by about 0.2V. Therefore, either one of lowering the voltage by lowering the threshold voltage and reducing power consumption by suppressing the body current without substantially changing the threshold voltage can be selected.

Figure 9:
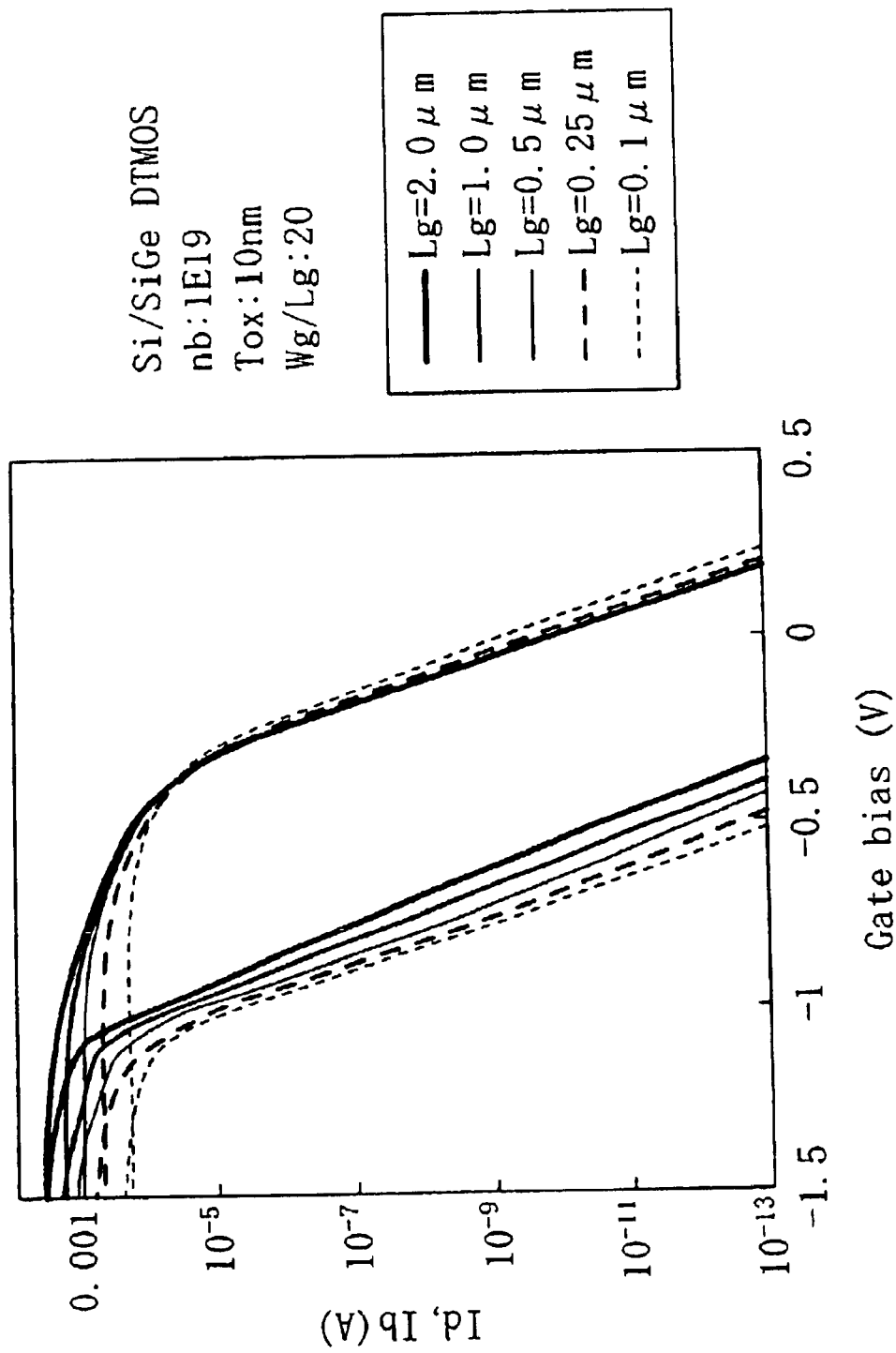
FIG. 9 is a graph showing the gate bias dependence of the drain current and the body current when the gate length is varied in the HDTMOS of the present invention.

FIG. 9 is a graph showing the gate bias dependence of the drain current Id and the body current Ib when the gate length Lg is varied in the Si/SiGe-HDTMOS of the present invention. In this example, the ratio Wg/Lg of the gate width Wg to the gate length Lg is 20. As shown in FIG. 9, in the HDTMOS of the present invention, even if the gate length Lg is made short, there is no substantial change in both the drain current Id and the body current Ib.

Figure 10:
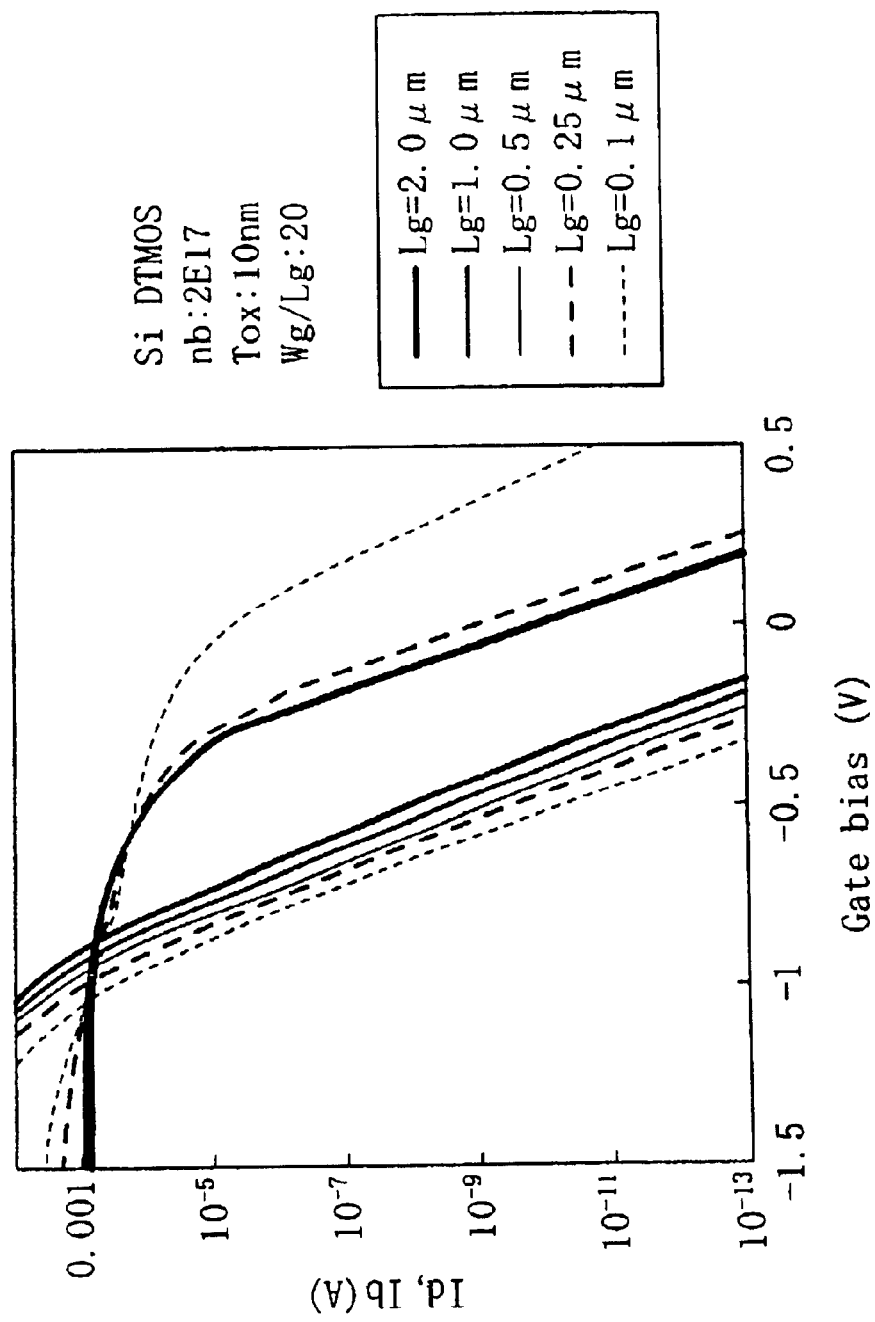
FIG. 10 is a graph showing the gate bias dependence of the drain current and the body current when the gate length is varied in a conventional Si homojunction type DTMOS.

FIG. 10 is a graph showing the gate bias dependence of the drain current Id and the body current Ib when the gate length Lg is varied in the conventional Si homojunction type DTMOS. As shown in FIG. 10, in the conventional Si homojunction type DTMOS, when the gate length Lg is reduced to 0.25 μm or less, the threshold voltage is decreased significantly.

Figure 11:
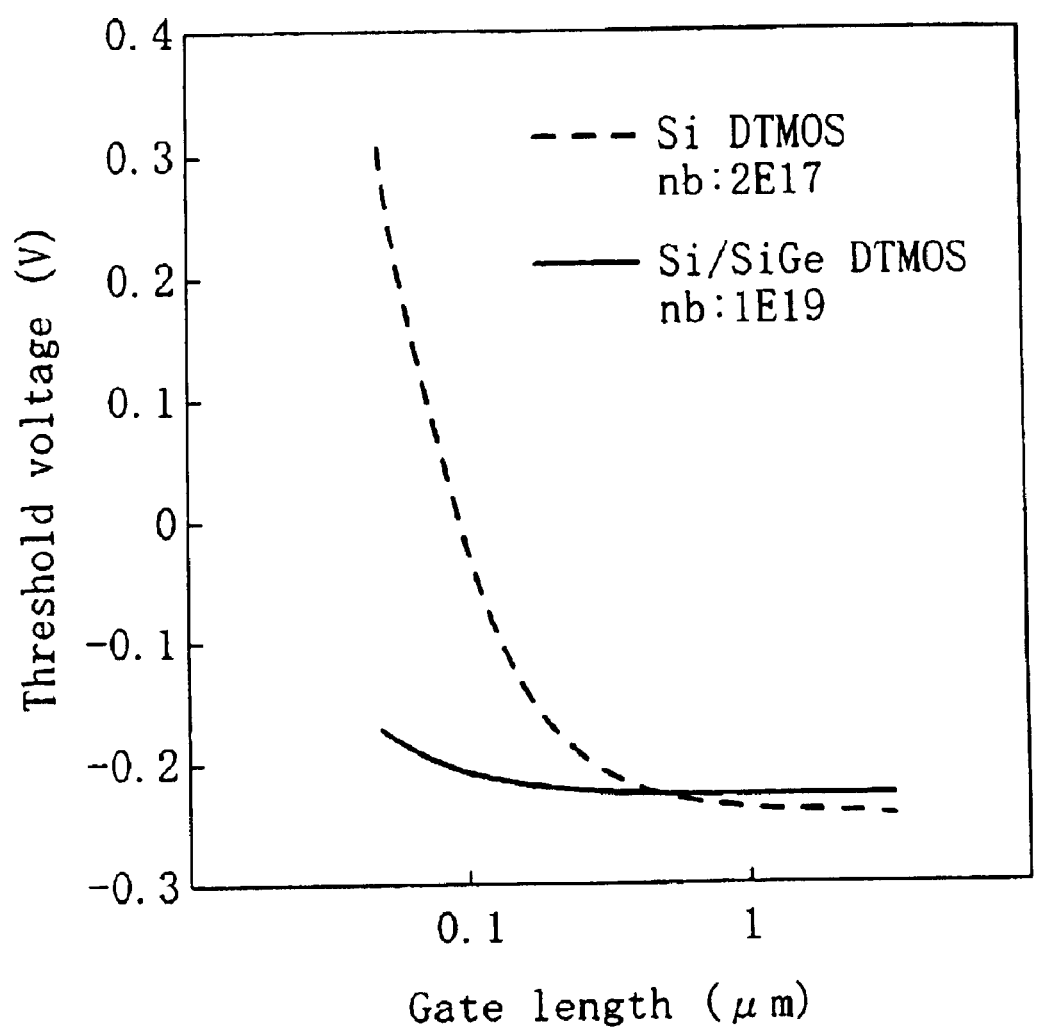
FIG. 11 is a graph showing the gate length dependence of the threshold voltage of the HDTMOS of the present invention and the conventional DTMOS that is obtained from the data of FIGS. 9 and 10.

FIG. 11 is a graph showing the gate length dependence of the threshold voltage of the Si/SiGe-HDTMOS of the present invention and the conventional Si homojunction type DTMOS that is obtained from the data of FIGS. 9 and 10. As shown in FIG. 11, in the HDTMOS of the present invention, even if the gate length Lg is made short, there is no substantial increase in the threshold voltage, compared with the conventional DTMOS.

FIGS. 9, 10 and 11 confirm the following. In the conventional Si homojunction type DTMOS, when the gate length Lg is reduced to 0.25 μm or less, there is a drastic change in the threshold voltage, whereas in the HDTMOS of the present invention, even in a short channel device with a gate length Lg of 0.1 μm or less, a change in the threshold voltage is small, and the short channel effect is suppressed sufficiently. This is believed to be caused for the following reasons. In the HDTMOS of the present invention, by constituting the channel region by SiGe having a small band gap, even if the impurity concentration in the Si body region is made high, the threshold voltage is maintained to be equal to that of the conventional Si homojunction type DTMOS. Therefore, in the present invention, the expansion of the depletion layer can be suppressed by increasing the impurity concentration in the Si body region 24. Consequently, even in the HDTMOS having a small gate length, punch-through can be suppressed so that a so-called short channel effect can be suppressed.

As shown in FIG. 9, when the gate length Lg is short and the gate width Wg is short, the body current Ib tends to be reduced. This is because the body current Ib is proportional to the gate width Wg. Therefore, according to the HDTMOS of the present invention, by constituting the channel region by SiGe having a small band gap, the body current Ib can be further reduced and the operating voltage range can be further extended by reducing the length of the channel while increasing the impurity concentration in the body region.

Figure 12:
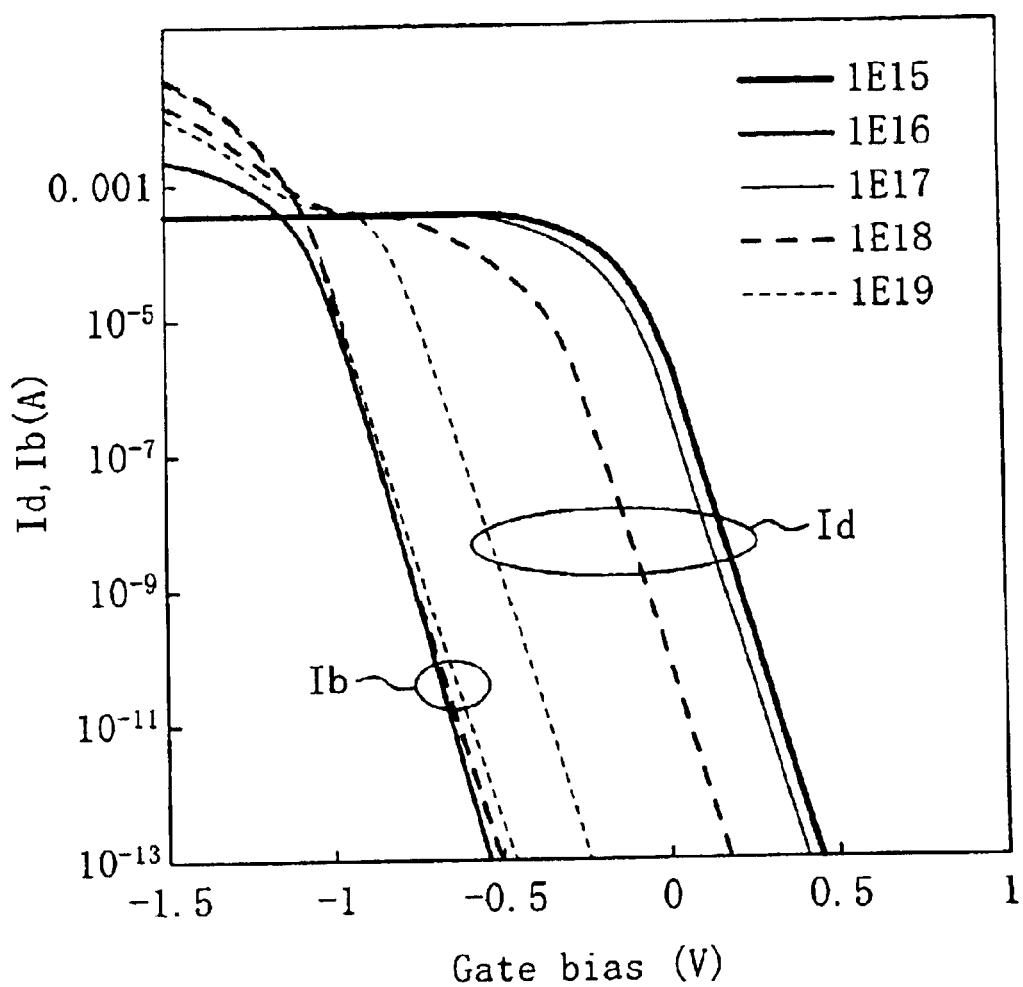
FIG. 12 is a graph showing the dependence on the impurity concentration of the channel region of the gate bias—body current and the drain current characteristics of the HDTMOS of the present invention.

FIG. 12 is a graph showing the impurity concentration dependence of the SiGe channel region of the gate bias—body current Id and the drain current Ib characteristics of the HDTMOS of the present invention. As shown in FIG. 12, when the impurity concentration in the SiGe channel region is so high as nearly $1\times10^{18}$atoms·cm$^{-3}$, the drain current Id is changed significantly, and the threshold voltage becomes large. As a result, the difference between the drain current Id and the body current Ib becomes small, and therefore the operating voltage range becomes significantly small. On the other hand, when the impurity concentration in the SiGe channel region is $1\times10^{17}$atoms·cm$^{-1}$ or less, a change in the drain current Id is small and a variation in the threshold voltage is small. In addition, the difference between the drain current Id and the body current Ib is maintained large, so that the operating voltage range can be sufficiently large.

In conclusion with respect to the simulation results shown in these graphs, in the Si/SiGe-HDTMOS of the present invention, the short channel effect can be suppressed and the operating voltage range can be extended by making the impurity concentration in the Si body region 22 high and the impurity concentration in the SiGe channel region 24 low.

In order to produce the HDTMOS having a high impurity concentration in the Si body region 22 and a low impurity concentration in the SiGe channel region 24, it is important to prevent the impurities in the Si body region 22 from diffusing to the SiGe channel region 24 during epitaxial growth of the SiGe film 14 constituting the SiGe channel region 24 or the processes subsequent to the epitaxial growth.

Figure 13:
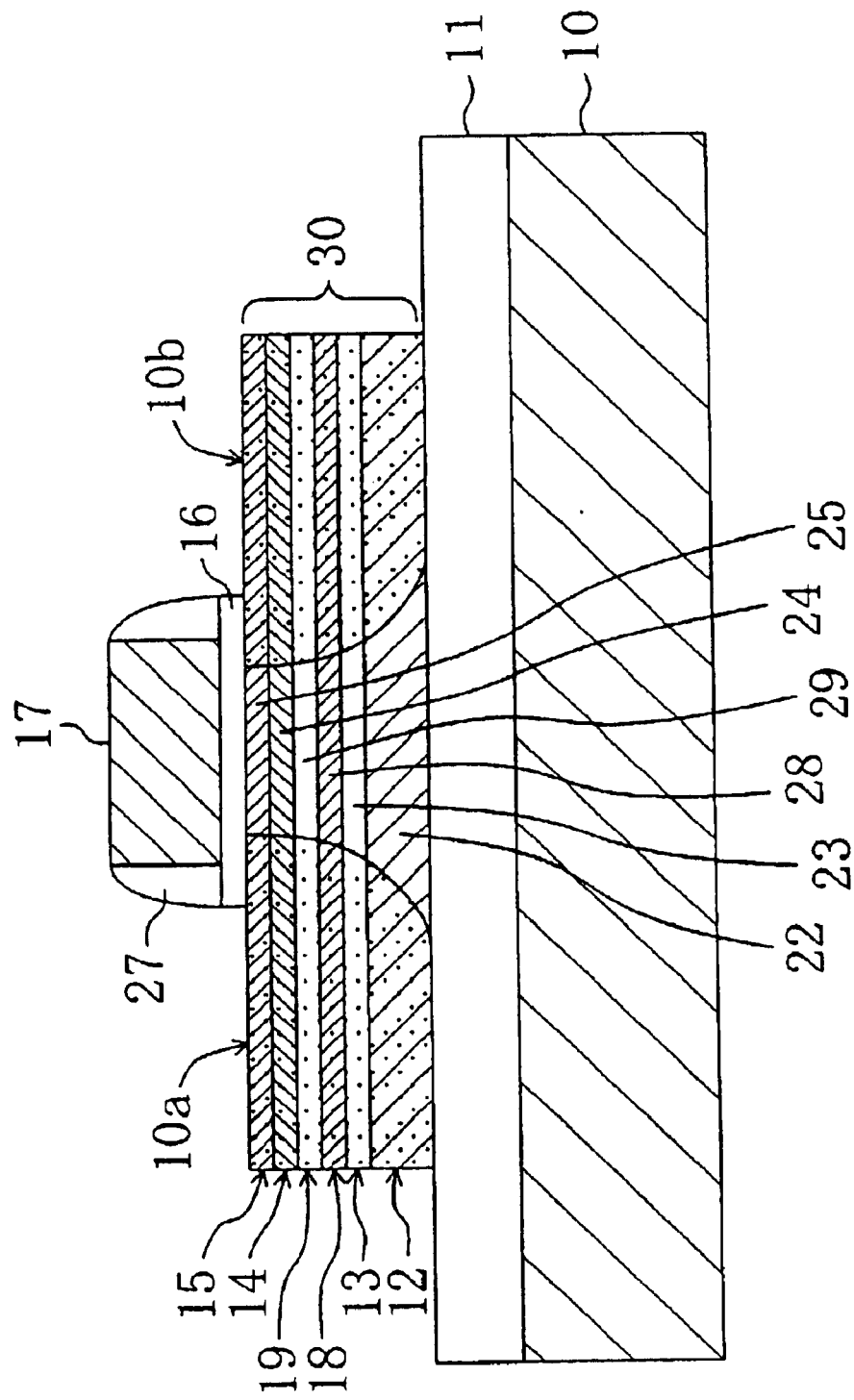
FIG. 13 is a cross-sectional view showing an example of a HDTMOS provided with an anti-diffusion layer of a variation of the first embodiment.

FIG. 13 is a cross-sectional view showing an example of a HDTMOS including an anti-diffusion layer of a variation of this embodiment. As shown in FIG. 13, in addition to the structure of the HDTMOS shown in FIG. 4, this variation of the HDTMOS further includes a Si film 18 containing about 0.1% of C (carbon) and a Si film 19 for spacers between the Si buffer layer 13 and the SiGe film 14. The Si film 19 is stacked on the Si film 18. Further, an n$^-$Si layer 28 containing about 0.1% of carbon and an n$^-$Si spacer layer 29 containing n-type low concentration impurities are formed below the SiGe channel region 24. The n$^-$Si spacer layer 29 is formed on the Si layer 28.

In this variation, the n$^-$ Si layer 28 containing 0.01% to 2%, for example, about 0.1% of carbon suppresses the impurities from diffusing from the Si body region 22 to the SiGe channel region 24. Therefore, a steep profile of the impurity concentration where the impurity concentration of the Si body region 22 is high and the impurity concentration of the SiGe channel region 24 is low can be formed in a very minute region. As a result of forming such a steep profile of the impurity concentration, the effects of this embodiment such as suppression of the short channel effect and extension of the operating voltage range can be exhibited more explicitly.

Next, the difference in the function between the Si/SiGe heterojunction type DTMOS of this embodiment and the conventional Si/SiGe heterojunction type MOSFET will be described.

Figure 14:
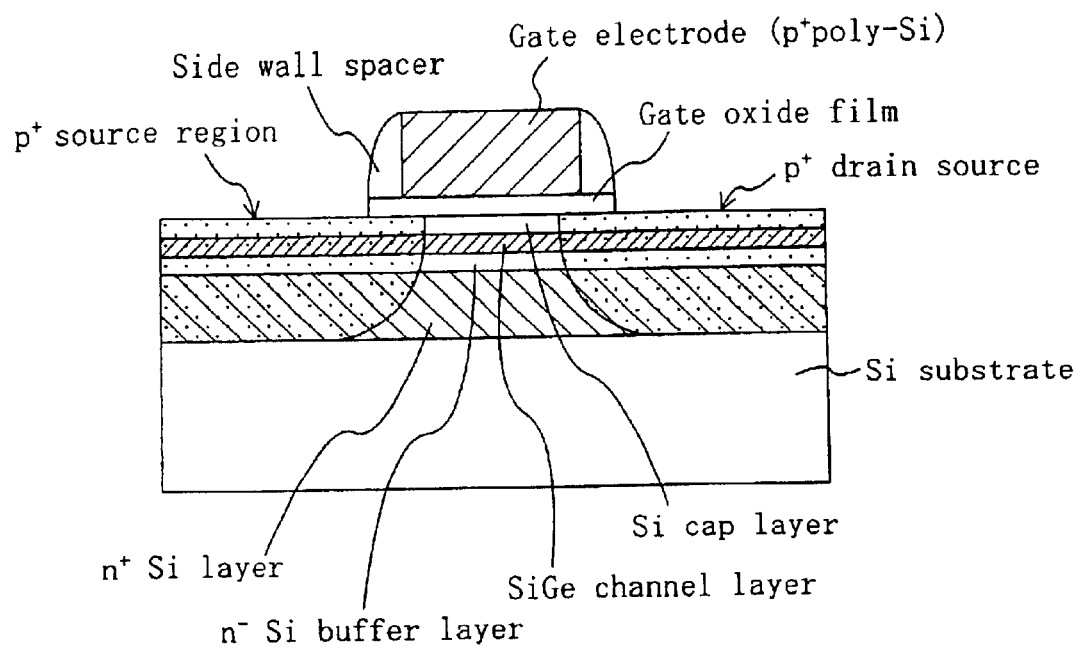
FIG. 14 is a cross-sectional view showing the basic structure of a p-channel type MOSFET having a conventional Si/SiGe heterojunction.

FIG. 14 is a cross-sectional view showing a basic structure of a p-channel type MOSFET having a conventional Si/SiGe heterojunction. As shown in FIG. 14, the MOSFET having a conventional Si/SiGe heterojunction includes a Si substrate, an n$^+$ Si layer formed by introducing high concentration impurities in the Si substrate, an n$^-$ Si buffer layer epitaxially grown on the n$^+$ Si layer, and a SiGe channel layer containing n-type low concentration impurities epitaxially grown on the n$^-$ Si buffer layer, a Si cap layer containing n-type low concentration impurities epitaxially grown on the SiGe channel layer, a gate oxide film formed on the Si cap layer, a gate electrode formed on the gate oxide film, and side wall spacers made of a oxide film provided on the side faces of the gate electrode.

In a MOSFET having a conventional Si homojunction structure that does not use a heterojunction, an inversion layer generated in an interface region in contact with a gate oxide film of a silicon layer is used as a channel. In other words, carriers travel in the interface region in contact with the gate oxide film of a silicon layer. On the other hand, in the conventional Si/SiGe heterojunction type MOSFET shown in FIG. 14, carrier travel in the channel formed in an interface region in contact with the Si cap layer of the SiGe channel layer. In other words, in the conventional Si/SiGe heterojunction type MOSFET, the channel is formed in a region apart from the Si cap layer immediately below the gate oxide film.

In general, the heterojunction type MOSFET using, for example, Si/SiGe, has the following advantages.

First, since a material such as SiGe that allows a higher mobility of carriers than Si can be used as the channel layer, high speed operations of transistors can be achieved.

Second, since a reduction of carrier mobility due to scattering of carriers intervalley can be suppressed by utilizing the modulation of the band structure due to strain that is caused by lattice mismatch between SiGe and Si, high speed operations of the transistor can be achieved.

Thirdly, since the SiGe channel layer is apart from the gate oxide film, scattering of carriers due to roughness at the interface between the gate oxide film and the Si cap layer can be suppressed. Therefore, high speed operations of the transistor can be achieved and noise caused by scattering of carriers at the interface can be reduced.

Thus, the heterojunction MOSFET is a promising device as a future high speed logic device or a high frequency analog device. However, in the heterojunction MOSFET, there is a disadvantage in that a parasitic channel is generated easily.

Figure 15A:
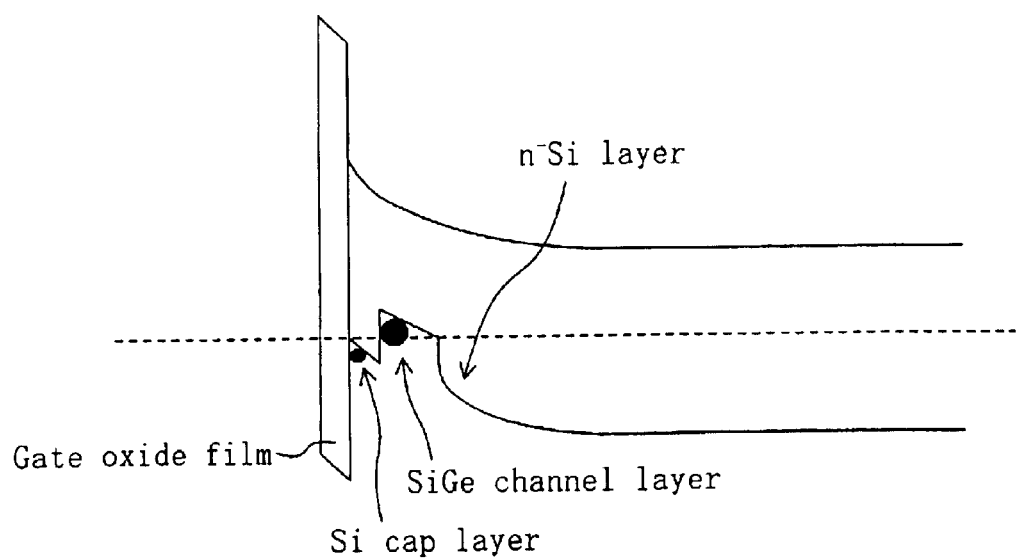
FIGS. 15A and 15B are energy band diagrams showing the band structures at a low gate bias and a high gate bias of a general Si/SiGe heterojunction type MOSFET.
Figure 15B:
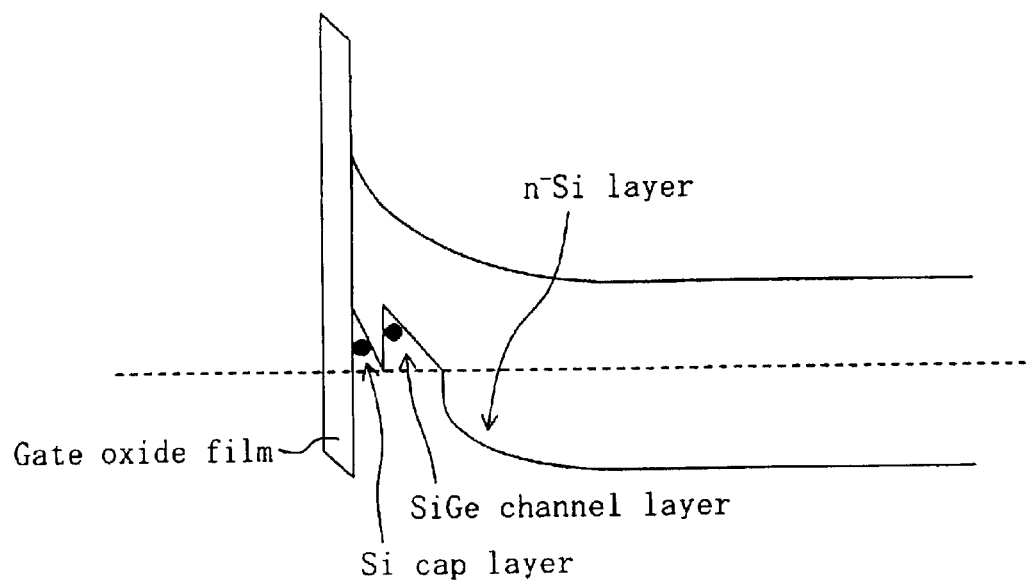

FIGS. 15A and 15B are energy band diagrams showing the band structure at a low gate bias and a high gate bias of a general Si/SiGe heterojunction type MOSFET. As shown in FIG. 15A, when the gate bias is small, carriers are accumulated mainly in a portion in the vicinity of the heterobarrier of the SiGe layer. On the other hand, when the gate bias is large, as shown in FIG. 15B, carriers are accumulated in a portion (upper end portion) of the Si cap layer in contact with the gate oxide film as well as the SiGe channel layer, because the energy level at the valence band edge is increased by the electric field in the portion of Si cap layer in contact with the gate oxide film. In operation of the transistor, carriers accumulated in the upper end portion of the Si cap layer travel as well, which means that a parasitic channel is generated. In the state shown in FIG. 15B, as in the conventional MOSFET, carriers travelling in the Si cap layer are subjected to scattering due to the gate oxide film, and has a small mobility, compared with carriers travelling in the SiGe layer where the mobility of the carriers is large. Therefore, high speed operation of the transistor, which is an advantage of the heterojunction type MOSFET, cannot be realized sufficiently. In other words, in the conventional heterojunction type MOSFET, as the gate bias is increased, the electric potential difference between the semiconductor layer and the gate electrode become large. Therefore, as shown in FIG. 15B, sharp bending of the band of the semiconductor layer occurs.

On the other hand, in the heterojunction type DTMOS of the present invention, as shown in FIG. 6, the gate electrode and the Si body region are electrically connected. Therefore, even if the gate bias is increased, the electric potential difference between the Si body region and the gate electrode is maintained substantially constant. Carriers are always accumulated in the SiGe channel region, and no parasitic channel is formed. Consequently, the inherent advantage of the high speed operation of the transistor of the heterojunction type MOSFET can be realized to full extent.

Figure 16:
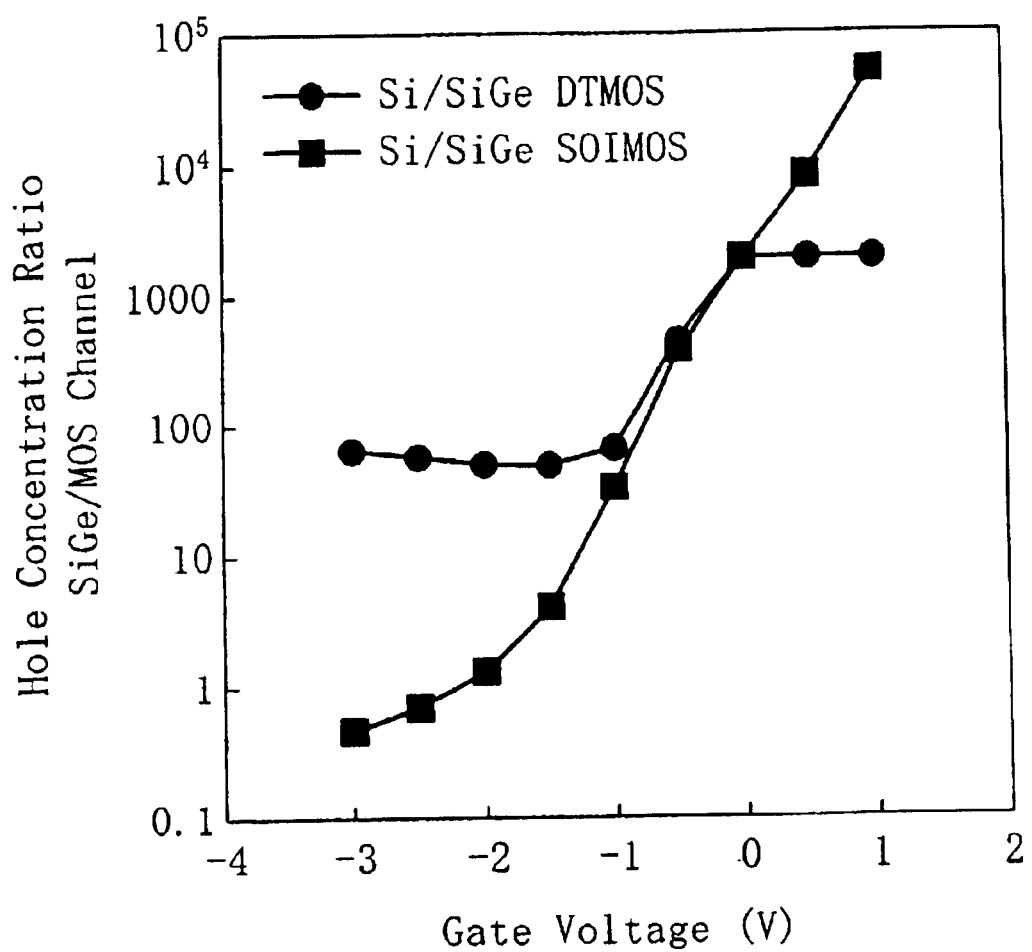
FIG. 16 is a graph showing the gate bias dependence of the ratio in the concentration of the peak carriers accumulated in each of a heterochannel and a parasitic channel in the HDTMOS of the present invention and the conventional heterojunction type SOIMOSFET.

FIG. 16 is a graph showing the gate bias dependence of the ratio in the concentration of the peak carriers accumulated in each of a heterochannel and a parasitic channel in the Si/SiGe-HDTMOS of the present invention and the conventional heterojunction type SOIMOSFET. As shown in FIG. 16, in the Si/SiGe-HDTMOS of the present invention, formation of a parasitic channel is suppressed at high bias.

Therefore, the HDTMOS of the present invention can solve the problem with respect to the parasitic channel, which causes a problem in the conventional heterojunction type MOSFET. Thus, the HDTMOS of the present invention is a promising device as a future high speed logic device or a high frequency analog device.

In this embodiment, the HDTMOS formed on the SOI substrate has been described. The same effects can be obtained in the case where a bulk semiconductor substrate in place of the SOI substrate is used.

The area of the HDTMOS of the present invention is larger than that of the conventional MOSFET by the area that is required for formation of a contact between the gate electrode and the body region. However, the gate width can be made smaller because the driving current is larger. Therefore, from an overall point of view, the present invention is advantageous for miniaturization.

Second Embodiment

In this embodiment, an example of an n-channel HDTMOS using SiGe as a material constituting the channel region will be described.

FIG. 17A is a plan view schematically showing the structure of a HDTMOS of this embodiment. FIG. 17B is a cross-sectional view taken along line XVIIb—XVIIb of FIG. 17A. FIG. 17C is a cross-sectional view taken along line XVIIc—XVIIc of FIG. 17A. As shown in FIGS. 17A to 17C, the HDTMOS of this embodiment includes a p-type Si substrate 50, a buried oxide film 51 formed by a method, for example, of implanting oxygen ions to the Si substrate, and a semiconductor layer 80 formed on the buried oxide film 51. The semiconductor layer 80 includes an upper Si film 52 constituting the upper portion of the SOI substrate, a Si buffer layer 53 epitaxially grown by a UHV-CVD method on the upper Si film 52, a SiGe film 54 epitaxially grown by a UHV-CVD method on the Si buffer layer 53, and a Si film 55 epitaxially grown by a UHV-CVD method on the SiGe film 54. Furthermore, the HDTMOS includes a gate insulator film 56 made of a silicon oxide film formed on the Si film 55, and a gate electrode 57 formed on the gate insulator film 56. A source region 60a and a drain region 60b containing n-type high concentration impurities are provided in regions on both sides of the gate electrode 57 of the semiconductor layer 52, i.e., the upper Si film 52, the Si buffer layer 53, the SiGe film 54 and the Si film 55. Furthermore, a Si body region 62 containing p-type high concentration impurities is formed in a region between the source region 60a and the drain region 60b of the upper Si film 52. A p⁻ Si region 63 containing p-type low concentration impurities is formed in a region immediately above the Si body region 62 of the Si buffer layer 53. A SiGe channel region 64 containing relatively p-type low concentration impurities is formed in a region between the source region 60a and the drain region 60b of the SiGe film 54. A Si cap layer 65 containing p-type low concentration impurities is formed in a region immediately below the gate insulator film 56 of the Si film 55. Furthermore, a contact 66 as a conductor member that electrically connects the gate electrode 57 and the Si body region 62 is provided.

Figure 18:
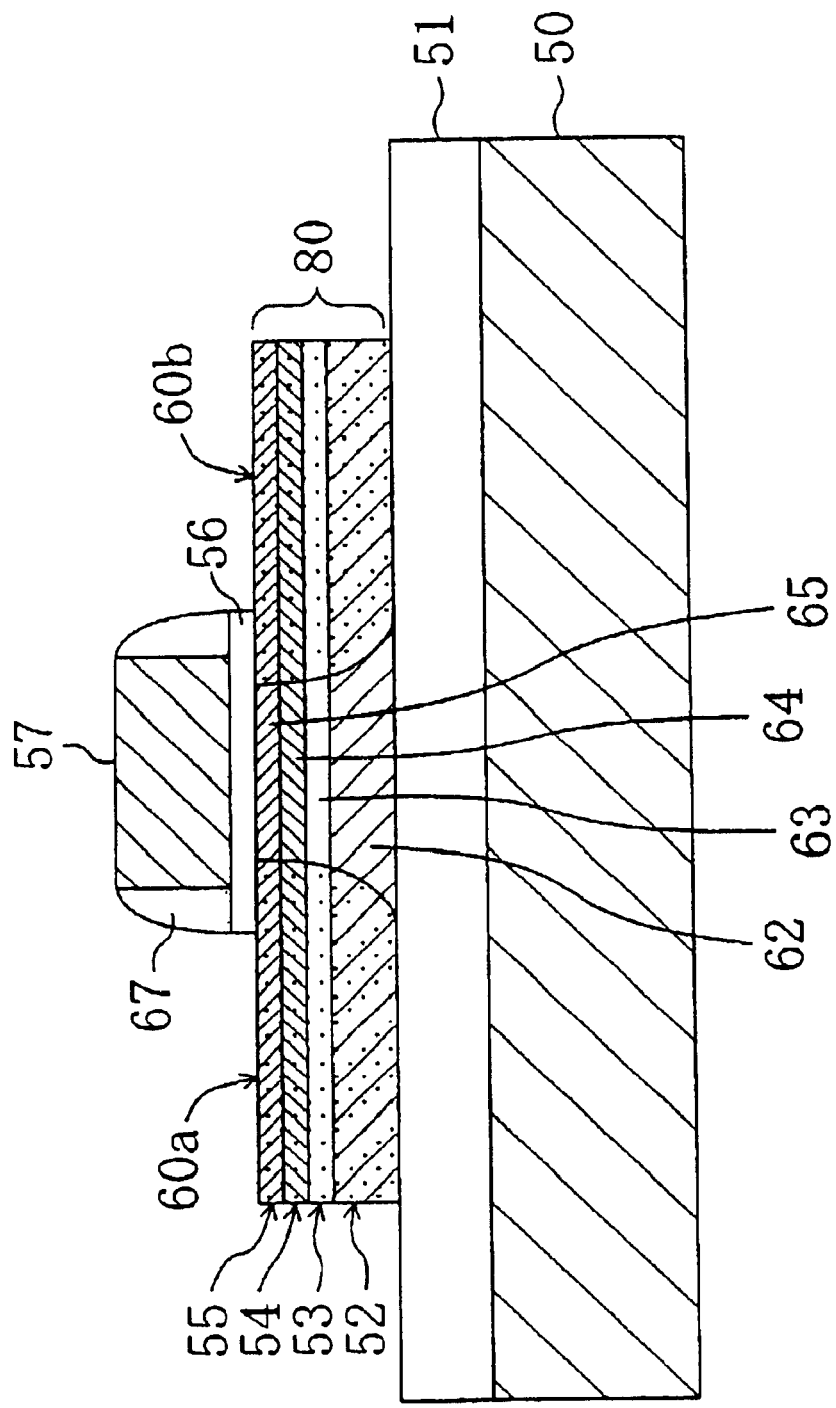
FIG. 18 is a cross-sectional view showing the structure of a HDTMOS of the second embodiment in greater detail.

FIG. 18 is a cross-sectional view showing the structure of the HDTMOS of this embodiment in greater detail. In this example, the buried oxide film 51 is about 100 nm thick. The upper Si film 52 is about 100 nm thick. The Si buffer layer 53 is about 10 nm thick. The SiGe film 54 is about 15 nm thick. The Si film 55 is about 5 nm thick. The Si body region 62 contains p-type impurities (e.g., boron) in a concentration of about $1\times10^{19}$ atoms·cm⁻³ by performing ion implantation before epitaxial growth of the Si buffer layer 53. The p⁻ Si region 63 contains p-type impurities (e.g., boron) in a concentration of about $1\times10^{17}$ atoms·cm⁻³ by performing in-situ doping. The Ge content of the SiGe channel region 64 is about 40%, and the SiGe channel region 64 contains p-type impurities (e.g., boron) in a concentration of about $1\times10^{17}$ atoms·cm⁻³ by performing in-situ doping. The Si cap layer 65 contains p-type impurities (e.g., boron) in a concentration of about $1\times10^{17}$ atoms·cm⁻³ by performing in-situ doping. The gate insulator film 56 is formed by thermally oxidizing the Si film 55. The gate electrode 57 is doped with n-type impurities (e.g., arsenic or phosphorus) in a concentration of about $1\times10^{20}$ atoms·cm⁻³. Side walls 67 made of silicon oxide films are provided on the sides of the gate electrode 57.

Figure 19:
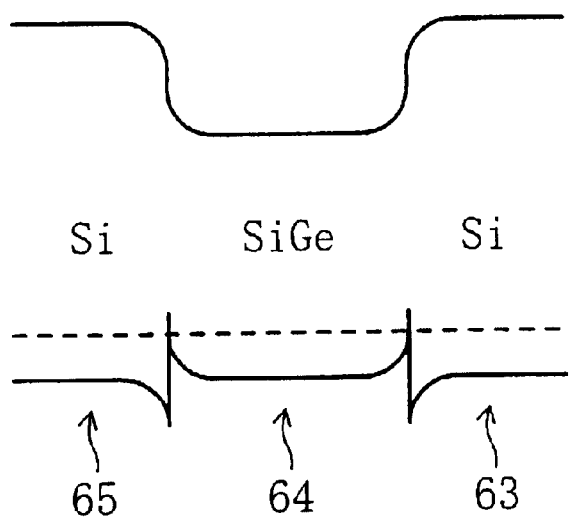
FIG. 19 is an energy band diagram showing band alignment in the cross section taken across a Si cap layer, a SiGe channel region and a p-Si region.

FIG. 19 is an energy band diagram showing the band alignment in the cross-section taken across the Si cap layer 65, the SiGe channel region 64 and the p⁻ Si region 63. In the Si/SiGe heterojunction portion where the band offset is formed mainly on the valence band, a well for potentials is generated by the jump of the band in the conduction band edge by doping the Si layer and the SiGe layer with p-type impurities. Therefore it is possible to confine electrons in the SiGe channel region 64.

Figure 20:
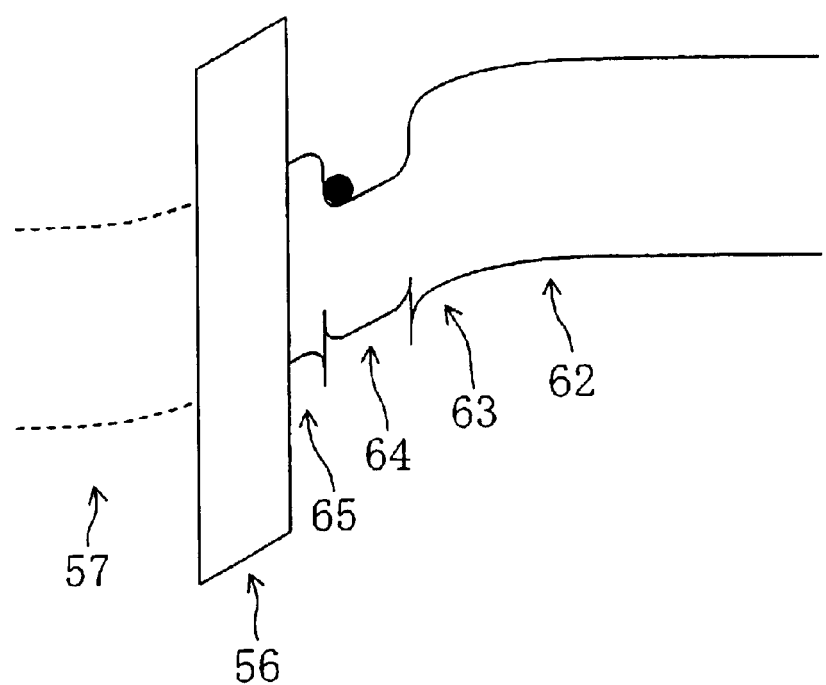
FIG. 20 is an energy band diagram showing built-in band structure in the cross section taken from a gate electrode to a Si body region in the second embodiment.

FIG. 20 is an energy band diagram showing a built-in band structure in the cross-section taken across the gate electrode 57, the gate insulator film 56, the Si cap layer 65, the SiGe channel region 64, the p⁻ Si layer 63 and the Si body region 62. As shown in FIG. 20, by doping the gate electrode 57 with n-type impurities, the energy at the conduction band edge of a portion of the SiGe channel region 64 that is in contact with the Si cap layer 65 is particularly low under no application of bias, and a recess suitable for electron confine is formed. Therefore, even if a gate bias voltage is applied to the gate electrode 57 while the gate electrode 57 and the Si body region 62 are electrically connected, the gate electrode 57 and the Si body region 62 are maintained at substantially the same electric potential. Therefore, the band shape shown in FIG. 20 is unchanged, and only the overall potential is changed with respect to the source and drain regions. Consequently, an inversion layer that is generated in a portion of the Si cap layer 65 that is in contact with the gate insulator film 56 in a regular MOSFET is not generated in the HDTMOS of the present invention. As a result, formation of a so-called parasitic channel, which may be formed in another portion than the SiGe channel region 64, can be prevented effectively, and the same effect as in the first embodiment can be achieved.

Figure 21:
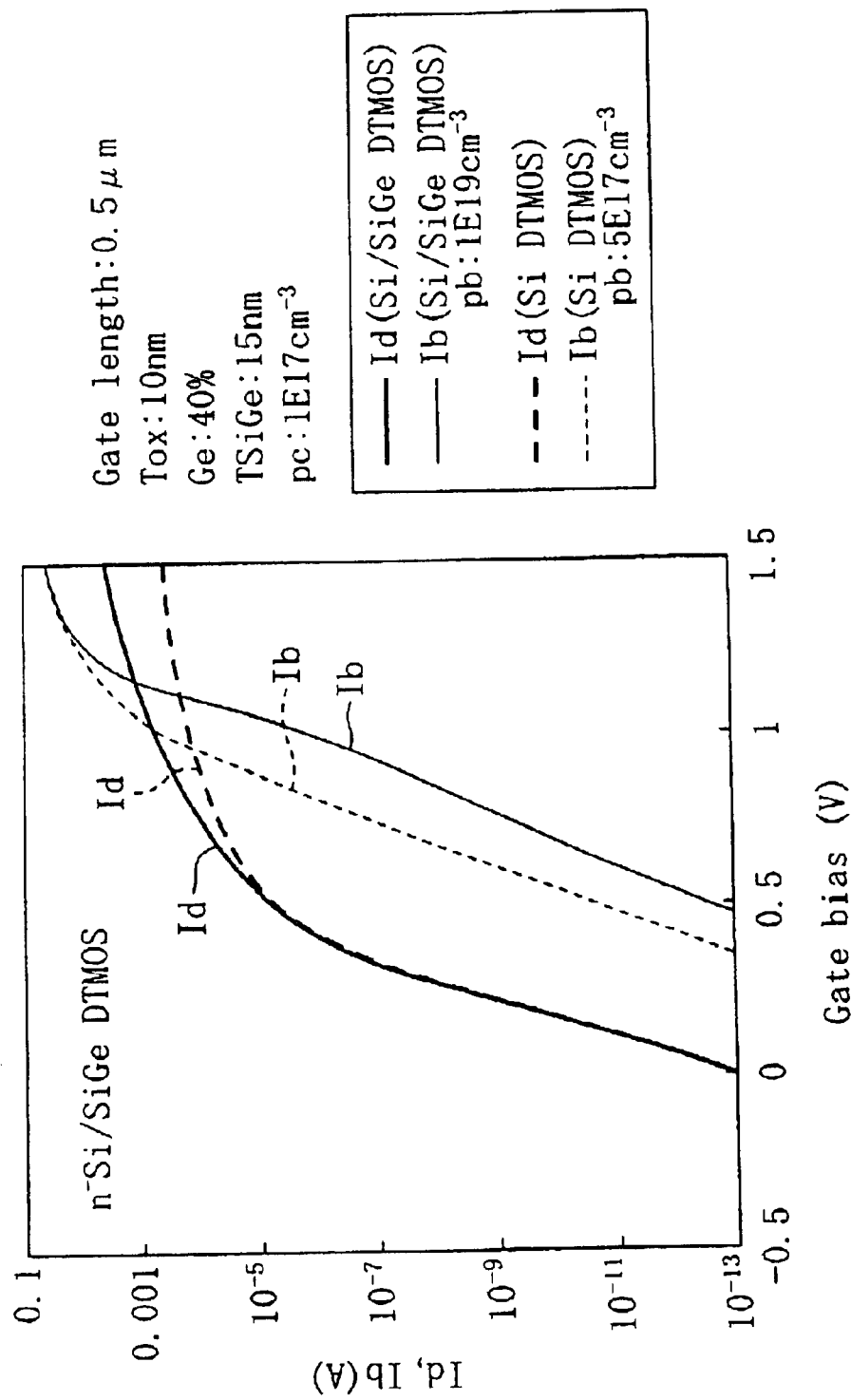
FIG. 21 is a graph showing simulation results of the gate bias dependence of the drain current and the body current when the impurity concentration of the body region is adjusted in order to equalize the threshold voltages of the HDTMOS of the present invention and the conventional DTMOS.

FIG. 21 is a graph showing simulation results of the gate bias dependence of the drain current Id and the body current Ib when the impurity concentration pb of the body region is adjusted in order to equalize the threshold voltages of the HDTMOS of the present invention and the conventional Si homojunction type DTMOS. The bold broken line in FIG. 21 shows the drain current Id of the conventional DTMOS, and the thin broken line shows the body current Ib of the conventional DTMOS. The bold solid line shows the drain current Id of the HDTMOS of the present invention, and the thin solid line shows the body current Ib of the HDTMOS of the present invention. This simulation results were obtained, assuming that for both the drain current Id and the body current Ib, the gate length is 0.5 μm, and the thickness Tox of the gate insulator film is 10 nm. However, the impurity concentration pb in the Si body region in the Si/SiGe-HDTMOS of the present invention is $1\times10^{19}$ atoms·cm⁻³, and the impurity concentration pb in the body region in the conventional Si homojunction type DTMOS is $2\times10^{17}$ atoms·cm⁻³. The impurity concentration in the SiGe channel region in the HDTMOS of the present invention is about $1\times10^{17}$ atoms·cm⁻³·

As shown in FIG. 21, when the gate bias dependence of the drain current Id is made substantially equal between the HDTMOS of the present invention and the conventional DTMOS, the gate bias value at which the body current Ib causes a practical problem in the HDTMOS of the present invention is about 0.2V higher than that of the conventional DTMOS. In other words, according to the HDTMOS of the present invention, by constituting the channel region by SiGe having a small band gap, with adjustment of the impurity concentration, the operating voltage range is extended by about 0.2V. Therefore, either one of lowering the voltage by lowering the threshold voltage and reducing power consumption by suppressing the body current without substantially changing the threshold voltage can be selected.

Third Embodiment

In this embodiment, an example of a complementary HDTMOS using SiGe as a material constituting the channel region will be described.

Figure 22:
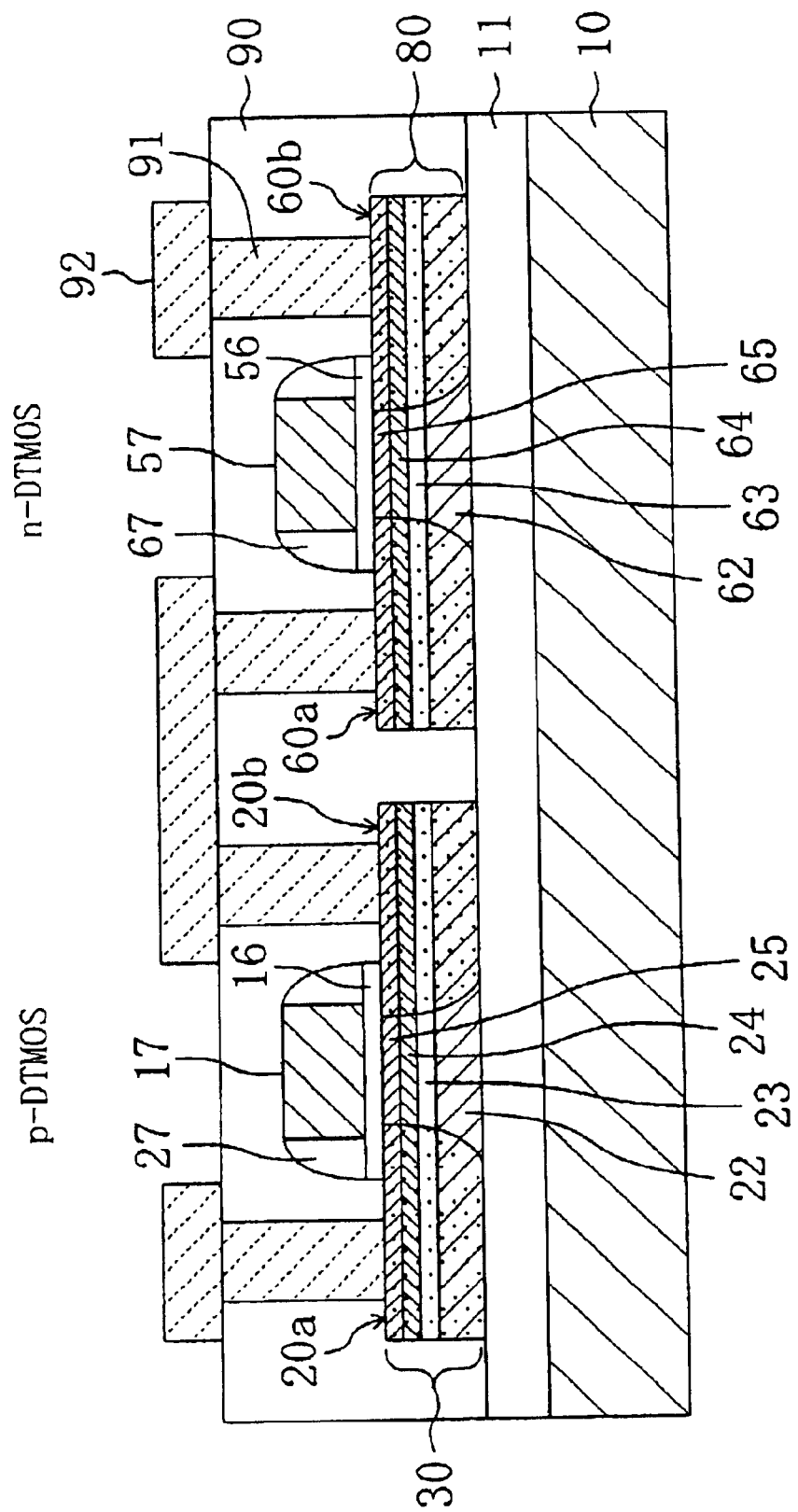
FIG. 22 is a cross-sectional view showing the structure of a complementary HDTMOS of a third embodiment.

FIG. 22 is a cross-sectional view showing the structure of a complementary HDTMOS of this embodiment. As shown in FIG. 22, the HDTMOS of this embodiment includes a p-type Si substrate 10, a buried oxide film 11 formed by a method, for example, of implanting oxygen ions to the Si substrate, a semiconductor layer 30 for a p-channel type HDTMOS (p-DTMOS) formed on the buried oxide film 11, and a semiconductor layer 80 for an n-channel type HDTMOS (n-DTMOS) formed on the buried oxide film 11. The semiconductor layers 30 and 80 include the films described in the first and second embodiments. The HDTMOS includes gate insulator films 16 and 56 made of a silicon oxide film formed on the semiconductor layers 30 and 80, respectively, gate electrode 17 and 57 formed on the gate insulator films 16 and 56, respectively, and side walls 18 and 58 provided on the side faces of the gate electrode 17 and 57, respectively. A source region 20a and a drain region 20b containing p-type high concentration impurities are provided in regions on both sides of the gate electrode 17 of the semiconductor layer 30. A source region 60a and a drain region 60b containing n-type high concentration impurities are provided in regions on both sides of the gate electrode 57 of the semiconductor layer 80. Furthermore, a Si body region 22 containing n-type high concentration impurities, an n⁻ Si region 23 containing n-type low concentration impurities, a SiGe channel region 24 containing n-type low concentration impurities, and a Si cap layer 25 containing n-type low concentration impurities are formed in a region between the source region 20a and the drain region 20b of the semiconductor layer 30. A Si body region 62 containing p-type high concentration impurities, a p⁻ Si region 63 containing p-type low concentration impurities, a SiGe channel region 64 containing p-type low concentration impurities, and a Si cap layer 65 containing p-type low concentration impurities are formed in a region between the source region 60a and the drain region 60b of the semiconductor layer 80.

Furthermore, interlayer insulator films 90, contacts (not shown) in contact with the source and the drain regions 20a, 20b, 60a and 60b through the interlayer insulator films 90, and source and drain electrodes 92 connected to the contacts and extending upward from the interlayer insulator films 90 are provided on the substrate.

Herein, the components, the thickness, the impurity concentration or the like of the buried oxide film 11 and the portions constituting the semiconductor layer are the same as those of the first and second embodiments.

In the production process of the complementary HDTMOS of this embodiment, the upper Si film, which is a part of the SOI substrate, includes an n⁺ Si layer (p-DTMOS region) and a p⁺ Si layer (n-DTMOS region) that have been previously doped with impurities in a concentration of about $1 \times 10^{19}$ atoms·cm⁻³ by ion implantation before crystal growth. All of the Si buffer layer, the SiGe channel region, and the Si cap layer that are epitaxially grown by a UHV-CVD method are undoped layers that are not doped with impurities in the as-grown state. In this case, the Si buffer is 10 nm thick. The SiGe channel layer is 15 nm thick. The Si cap layer is 5 nm thick. The Ge content in the SiGe channel region is 40%. After completion of crystal growth of the SiGe film and the Si cap layer, the vicinity of the SiGe channel region of the n-DTMOS region is doped with p-type impurities in a concentration of about $1 \times 10^{17}$ atoms·cm⁻³ by ion implantation. The vicinity of the SiGe channel region of the p-DTMOS region is doped with n-type impurities in a concentration of about $1 \times 10^{17}$ atoms·cm⁻³ by ion implantation. The SiGe film and the Si cap layer may be undoped. Then, the uppermost Si cap layer is subjected to thermal oxidization, and the obtained silicon oxide film is used as the gate insulator film. Then, an n+ type gate electrode made of polysilicon doped with n-type high concentration impurities, and a p+ type gate electrode made of polysilicon doped with p-type high concentration impurities are formed on the gate insulator film. Thereafter, n+ type source and drain regions doped with n-type high concentration impurities, and p+ type source and drain regions doped with p-type high concentration impurities are formed on both sides of each gate electrode. Then, source electrodes and drain electrodes are formed on the source and the drain regions. The gate electrode and the Si body region are connected by the contact, and thus a HDTMOS structure can be obtained.

Using this producing method, a high performance CMOS device using HDTMOS can be produced in a simple method.

In this embodiment, the channel region is constituted by SiGe, but may be constituted by $Si_{1-x-y}Ge_xC_y$ having a C (carbon) content of 0.01% to 2% (e.g., about 0.1%). For the SiGe crystal, ion implantation tends to cause an undesirable change in the crystal structure. However, the undesirable change in the crystal structure due to ion implantation can be suppressed by constituting the channel region by $Si_{1-x-y}Ge_xC_y$.

Figure 23:
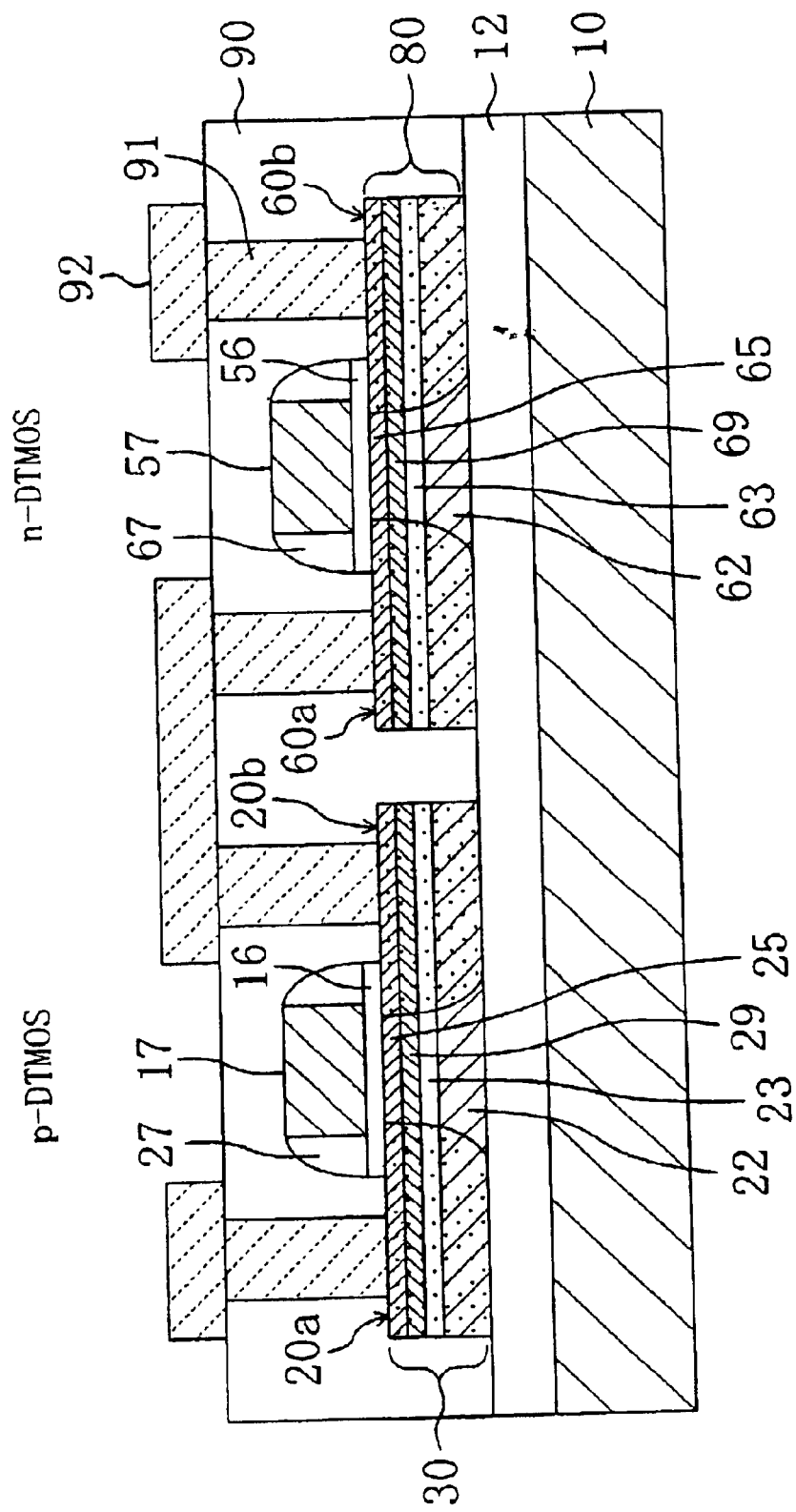
FIG. 23 is a cross-sectional view showing the structure of a complementary HDTMOS of a variation of the third embodiment where the channel region is constituted by $Si_{1-x-y}Ge_xC_y$.

FIG. 23 is a cross-sectional view of a complementary HDTMOS of a variation of this embodiment, where the channel region is constituted by $Si_{1-x-y}Ge_xC_y$. A SiGeC film is provided in place of the SiGe film shown in FIG. 22, and SiGeC channel regions 29 and 69 are provided in place of the SiGe channel regions 24 and 64. The structure of other portions is the same as that of the complementary HDTMOS shown in FIG. 22.

In the structure shown in FIG. 22, the channel region is constituted by SiGe. Therefore, lattice relaxation of SiGe crystal may be caused to reduce stain caused by ion implantation, or diffusion of impurities may be increased. However, in the case where the channel region is constituted by SiGeC, lattice relaxation is suppressed, and the diffusion of impurities is suppressed. Therefore, an undesirable change in the crystal structure due to ion implantation can be suppressed. This is believed to be because carbon atoms fill atomic vacancies that causes the lattice relaxation and the increased diffusion of impurities.

In this variation, it is not necessary for carbon atoms to be contained in the channel region, and the same effects can be obtained by providing a layer containing carbon atoms above or below the channel region. In particular, in the case where a high concentration doped layer is present in the vicinity of the channel region, it is preferable to provide a layer containing carbon atoms between the high concentration doped layer and the channel region.

Fourth Embodiment

Next, in a fourth embodiment, an example of an n-channel type HDTMOS where the channel region is constituted by $Si_{1-y}C_y$ will be described.

Figure 24:
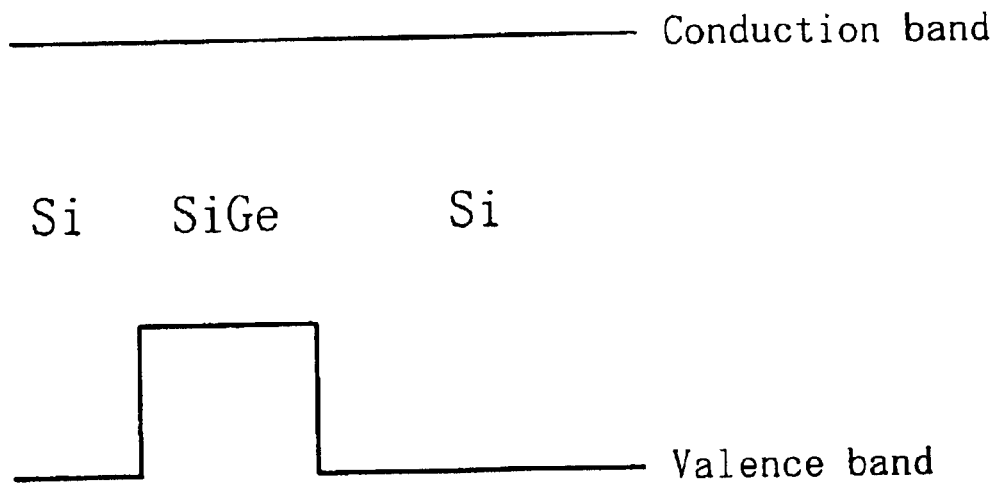
FIG. 24 is an energy band diagram showing the band structure in a Si/SiGe heterojunction portion.

FIG. 24 is an energy band diagram of a Si/SiGe heterojunction portion. As shown in FIG. 24, when the Si/SiGe heterojunction is used, a large band offset portion (heterobarrier) is generated in the valence band edge, whereas substantially no band offset portion (heterobarrier) appears in the conduction band edge. For this reason, when forming an n-type channel type HDTMOS, it is necessary to form a well at which electrons are confined by adjusting the impurity concentration as in the second embodiment. However, using a compound semiconductor other than SiGe makes it possible to form a structure in which a band offset portion (heterobarrier) appears on the side of the conduction band edge.

Figure 25:
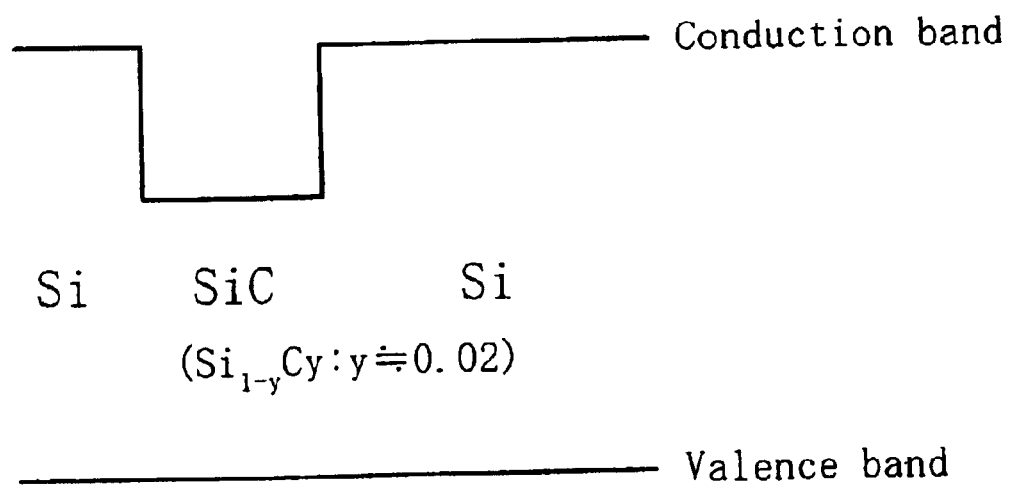
FIG. 25 is an energy band diagram of a Si/SiC($Si_{1-y}C_y$:y≈0.02) heterojunction portion.

FIG. 25 is an energy band diagram of a Si/SiC ($Si_{1-y}C_y$:y≈0.02) heterojunction portion. As shown in FIG. 25, when the Si/SiC ($Si_{1-y}C_y$:y≈0.02) heterojunction is used, a large band offset portion (heterobarrier) is generated in the conduction band edge. With this, an n-channel suitable for confining electrons can be formed.

Figure 26:
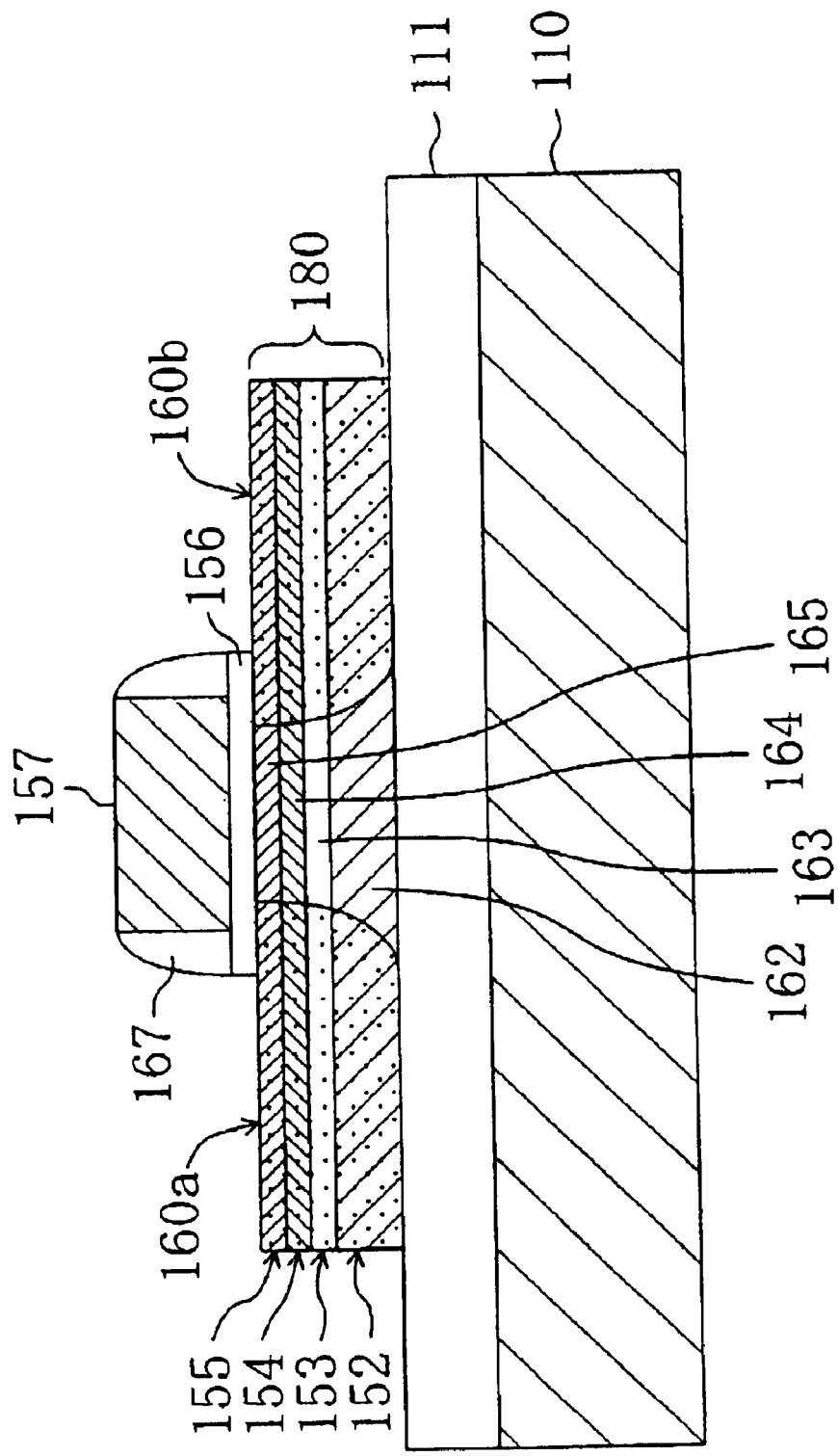
FIG. 26 is a cross-sectional view of an n-channel type HDTMOS of a fourth embodiment.

FIG. 26 is a cross-sectional view of an n-channel HDTMOS of this embodiment. As shown in FIG. 26, the HDTMOS of this embodiment includes a p-type Si substrate 110, a buried oxide film 111 formed by a method, for example, of implanting oxygen ions to the Si substrate, and a semiconductor layer 180 formed on the buried oxide film 111. The semiconductor layer 180 includes an upper Si film 152 constituting the upper portion of the SOI substrate, a Si buffer layer 153 epitaxially grown by a UHV-CVD method on the upper Si film 152, a SiC ($Si_{1-y}C_y$:y≈0.02) film 154 epitaxially grown by a UHV-CVD method on the Si buffer layer 153, and a Si film 155 epitaxially grown by a UHV-CVD method on the SiC film 154. Furthermore, the HDTMOS includes a gate insulator film 156 made of a silicon oxide film formed on the Si film 155, and a gate electrode 157 formed on the gate insulator film 156. A source region 160a and a drain region 160b containing n-type high concentration impurities are provided in regions on both sides of the gate electrode 157 of the semiconductor layer 180, i.e., the upper Si film 152, the Si buffer layer 153, the SiC film 154 and the Si film 155. Furthermore, a Si body region 162 containing p-type high concentration impurities is formed in a region between the source region 160a and the drain region 160b of the upper Si film 152. A p⁻ Si region 163 containing p-type low concentration impurities is formed in a region immediately above the Si body region 162 of the Si buffer layer 153. A SiC channel region 164 containing p-type relatively low concentration impurities is formed in a region between the source region 160a and the drain region 160b of the SiC film 154. A Si cap layer 165 containing p-type low concentration impurities is formed in a region immediately below the gate insulator film 156 of the Si film 155. Furthermore, a contact as a conductor member that electrically connects the gate electrode 157 and the Si body region 162 is provided. Side walls 167 made of silicon oxide films are provided on side faces of the gate electrodes 157.

In this example, the buried oxide film 111 is about 100 nm thick. The upper Si film 152 is about 100 nm thick. The Si buffer layer 153 is about 10 nm thick. The SiC film 154 is about 15 nm thick. The Si film 155 is about 5 nm thick. The Si body region 162 contains p-type impurities (e.g., boron) in a concentration of about $1\times10^{19}$ atoms·cm⁻³ by performing ion implantation before epitaxial growth of the Si buffer layer 153. The p⁻ Si region 163 contains p-type low concentration impurities (e.g., boron). The C content of the SiC channel region 164 is about 2%, and the SiC channel region 164 contains p-type low concentration impurities (e.g., boron). The Si cap layer 165 contains p-type low concentration impurities (e.g., boron). The gate insulator film 156 is formed by thermally oxidizing the Si film 155. The gate electrode 157 is doped with n-type impurities (e.g., arsenic or phosphorus) in a concentration of about $1\times10^{20}$ atoms·cm⁻³.

According to this embodiment, by constituting the channel region by $Si_{1-y}C_y$ (y≈0.02 in this embodiment) having a smaller band gap and a larger electron affinity than those of Si, a hetero structure that is advantageous for electron confine, as shown in FIG. 25, can be obtained. As a result, an n-channel type HDTMOS having a Si/SiC heterojunction can be achieved, and in addition, the threshold voltage can be equal to that of a Si homojunction type DTMOS even if the impurity concentration of the body region is increased. Furthermore, according to the Si/SiC-HDTMOS of the present invention, as in the first and second embodiments, the body current Ib (gate current) can be suppressed to small, and the operating voltage range is extended.

Furthermore, as long as the C content does not exceed about 5%, the lattice constant of $Si_{1-y}C_y$ constituting the channel region is smaller than that of silicon, and when $Si_{1-y}C_y$ layer is epitaxially grown on the Si layer, the $Si_{1-y}C_y$ layer is under a tensile stress. The tensile stress modulates the band, so that the mobilities of electrons and holes are improved. Thus, higher speed operations of the transistor can be achieved.

In the second embodiment, an n-channel type HDTMOS has been described where a well that allows electron to confined in the conduction band edge in the Si/SiGe junction portion can be formed by adjusting the impurity concentration. Similarly, a well in the valence band edge in the Si/SiC junction portion can be formed by adjusting the impurity concentration. Utilizing this Si/SiC heterojunction portion, it is possible to form p-channel type HDTMOS where holes travel in the well in the valence band edge.

Fifth Embodiment

Next, in a fifth embodiment, an example of a complementary HDTMOS where the channel region is constituted by SiGeC ($Si_{1-x-y}Ge_xC_y$) will be described.

Figure 27:
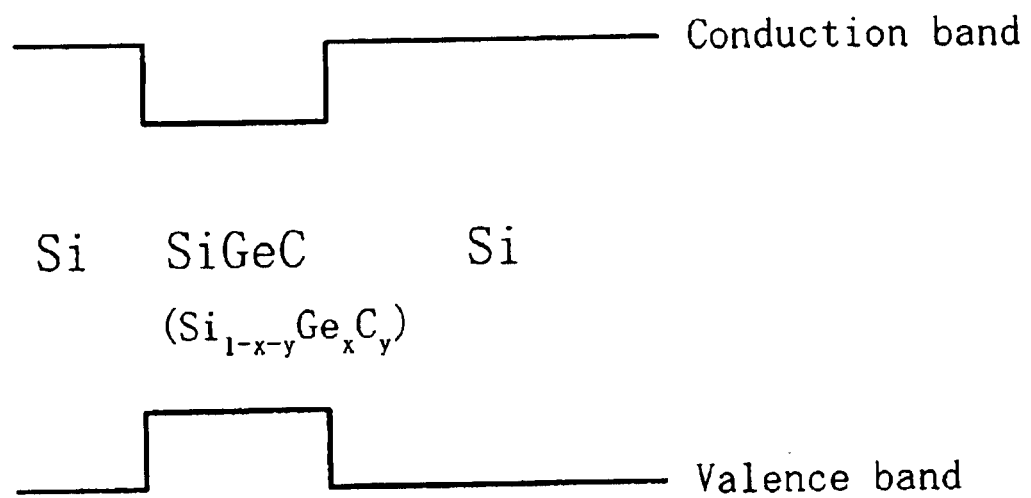
FIG. 27 is an energy band diagram showing the band structure in a Si/SiGeC heterojunction portion.

FIG. 27 is an energy band diagram showing the band structure of a Si/SiGeC heterojunction portion. In the Si/SiGe heterojunction portion, a band offset portion (heterobarrier) appears in the valence band edge, as shown in FIG. 24, which is advantageous for hole confine. In Si/SiC heterojunction portion, as shown in FIG. 25, a band offset portion (heterobarrier) appears in the conduction band edge, which is advantageous for electron confine. On the other hand, in the Si/SiGeC ($Si_{1-x-y}Ge_xC_y$) heterojunction portion, band offsets (heterobarriers) are formed on both the conduction band edge and the valence band edge by adjusting x and y for the Ge and C contents. More specifically, with the single SiGeC ($Si_{1-x-y}Ge_xC_y$) layer, an n-channel where electrons are confined in the SiGeC layer and travel in the SiGeC layer, and a p-channel where holes are confined in the SiGeC layer and travel in the SiGeC layer can be formed.

Figure 28:
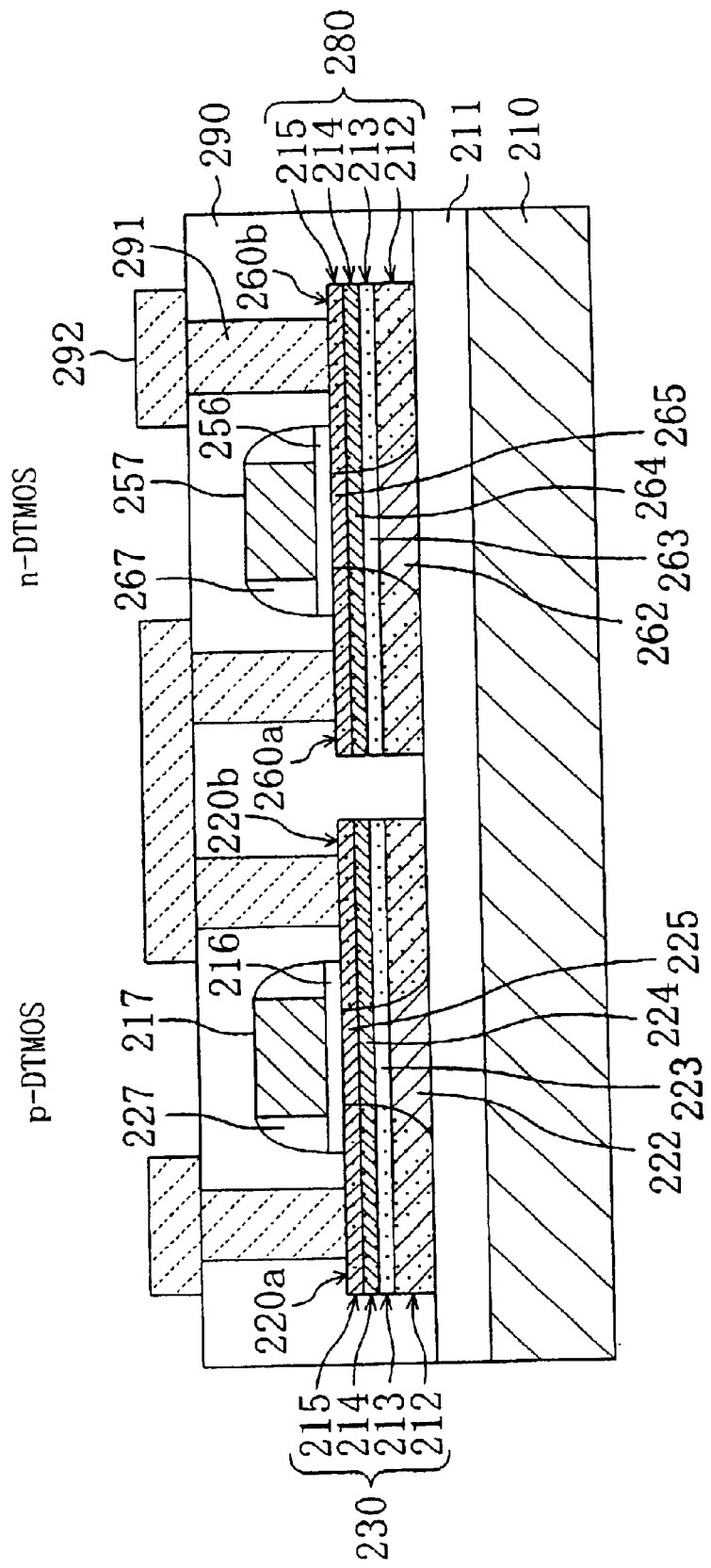
FIG. 28 is a cross-sectional view of the structure of a HDTMOS of a fifth embodiment.

FIG. 28 is a cross-sectional view of the HDTMOS of this embodiment. As shown in FIG. 28, the HDTMOS of this embodiment includes a p-type Si substrate 210, a buried oxide film 211 formed by a method, for example, of implanting oxygen ions to the Si substrate, a semiconductor layer 230 for p-channel type HDTMOS (p-DTMOS) formed on the buried oxide film 211, and a semiconductor layer 280 for an n-channel type HDTMOS (n-DTMOS) formed on the buried oxide film 211. The semiconductor layers 230 and 280 are constituted by identical films formed at the same time.

The semiconductor layers 230 and 280 include upper Si films 212 constituting the upper portion of the SOI substrate, Si buffer layers 213 that have been epitaxially grown by a UHV-CVD method on the upper Si films 212, SiGeC ($Si_{1-x-y}Ge_xC_y$:x≈0.1, y≈0.04) films 214 that have been epitaxially grown by a UHV-CVD method on the Si buffer layers 213, and Si films 215 that have been epitaxially grown by a UHV-CVD method on the SiGeC films 214. The buried oxide film 211 is about 100 nm thick. The upper Si film 212 is about 100 nm thick. The Si buffer layer 213 is about 10 nm thick. The SiGeC film 214 is about 15 nm thick. The Si film 215 is about 5 nm thick.

Furthermore, the p-DTMOS includes a gate insulator film 216 made of a silicon oxide film formed on the Si film 215, and a gate electrode 217 formed on the gate insulator film 216. A source region 220a and a drain region 220b containing p-type high concentration impurities are provided in regions on both sides of the gate electrode 217 of the semiconductor layer 230. Furthermore, a Si body region 222 containing n-type high concentration (about $1 \times 10^{19}$ atoms·cm$^{-3}$) impurities is formed in a region between the source region 220a and the drain region 220b of the upper Si film 212. An n⁻ Si region 223 containing n-type low concentration impurities is formed in a region immediately above the Si body region 222 of the Si buffer layer 213. A SiGeC channel region 224 containing n-type relatively low concentration (about $1 \times 10^{17}$ atoms·cm$^{-3}$) impurities is formed in a region between the source region 220a and the drain region 220b of the SiGeC film 214. A Si cap layer 225 containing n-type low concentration impurities is formed in a region immediately below the gate insulator film 216 of the Si film 215. Furthermore, a contact as a conductor member that electrically connects the gate electrode 217 and the Si body region 222 is provided. Side walls 227 made of silicon oxide films are provided on side faces of the gate electrode 217.

The n-DTMOS includes a gate insulator film 256 made of a silicon oxide film formed on the Si film 215, and a gate electrode 257 formed on the gate insulator films 256. A source region 260a and a drain region 260b containing n-type high concentration impurities are provided in regions on both sides of the gate electrode 257 of the semiconductor layer 280. Furthermore, a Si body region 262 containing p-type high concentration (about $1 \times 10^{19}$ atoms·cm$^{-3}$) impurities is formed in a region between the source region 260a and the drain region 260b of the upper Si film 212. A p⁻ Si region 226 containing p-type low concentration impurities is formed in a region immediately above the Si body region 262 of the Si buffer layer 213. A SiGeC channel region 264 containing p-type relatively low concentration (about $1 \times 10^{17}$ atoms·cm$^{-3}$) impurities is formed in a region between the source region 260a and the drain region 260b of the SiGeC film 214. A Si cap layer 265 containing p-type low concentration impurities is formed in a region immediately below the gate insulator film 256 of the Si film 215. Furthermore, a contact (not shown) as a conductor member that electrically connects the gate electrode 257 and the Si body region 262 is provided. Side walls 267 made of silicon oxide films are provided on side faces of the gate electrodes 257.

Furthermore, interlayer insulator films 290, contacts 291 in contact with the source and the drain regions 220a, 220b, 260a and 260b through the interlayer insulator films 290, and source and drain electrodes 292 connected to the contacts 291 and extending upward from the interlayer insulator films 290 are provided on the substrate.

In the production process of the complementary HDTMOS of this embodiment, the upper Si film, which is a part of the SOI substrate, includes an n⁺ Si layer (p-DTMOS region) and a p⁺ Si layer (n-DTMOS region) that have been previously doped with impurities in a concentration of about $1 \times 10^{19}$ atoms·cm$^{-3}$ by ion implantation before crystal growth. All of the Si buffer layer, the SiGeC film, and the Si cap layer epitaxially grown by a UHV-CVD method are undoped layers that are not doped with impurities in the as-grown state. After completion of crystal growth of the SiGeC film and the Si cap layer, the vicinity of the SiGeC channel region of the n-DTMOS region is doped with p-type impurities in a concentration of about $1 \times 10^{17}$ atoms·cm$^{-3}$ by ion implantation. The vicinity of the SiGeC channel region of the p-DTMOS region is doped with n-type impurities in a concentration of about $1 \times 10^{17}$ atoms·cm$^{-3}$ by ion implantation. Then, the uppermost Si film is subjected to thermal oxidization, and the obtained silicon oxide film is used as the gate insulator film. Then, an n+ type gate electrode made of polysilicon doped with n-type high concentration impurities, and a p+ type gate electrode made of polysilicon doped with p-type high concentration impurities are formed on the gate insulator film. Thereafter, n+ type source and drain regions doped with n-type high concentration impurities, and p+ type source and drain regions doped with p-type high concentration impurities are formed on both sides of each gate electrode. Then, source electrodes and drain electrodes are formed on the source and the drain regions. The gate electrode and the Si body region are connected by the contact, and thus a HDTMOS structure can be obtained.

According to this embodiment, by constituting the channel region with SiGeC ($Si_{1-x-y}Ge_xC_y$), it is possible to form an n-channel where electrons are confined in the SiGeC layer and travel in the SiGeC layer and a p-channel where holes are confined in the SiGeC layer and travel in the SiGeC layer with the single SiGeC ($Si_{1-x-y}Ge_xC_y$) layer. Thus, a complementary HDTMOS having a Si/SiGeC heterojunction can be realized. In this case, as described in the first embodiment, in the HDTMOS structure, parasitic channels that are easily generated in a MOSFET using the conventional heterojunction are hardly formed. Therefore, in the HDTMOS having the channel region constituted by SiGeC, even if the band offset value (height of the heterobarrier) is small, problems such as reduction in the speed of operations of the transistor due to parasitic channels are not caused, and thus a high speed transistor having a large drive current that utilizes the heterojunction structure can be obtained.

Using this producing method, a high performance complementary HDTMOS can be produced in a simple method.

In this embodiment, the complementary HDTMOS has been described. However, the present invention is not limited to this embodiment, but can be used in a semiconductor device including only an n-channel HDTMOS or a p-channel HDTMOS having the Si/SiGeC heterojunction portion.

Sixth Embodiment

Next, in a sixth embodiment, an example of a complementary HDTMOS having a Si/SiGe/SiC heterojunction will be described. In this embodiment, the channel region for p-channel is constituted by a Si/SiGe heterojunction portion, and the channel region for n-channel is constituted by a SiGe/SiC heterojunction portion.

Figure 29:
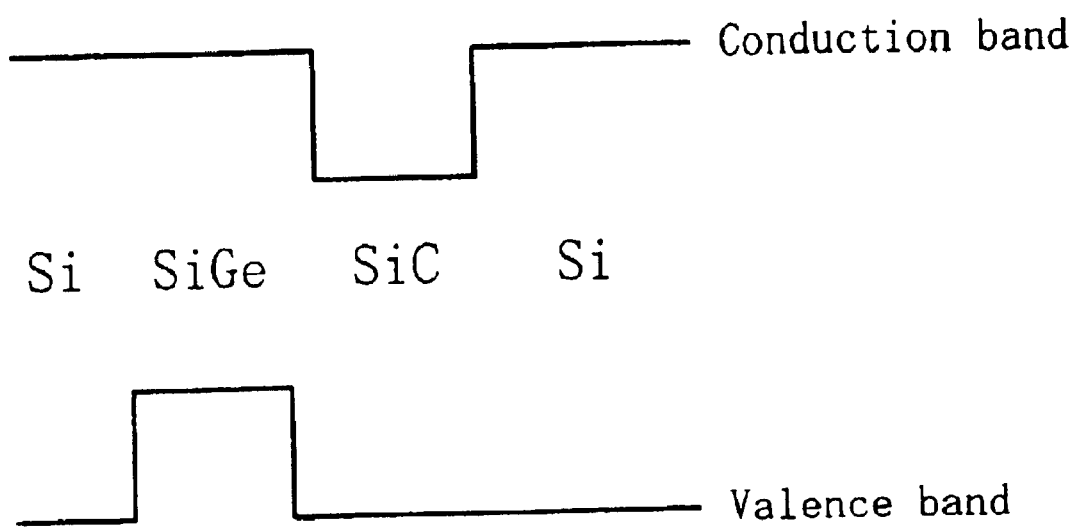
FIG. 29 is an energy band diagram showing the band structure in a Si/SiGe/SiC heterojunction portion.

FIG. 29 is an energy band diagram showing the band structure of a Si/SiGe/SiC heterojunction portion. As shown in FIG. 29, in the Si/SiGe heterojunction portion, a large band offset portion (heterobarrier) is formed in the valence band edge, and therefore a SiGe layer can be utilized as a channel region for p-channel. On the other hand, in SiGe/

SiC heterojunction portion, a large band offset portion (heterobarrier) is formed in the conduction band edge, and therefore a SiC layer can be utilized as a channel region for n-channel. Thus, by using the heterojunction structure that allows the highest band offset value (height of the heterobarrier) for each of electrons and holes, the characteristics of the heterojunction can be exhibited to full extent for both n-channel and p-channel.

Figure 30:
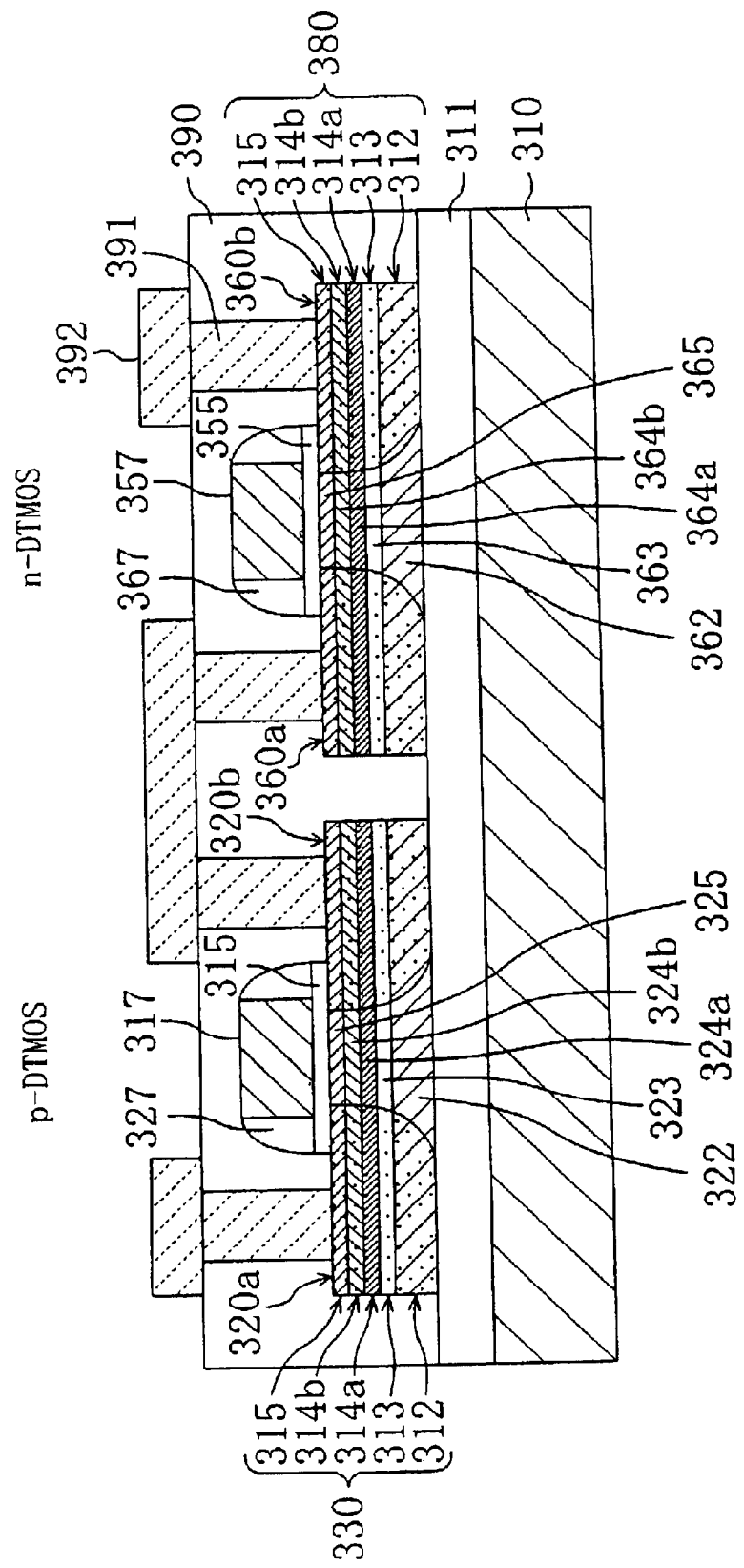
FIG. 30 is a cross-sectional view showing the structure of a complementary HDTMOS of a sixth embodiment.

FIG. 30 is a cross-sectional view of the complementary HDTMOS of this embodiment. As shown in FIG. 30, the HDTMOS of this embodiment includes a p-type Si substrate 310, a buried oxide film 311 formed by a method, for example, of implanting oxygen ions to the Si substrate, a semiconductor layer 330 for p-channel type HDTMOS (p-DTMOS) formed on the buried oxide film 311, and a semiconductor layer 380 for an n-channel type HDTMOS (n-DTMOS) formed on the buried oxide film 311. The semiconductor layers 330 and 380 are constituted by identical films formed at the same time.

The semiconductor layers 330 and 380 include upper Si films 312 constituting the upper portion of the SOI substrate, Si buffer layers 313 that have been epitaxially grown by a UHV-CVD method on the upper Si films 312, SiC ($Si_{1-y}C_y$:y≈0.015) films 314a that have been epitaxially grown by a UHV-CVD method on the Si buffer layers 313, SiGe films 314b epitaxially grown by a UHV-CVD method on the SiC films 314a and Si films 315 that have been epitaxially grown by a UHV-CVD method on the SiGe films 314b. The buried oxide film 311 is about 100 nm thick. The upper Si film 312 is about 100 nm thick. The Si buffer layer 313 is about 10 nm thick. The SiC film 314a is about 15 nm thick, and the SiGe film 314b is about 15 nm thick. The Si film 315 is about 5 nm thick.

Furthermore, the p-DTMOS includes a gate insulator film 316 made of a silicon oxide film formed on the Si film 315, and a gate electrode 317 formed on the gate insulator film 316. A source region 320a and a drain region 320b containing p-type high concentration impurities are provided in regions on both sides of the gate electrode 317 of the semiconductor layer 330. Furthermore, a Si body region 322 containing n-type high concentration (about $1\times10^{19}$ atoms·cm$^{-3}$) impurities is formed in a region between the source region 320a and the drain region 320b of the upper Si film 312. An n$^-$ Si region 323 containing n-type low concentration impurities is formed in a region immediately above the Si body region 322 of the Si buffer layer 313. A SiC channel region 324a and a SiGe channel region 324b containing n-type relatively low concentration (about $1\times10^{17}$ atoms·cm$^{-3}$) impurities are formed in a region between the source region 320a and the drain region 320b of the SiGe film 314a and the SiC film 314b. A Si cap layer 325 containing n-type low concentration impurities is formed in a region immediately below the gate insulator film 316 of the Si film 315. Furthermore, a contact (not shown) as a conductor member that electrically connects the gate electrode 317 and the Si body region 322 is provided. Side walls 327 made of silicon oxide films are provided on side faces of the gate electrode 317.

The n-DTMOS includes a gate insulator film 356 made of a silicon oxide film formed on the Si film 315, and a gate electrode 357 formed on the gate insulator films 356. A source region 360a and a drain region 360b containing n-type high concentration impurities are provided in regions on both sides of the gate electrode 357 of the semiconductor layer 380. Furthermore, a Si body region 362 containing p-type high concentration (about $1\times10^{19}$ atoms·cm$^{-3}$) impurities is formed in a region between the source region 360a and the drain region 360b of the upper Si film 312. A p$^-$ Si region 326 containing p-type low concentration impurities is formed in a region immediately above the Si body region 362 of the Si buffer layer 313. A SiC channel region 324a and a SiGe channel region 324b containing p-type relatively low concentration (about $1\times10^{17}$ atoms·cm$^{-3}$) impurities are formed in a region between the source region 360a and the drain region 360b of the SiGe film 314a and the SiC film 314b. A Si cap layer 365 containing p-type low concentration impurities is formed in a region immediately below the gate insulator film 356 of the Si film 315. Furthermore, a contact (not shown) as a conductor member that electrically connects the gate electrode 357 and the Si body region 362 is provided. Side walls 367 made of silicon oxide films are provided on side faces of the gate electrodes 357.

Furthermore, interlayer insulator films 390, contacts 391 in contact with the source and the drain regions 320a, 320b, 360a and 360b through the interlayer insulator films 390, and source and drain electrodes 392 connected to the contacts 391 and extending upward from the interlayer insulator films 390 are provided on the substrate.

In the production process of the complementary HDTMOS of this embodiment, the upper Si film, which is a part of the SOI substrate, includes an n$^+$ Si layer (p-DTMOS region) and a p$^+$ Si layer (n-DTMOS region) that have been previously doped with impurities in a concentration of about $1\times10^{19}$ atoms·cm$^{-3}$ by ion implantation before crystal growth. All of the Si buffer layer, the SiC film, the SiGe film, and the Si cap layer that are epitaxially grown by a UHV-CVD method are undoped layers that are not doped with impurities in the as-grown state. After completion of crystal growth of the SiC film, the SiGe film and the Si cap layer, the vicinity of the channel region of the n-DTMOS region is doped with p-type impurities in a concentration of about $1\times10^{17}$ atoms·cm$^{-3}$ by ion implantation. The vicinity of the channel region of the p-DTMOS region is doped with n-type impurities in a concentration of about $1\times10^{17}$ atoms·cm$^{-3}$ by ion implantation. Then, the uppermost Si cap layer is subjected to thermal oxidation, and the obtained silicon oxide film is used as the gate insulator film. Then, an n+type gate electrode made of polysilicon doped with n-type high concentration impurities, and a p+ type gate electrode made of polysilicon doped with p-type high concentration impurities are formed on the gate insulator film. Thereafter, n+ type source and drain regions doped with n-type high concentration impurities, and p+ type source and drain regions doped with p-type high concentration impurities are formed on both sides of each gate electrode. Then, source electrodes and drain electrodes are formed on the source and the drain regions. The gate electrode and the Si body region are connected by the contact, and thus a DTMOS structure can be obtained.

According to this embodiment, by constituting the channel region with Si/SiGe/SiC heterojunction portion, the SiGe layer close to the Si/SiGe heterojunction portion where a large band offset (heterobarrier) is formed on the valence band edge can be utilized as the channel region for p-channel, and the SiC layer close to the SiGe/SiC heterojunction portion where a large band offset (heterobarrier) is formed on the conduction band edge can be utilized as the channel region for n-channel. Thus, by using the heterojunction structure that allows the highest band offset value (height of the heterobarrier) for each of electrons and holes, the characteristics of the heterojunction can be exhibited to full extent for both n-channel and p-channel. In this case, as described in the first embodiment, in the HDTMOS structure, parasitic channels that are easily generated in a MOSFET using the conventional heterojunction are hardly formed. Therefore, in the HDTMOS having the channel region constituted by SiGe and SiC, even if the band offset value (height of the heterobarrier) is small, problems such as reduction in the speed of operations of the transistor due to parasitic channels are not caused, and thus a high speed transistor having a large drive current that utilizes the heterojunction structure can be obtained.

Furthermore, by using the producing method as described above, a high performance complementary DTMOS having a heterojunction can be formed in a simple method.

Figure 31:
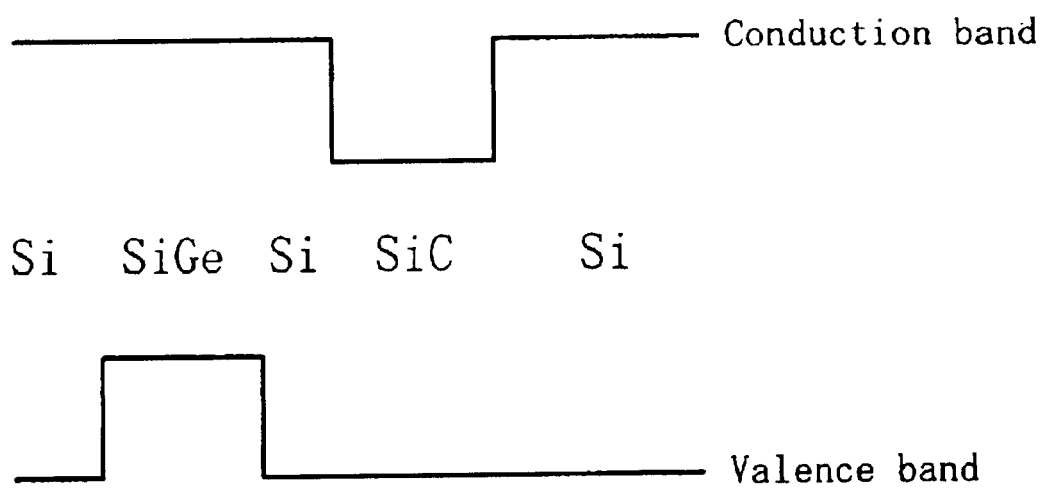
FIG. 31 is an energy band diagram showing the band structure of a complementary HDTMOS of a variation of the sixth embodiment having a Si/SiGe junction portion and a Si/SiC junction portion.

FIG. 31 is an energy band diagram showing the band structure of a complementary HDTMOS of a variation of this embodiment having a Si/SiGe junction portion and a Si/SiC junction portion. In this case, a Si film is present between the SiC film 314a and the SiGe film 314b in the structure shown in FIG. 30. Such a structure allows the advantages of this embodiment to be exhibited as well.

Seventh Embodiment

Next, in a seventh embodiment, an example of a complementary hetero CMOS device using a heterobarrier of a Si/SiGe junction portion for p-channel, and a band offset by adjustment of the impurity concentration of the Si/SiGe junction portion for n-channel will be described. In this embodiment, it is assumed that the gate electrode and the body region are not connected and this embodiment has a regular MISFET structure.

Figure 32:
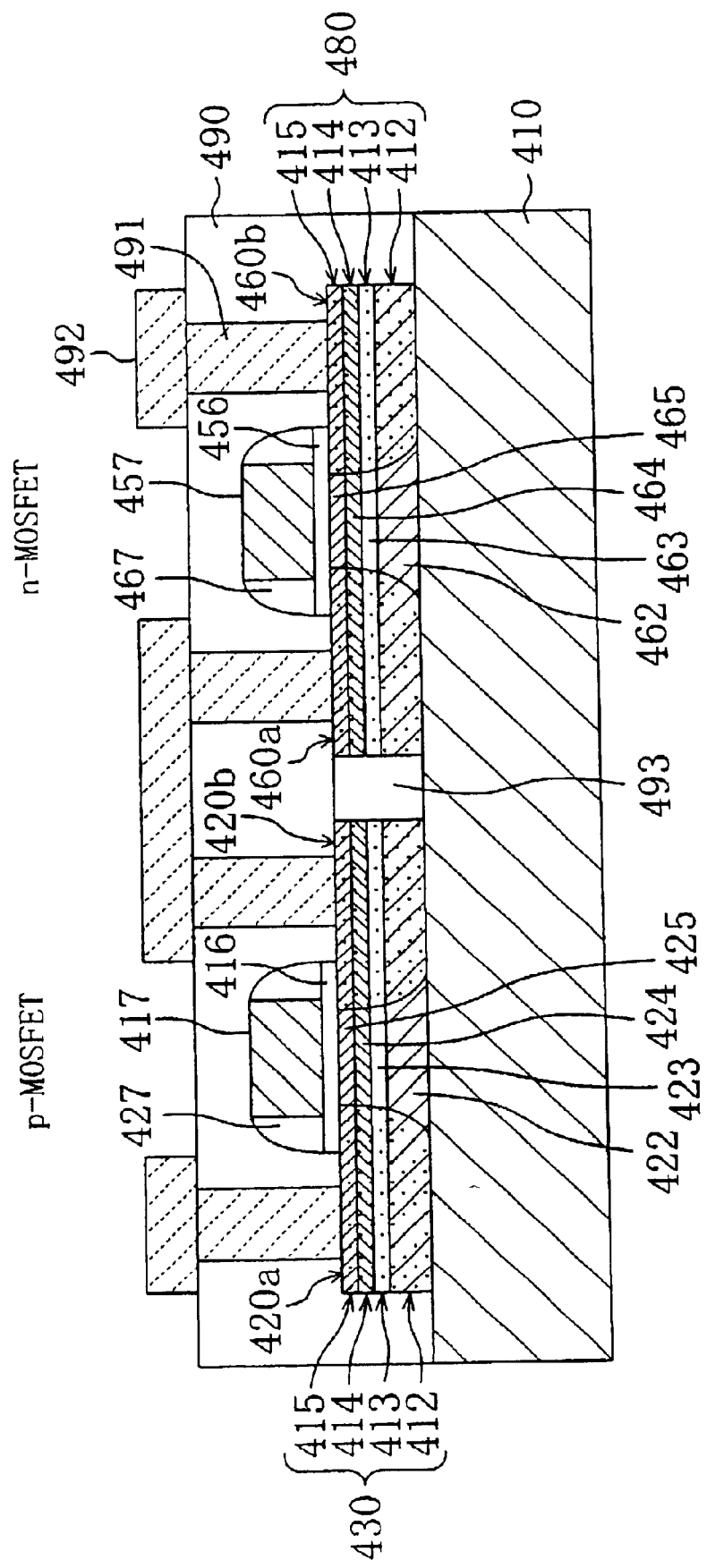
FIG. 32 is a cross-sectional view showing the structure of a CMOS device of a seventh embodiment.

FIG. 32 is a cross-sectional view of the CMOS device of this embodiment. As shown in FIG. 32, the CMOS of this embodiment includes a p-type Si substrate 410, a semiconductor layer 430 for a p-channel type MOSFET (p-MOSFET) and a semiconductor layer 480 for an n-channel type MOSFET (n-MOSFET) formed on the Si substrate 410. The semiconductor layers 430 and 480 are constituted by identical films formed at the same time.

The semiconductor layers 430 and 480 include upper Si layer 412 in an upper portion of the Si substrate 410, Si buffer layers 413 that have been epitaxially grown by a UHV-CVD method on the upper Si layer 412, SiGe films 414 that have been epitaxially grown by a UHV-CVD method on the Si buffer layers 413, and Si films 415 that have been epitaxially grown by a UHV-CVD method on the SiGe films 414. The upper Si layer 412 is about 50 nm thick. The Si buffer layer 413 is about 10 nm thick. The SiGe film 414 is about 15 nm thick. The Si film 415 is about 5 nm thick.

Furthermore, the p-MOSFET includes a gate insulator film 416 made of a silicon oxide film formed on the Si film 415, and a gate electrode 417 formed on the gate insulator film 416. A source region 420a and a drain region 420b containing p-type high concentration impurities are provided in regions on both sides of the gate electrode 417 of the semiconductor layer 430. Furthermore, a Si body region 422 containing n-type high concentration (about $1 \times 10^{19}$ atoms·cm$^{-3}$) impurities is formed in a region between the source region 420a and the drain region 420b of the upper Si film 412. An n$^-$ Si region 423 containing n-type low concentration impurities is formed in a region immediately above the Si body region 422 of the Si buffer layer 413. A SiGe channel region 424 containing n-type relatively low concentration (about $1 \times 10^{17}$ atoms·cm$^{-3}$) impurities are formed in a region between the source region 420a and the drain region 420b of the SiGe film 414. A Si cap layer 425 containing n-type low concentration impurities is formed in a region immediately below the gate insulator film 416 of the Si film 415. Furthermore, side walls 427 made of silicon oxide films are provided on side faces of the gate electrode 417.

The n-MOS device includes a gate insulator film 456 made of a silicon oxide film formed on the Si film 415, and a gate electrode 457 formed on the gate insulator films 456. A source region 460a and a drain region 460b containing n-type high concentration impurities are provided in regions on both sides of the gate electrode 457 of the semiconductor layer 480. Furthermore, a Si body region 462 containing p-type high concentration (about $1 \times 10^{19}$ atoms·cm$^{-3}$) impurities is formed in a region between the source region 460a and the drain region 460b of the upper Si film 412. A p$^-$ Si region 426 containing p-type low concentration impurities is formed in a region immediately above the Si body region 462 of the Si buffer layer 413. A SiGe channel region 464 containing p-type relatively low concentration (about $1 \times 10^{17}$ atoms·cm$^{-3}$) impurities are formed in a region between the source region 460a and the drain region 460b of the SiGe film 414. A Si cap layer 465 containing p-type low concentration impurities is formed in a region immediately below the gate insulator film 456 of the Si film 415. Side walls 467 made of silicon oxide films are provided on side faces of the gate electrodes 457.

Furthermore, interlayer insulator films 490, contacts 491 in contact with the source and the drain regions 420a, 420b, 460a and 460b through the interlayer insulator films 490, and source and drain electrodes 492 connected to the contacts 491 and extending upward from the interlayer insulator films 490 are provided on the substrate. Furthermore, a trench separation 493 for separating the semiconductor layers 430 and 480 from each other is provided.

Figure 33A:
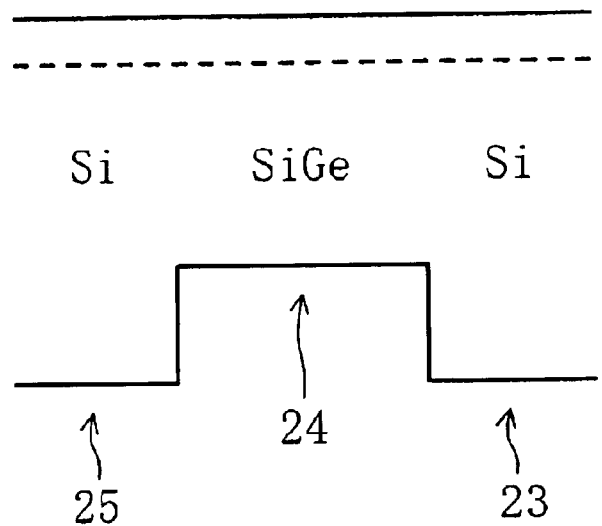
FIG. 33A is an energy band diagram showing the band structure in a Si/SiGe heterojunction portion for p channel.
Figure 33B:
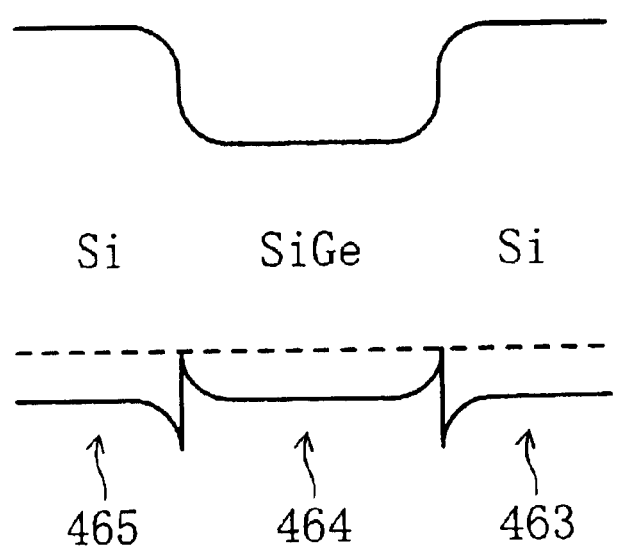
FIG. 33B is an energy band diagram showing the band structure in a Si/SiGe heterojunction portion for n channel.

FIGS. 33A and 33B are energy band diagrams showing the band structures of a Si/SiGe heterojunction portion for p-channel and a Si/SiGe heterojunction portion for n-channel, respectively. As shown in FIG. 33A, in the Si/SiGe heterojunction portion for p-channel, in general, a band offset (heterobarrier) appears mainly in the valence band edge, which is advantageous for hole confine. On the other hand, as shown in FIG. 33B, in the Si/SiGe heterojunction portion where a band offset is formed mainly in the valence band edge as well, a well for potentials due to the leap of the band is generated in the conduction band edge. Therefore it is possible to confine electrons in the SiGe channel region 464. Thus, by utilizing the Si/SiGe junction, an n-channel where electrons are confined in the SiGe layer and travel in the SiGe layer and a p-channel where holes are confined in the SiGe layer and travel in the SiGe layer can be formed.

In the production process of the complementary MOS of this embodiment, the upper Si film, which is a part of the Si substrate, includes an n$^+$ Si layer (p-MOSFET region) and a p$^+$ Si layer (n-MOSFET region) that have been previously doped with impurities in a concentration of about $1 \times 10^{19}$ atoms·cm$^{-3}$ by ion implantation before crystal growth. The trench separation 493 for separating the p-MOSFET region and the n-MOSFET region is protruded above from the surface of the substrate. All of the Si buffer layer, the SiGe film, and the Si cap layer epitaxially grown by a UHV-CVD method thereafter are undoped layers that are not doped with impurities in the as-grown state. After completion of crystal growth of the SiGe film and the Si cap layer, the vicinity of the SiGe channel region of the n-MOSFET region is doped with p-type impurities in a concentration of about $1 \times 10^{17}$ atoms·cm$^{-3}$ by ion implantation. The vicinity of the SiGe channel region of the p-MOSFET region is doped with n-type impurities in a concentration of about $1 \times 10^{17}$ atoms·cm$^{-3}$ by ion implantation. Then, the uppermost Si cap layer is subjected to thermal oxidation, and the obtained silicon oxide film is used as the gate insulator film, and a gate electrode made of polysilicon containing high concentration impurities is formed on the gate insulator film. Thereafter, p+ type source and drain regions doped with p-type high concentration impurities, and n+ type source and drain regions doped with n-type high concentration impurities are formed on both sides of each gate electrode. Furthermore, an interlayer insulator, a contact, and source and drain electrodes are formed.

According to the CMOS device having the Si/SiGe junction portion of this embodiment, when a p-type impurity concentration is introduced to a Si/SiGe junction portion, a well that is advantages for confining electrons in the conduction band edge is formed. In view of this fact, the Si/SiGe junction is used so that an n-MOSFET that allows high speed operations and has a large drive current can be obtained. In addition, providing this n-MOSFET on the Si substrate common to the conventionally known p-MOSFET having Si/SiGe junction portion, a CMOS device including n-MOSFET and p-MOSFET that allow high speed operations and have large drive current can be obtained.

The SiGe channel region can be replaced by SiGe containing 0.01% to 2% (e.g., about 0.1%) of carbons, namely a SiGeC layer.

Experimental Data

Next, data from actual measurement of the present invention will be described.

Figure 34A:
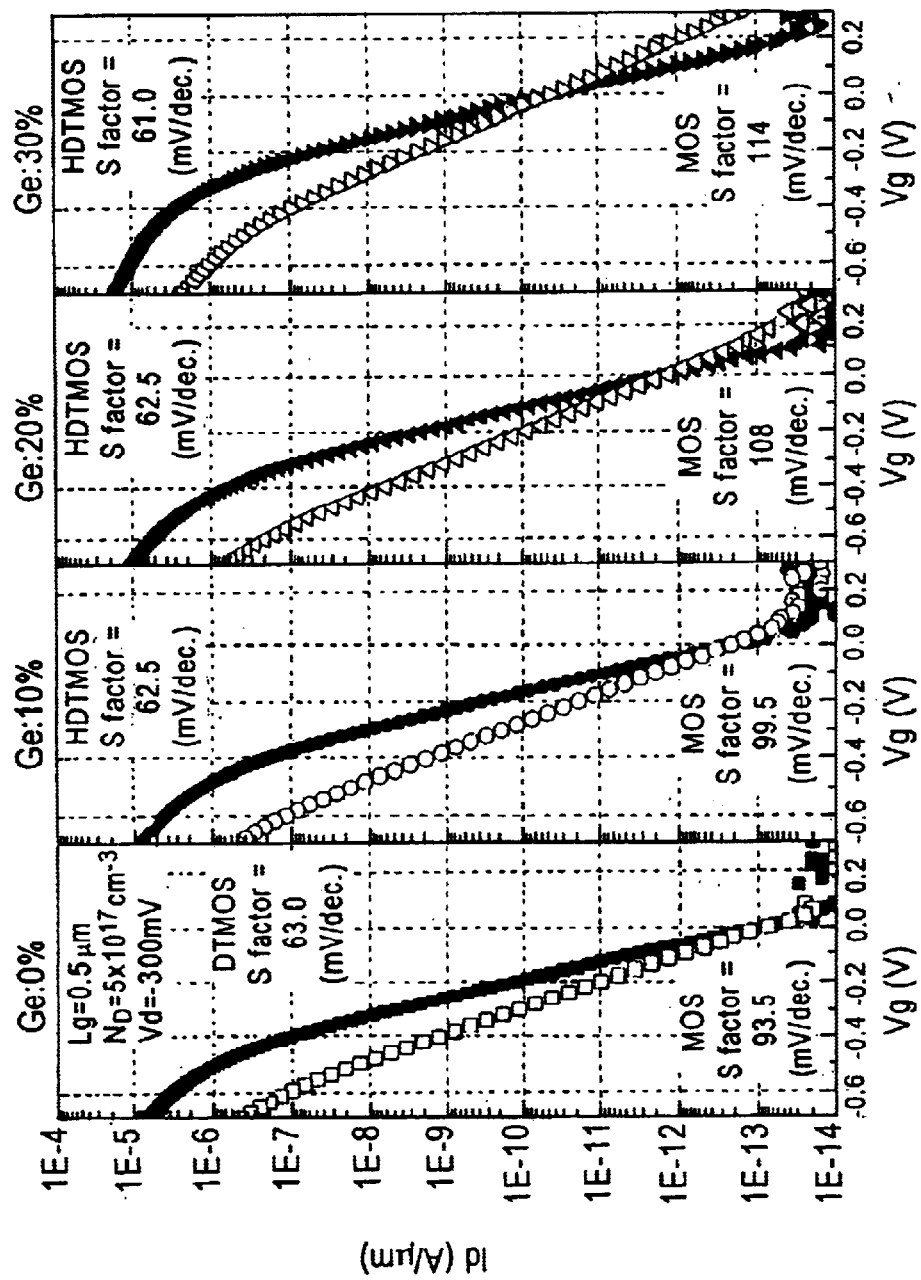
FIGS. 34A and 34B are graphs showing data of the gate bias Vg dependence of the drain current Id and the gate overdrive dependence of the transconductance, respectively, of the HDTMOS of the present invention and the conventional MOS, when measured with varied Ge contents of the channel region.

FIG. 34A is a graph showing data of the gate bias Vg dependence of the drain current Id measured with varied Ge contents of the SiGe channel region of 0%, 10%, 20% and 30%. As shown in FIG. 34A, as the Ge content is increased, the threshold voltage is decreased with respect to the same gate bias, in comparison with the conventional Si homojunction type DTMOS (see the graph on the far left side in FIG. 34A).

Figure 34B:
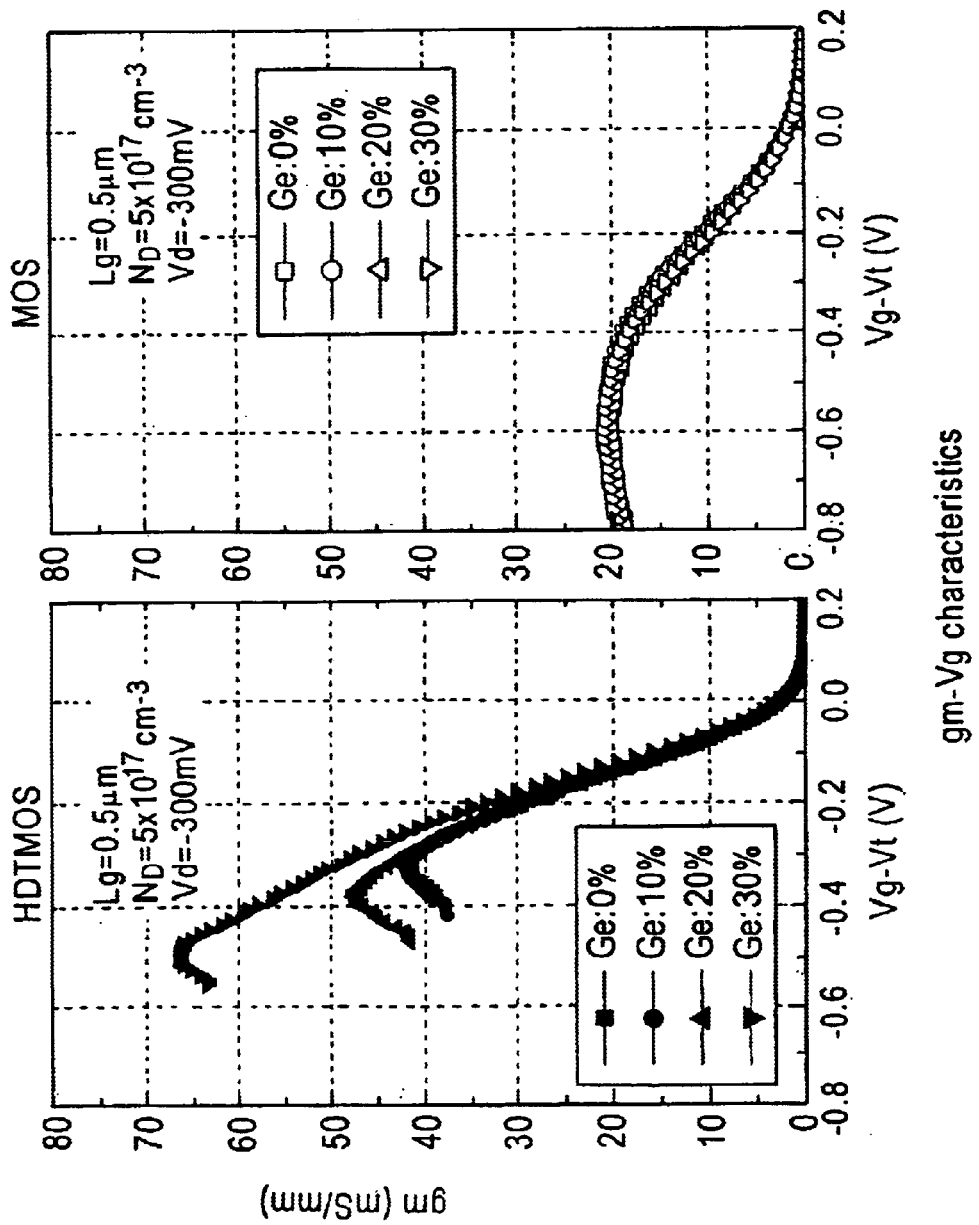

FIG. 34B is a graph showing the gate overdrive dependence of the transconductance of the HDTMOS of the present invention and the conventional MOS, using the Ge content as the parameter. As shown in FIG. 34B, the HDTMOS of the present invention significantly improves the transconductance gm in comparison with the conventional MOS.

Figure 35A:
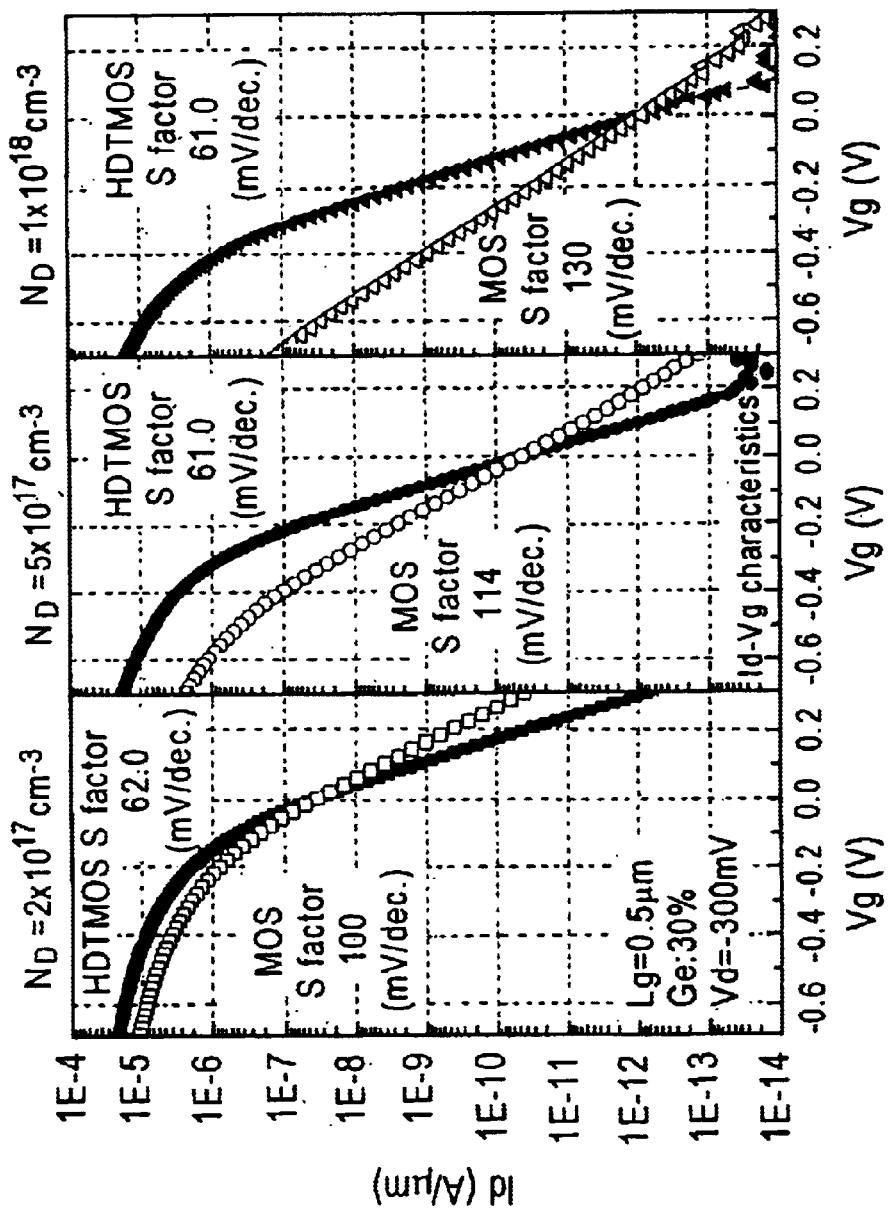
FIGS. 35A and 35B are graphs showing the gate bias Vg dependence of the drain current Id and the gate overdrive dependence of the transconductance, respectively, of the HDTMOS of the present invention and the conventional MOS, when measured with varied impurity concentrations of the channel region.

FIG. 35A is a graph showing the gate bias Vg dependence of the drain current Id measured with varied n-type impurity concentration $N_D$ for the Si body region of $2 \times 10^{17}$ cm$^{-3}$, $5 \times 10^{17}$ cm$^{-3}$, and $1 \times 10^{18}$ cm$^{-3}$. As shown in FIG. 35A, as the impurity concentration in the Si body region is increased, the drain current Id is decreased with respect to the same gate bias. This is believed to be due to an increase of the threshold voltage.

Figure 35B:
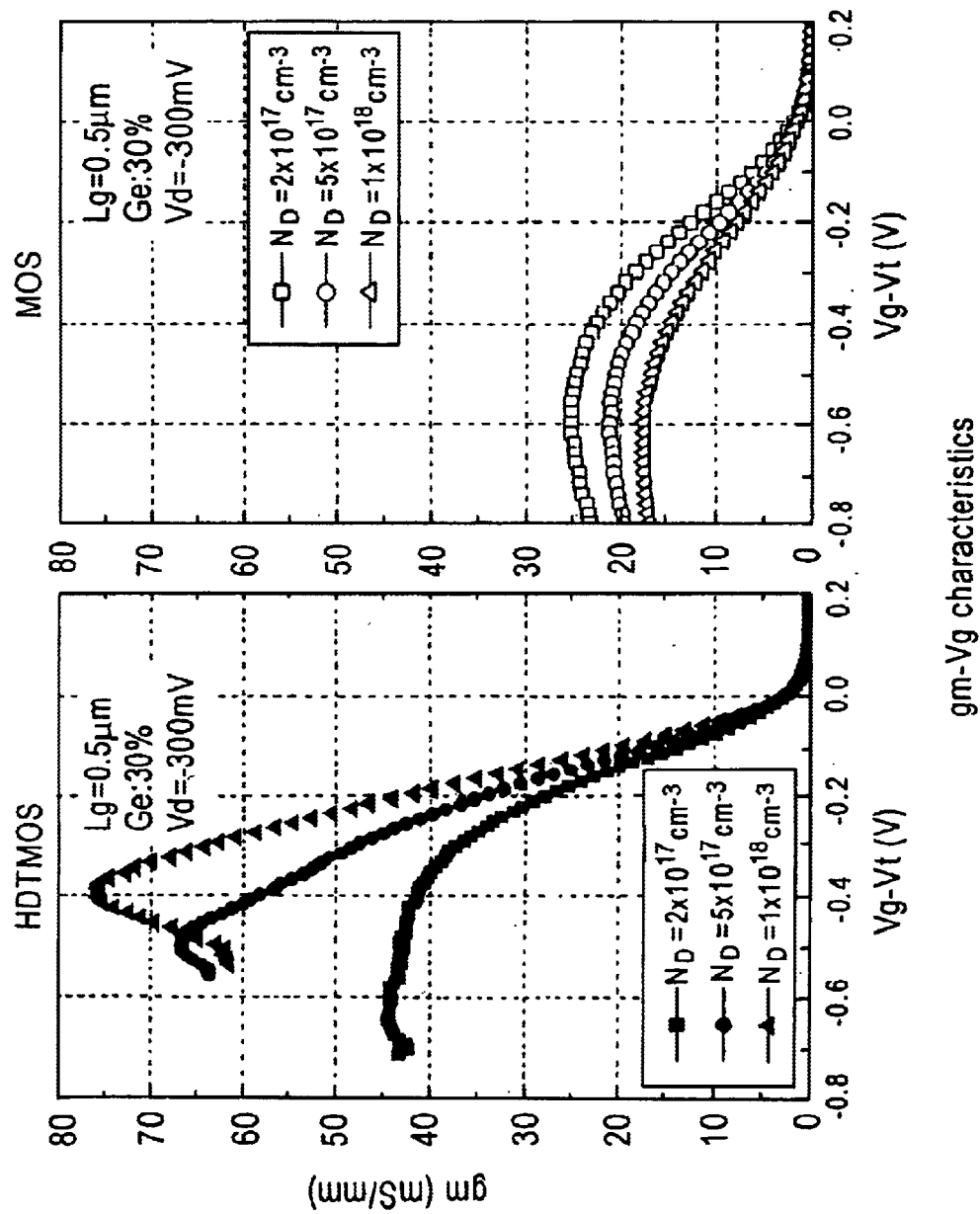

FIG. 35B is a graph showing data of the gate overdrive dependence of the transconductance of the HDTMOS of the present invention and the conventional MOS. The HDTMOS of the present invention significantly improves the transconductance gm from the conventional MOS as in FIG. 34B.

Figure 36:
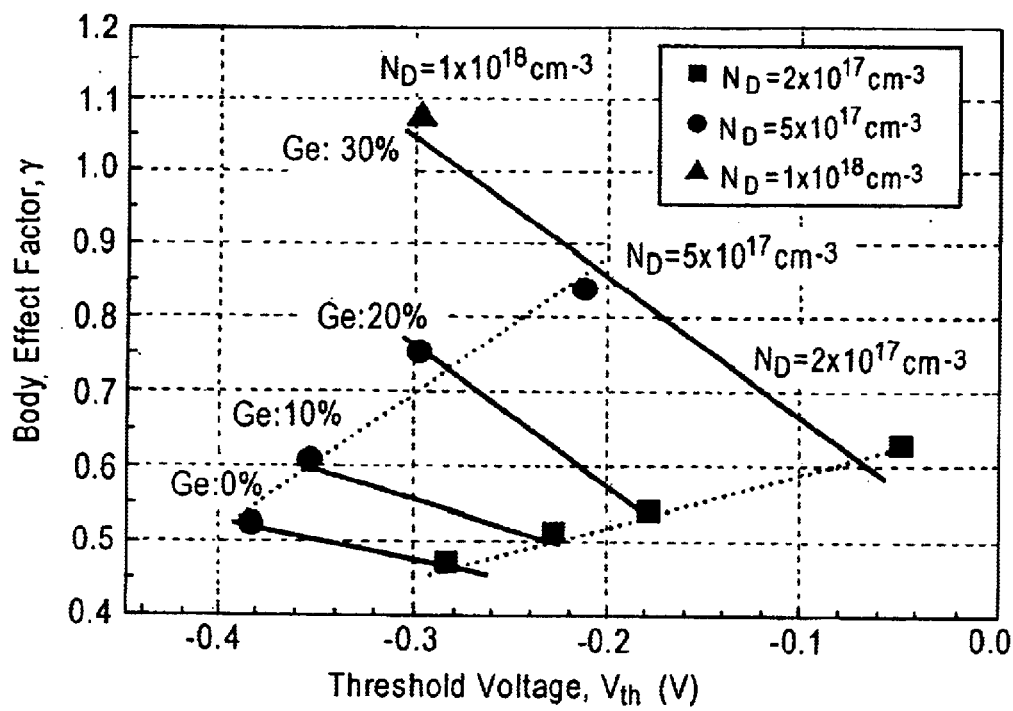
FIG. 36 is a graph showing the correlation between the body effect factor γ and the threshold voltage of the present invention, using the Ge content and the impurity concentration of the channel region as the parameters.

FIG. 36 is a graph showing the correlation between the body effect factor γ and the threshold voltage using the Ge content and the impurity concentration of the Si body region as the parameters. As shown in FIG. 36, the present invention can resolve a trade-off between the lowering of the threshold voltage and the increase of the body effect factor γ, which is a conventional problem.

On the other hand, in a DTMOS, a larger body effect factor γ is preferable. The body effect factor γ is expressed by the following formula:

$$\gamma = |\Delta Vth|/|\Delta Vbs|$$

where Δ Vth is the shift amount of the threshold voltage, and Δ Vbs is the shift amount of the body-source voltage.

In a DTMOS, since the body region and the gate electrode are electrically connected, when the gate voltage is increased, the voltage of the body region is accordingly increased. When the gate voltage is a power supply voltage Vdd, the shift amount of the threshold voltage is expressed by: ΔVth=γ·Vdd.

The gate over-drive amount of the conventional MOSFET is expressed by (Vdd–Vth). However, in the case of the DTMOS, the gate over-drive amount is (Vdd–Vth–ΔVth= Vdd–Vth–γVdd), and therefore as γ is larger, the driving current becomes larger.

Referring to FIG. 36, in comparison of γ between a plurality of HDTMOSs having the same Ge content, the trade-off relationship in the conventional Si homojunction type DTMOS can be observed in the HDTMOS. More specifically, the HDTMOS that has a higher impurity concentration in the body region has a larger γ, and the threshold voltage Vth is increased as well.

On the other hand, in comparison of γ between a plurality of HDTMOSs having the same impurity concentration in the body region, as the Ge content of the HDTMOS is increased, the threshold voltage is decreased, and γ is increased. This is due to the fact that the SiGe channel is of a buried channel structure.

Therefore, the HDTMOS including the SiGe channel and having a high impurity concentration $N_D$ in the body region provides a larger γ, even if the threshold voltage is substantially the same as that of a Si homojunction type DTMOS. This is seen, for example, when in FIG. 36, the γ value at Ge of 30% and $N_D$ of $1 \times 10^{18}$ cm$^{-3}$ is compared with the γ value at Ge of 0% and $N_D$ of $2 \times 10^{17}$ cm$^{-3}$.

Figure 37:
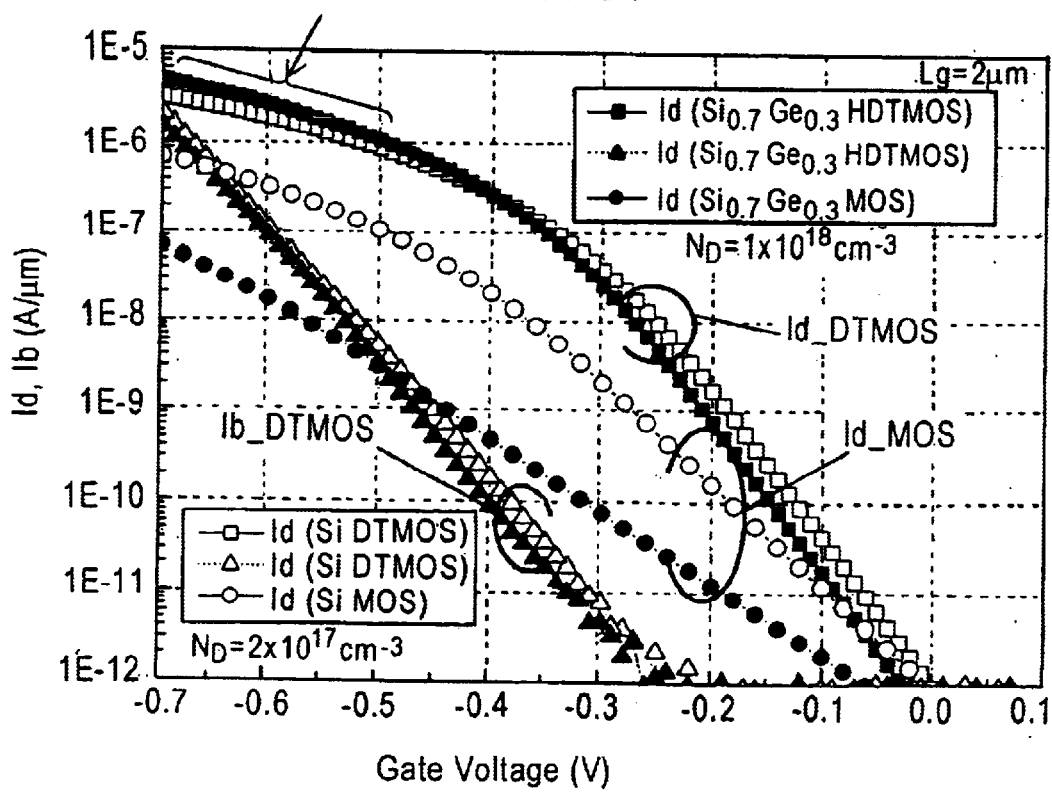
FIG. 37 is a graph showing Id and Ig-Vg characteristics of MOS, Si/SiGe-MOS, Si homojunction type DTMOS and Si/SiGe-HDTMOS.

FIG. 37 is a graph showing the Id, Ib-Vg characteristics of MOS (data shown by ○), Si/SiGe-MOS (a Ge content of 30%) (data shown by ●), Si homojunction type DTMOS (data shown by □), and Si/SiGe-HDTMOS (a Ge content of 30%)(data shown by ■). The impurity concentration in the body region in the MOS and the Si homojunction type DTMOS is $2 \times 10^{17}$ cm$^{-3}$, and the impurity concentration in the body region in the Si/SiGe-MOS and the Si/SiGe-HDTMOS is $1 \times 10^{18}$ cm$^{-3}$. As shown in the portion pointed by the arrow in FIG. 37, when Si homojunction type DTMOS (data shown by □) is compared with Si/SiGe-HDTMOS (data shown by ■), Si/SiGe-HDTMOS has a larger drain current Id in the range in which the gate voltage is an operating voltage.

Figure 38:
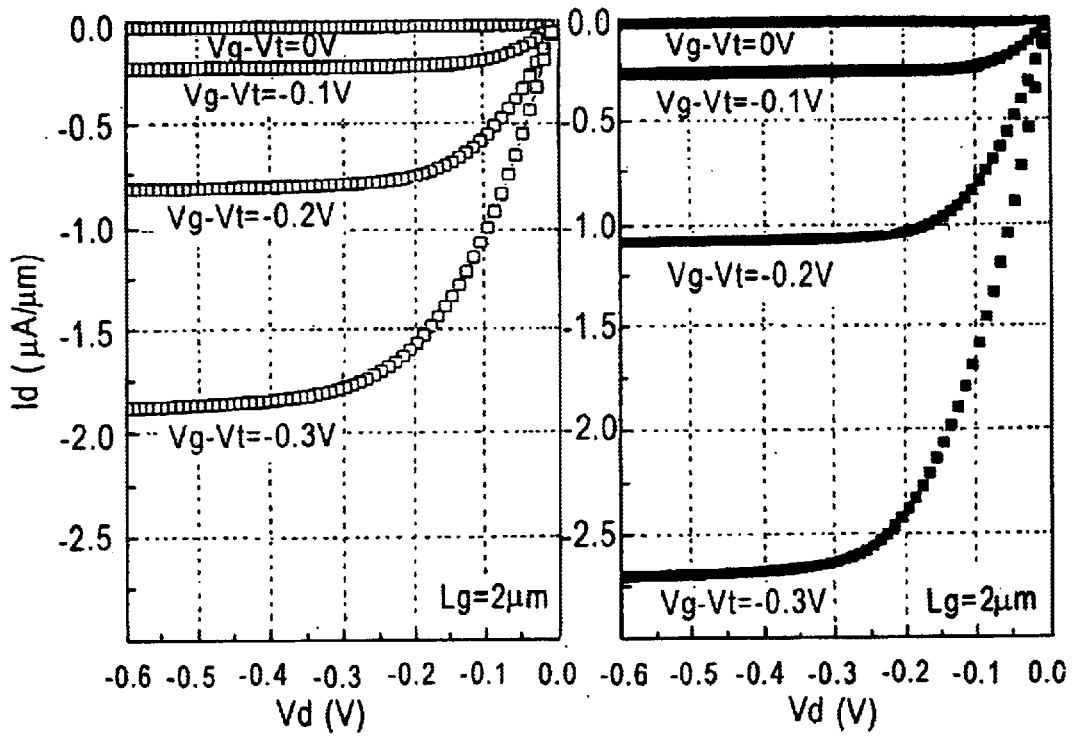
FIG. 38 is a graph showing comparison of the Id-Vd characteristics of Si homojunction type DTMOS and Si/SiGe-HDTMOS.

FIG. 38 is a graph showing the Id-Vd characteristics of the Si homojunction type DTMOS (data shown by □) and the Si/SiGe-HDTMOS (a Ge content of 30%)(data shown by ■)in detail. As shown in FIG. 38, when the Si homojunction type DTMOS (data shown by □) and the Si/SiGe-HDTMOS (data shown by ■)are compared, the Si/SiGe-HDTMOS has a larger drain current Id when the (Vg-Vt (Vth)) of the former and the latter is the same value.

Figure 39:
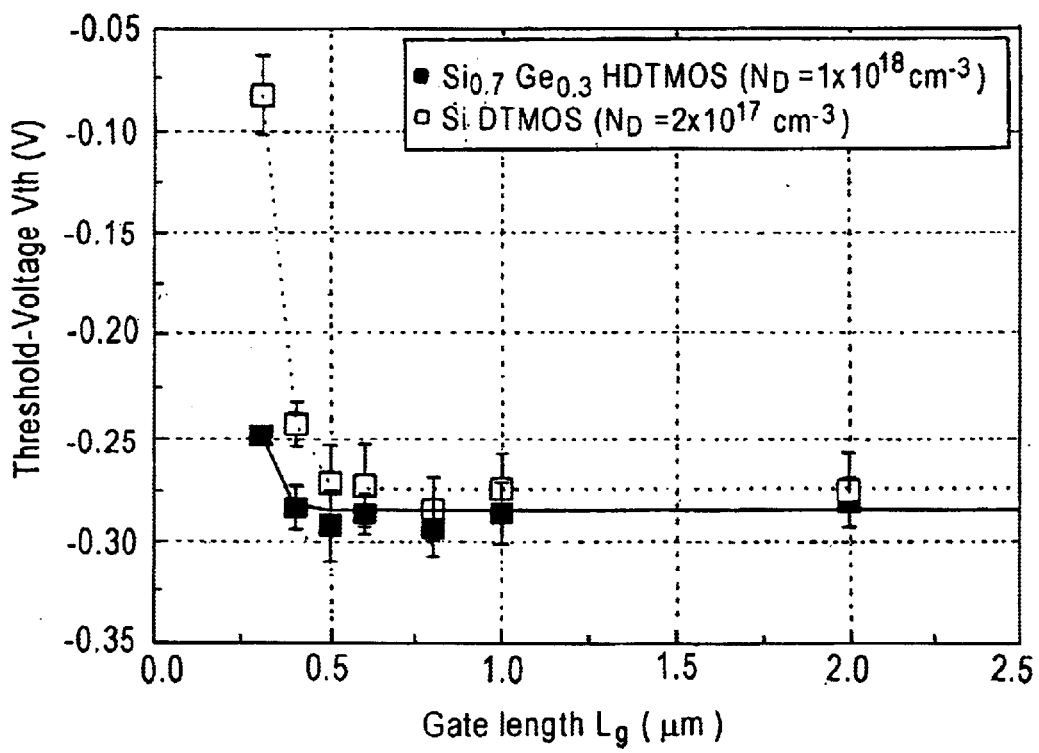
FIG. 39 is a graph showing comparison in greater detail of the short channel effect of Si homojunction type DTMOS and Si/SiGe-HDTMOS.

FIG. 39 is a graph showing the gate length dependence of threshold voltage of the Si homojunction type DTMOS (data shown by □) and the Si/SiGe-HDTMOS (a Ge content of 30%)(data shown by ■) in detail. As shown in FIG. 39, the Si/SiGe-HDTMOS (data shown by ■) has the threshold voltage Vth maintained higher than that of the Si homojunction type DTMOS (data shown by □) in the range in which the gate length is 0.5 μm or less. Thus, the resistance against the short channel effect is improved in the Si/SiGe-HDTMOS.

Eighth Embodiment

In the first to sixth embodiments, the band gap difference between the Si layer and the SiGe layer or the SiGeC layer is focused so as to lower the threshold voltage. In this embodiment, the potential difference at the band edge where carriers travel that is generated between the Si layer under strain and the SiGe layer with a relaxed lattice strain is focused so as to lower the threshold voltage and raise the driving current.

FIG. 40 is a cross-sectional view of a HDTMOS functioning as an n-channel type transistor in this embodiment. As shown in FIG. 40, the HDTMOS of this embodiment includes a p-type Si substrate 510, a gradient SiGe film 513 epitaxially grown by a UHV-CVD method on the Si substrate 510, a relaxed SiGe film 514 in which the lattice strain is relaxed that is epitaxially grown by a UHV-CVD method on the gradient SiGe film 513, and a Si film 515 under tensile strain that is epitaxially grown by a UHV-CVD method on the relaxed SiGe film 514. The HDTMOS further includes a gate insulator film 516 made of a silicon oxide film provided on the Si film 515 and a gate electrode 517 provided on the gate insulator film 516. A source region 520a and a drain region 520b containing n-type high concentration impurities are provided in regions on both sides of the gate electrode 517 of the relaxed SiGe film 514 and the Si film 515. A SiGe body region 524 containing p-type high concentration impurities are provided in a region between the source region 520a and the drain region 520b of the relaxed SiGe film 514. A Si channel region 525 (n-channel) where light electrons having small effective mass travel at a high mobility out of degeneration by being under tensile strain is provided in a region between the source region 520a and the drain region 520b of the Si film 515. A contact 526 that is a conductive member electrically connected to the gate electrode 517 and the relaxed SiGe body region 524.

The gradient SiGe film 513 has a gradient composition of a Ge content of 0% at the lower end and 30% at the upper end. The relaxed SiGe film 514 has a uniform composition of a Ge content of 30%. The thickness of the relaxed SiGe film 514 is more than the critical thickness at which the lattice strain is relaxed, for example 2 µm, and the thickness of the Si film 515 is about 20 nm. P-type impurities (e.g., boron) in a concentration of about $1 \times 10^{19}$ atoms·cm$^{-3}$ are introduced to the SiGe body region 524 by ion implantation. An upper portion of the gradient SiGe film 513 contains impurities diffused from the SiGe body region 524, and the source region 520a and the drain region 520b in a low concentration. On the other hand, a lower portion of the gradient SiGe film 513 is an undoped layer. The Si channel region 525 contains p-type low concentration impurities (e.g., boron). However, the Si channel region 525 may be an undoped layer. The gate insulator film 516 is formed by thermally oxidizing the Si film 515. The gate electrode 517 is doped with n-type impurities (e.g., arsenic or phosphorus) in a concentration of about $1 \times 10^{20}$ atoms·cm$^{-3}$. Side walls 527 made of silicon oxide films are provided on the sides of the gate electrode 517.

FIG. 41 is an energy band diagram showing the band structure across the body region 524 made of the relaxed SiGe film, and the Si channel region 525 made of the Si film under strain. As shown in FIG. 41, the potential at the conduction band edge of the Si channel region 525 is lower than the potential of the conduction band edge of the body region 524. Therefore, the threshold at the n-channel where the carriers are electrons is decreased.

In this embodiment, in the n-channel, the potential at the conduction band edge, which is a band edge where carriers travel, is made smaller than that of the body region. In the p-type channel, the valence band edge, which is a band edge where the carriers travel, is made smaller than that of the body region (i.e., the energy level is made high). This makes it possible to lower the threshold voltage while suppressing generation of parasitic channels.

Figure 42:
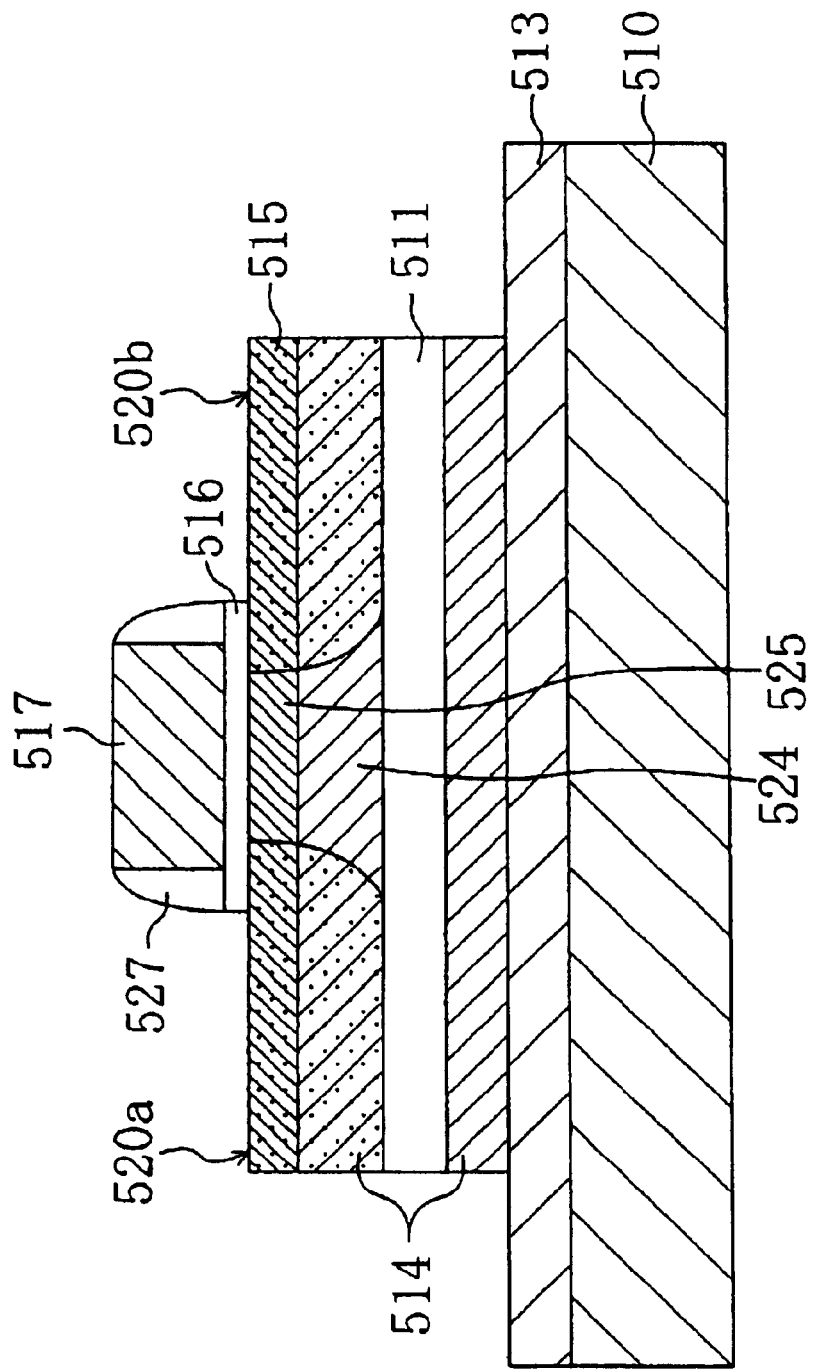
FIG. 42 is a cross-sectional view of a HDTMOS of a variation of the eighth embodiment.

FIG. 42 is a cross-sectional view of a HDTMOS in a variation of this embodiment. As shown in FIG. 42, the HDTMOS of this variation includes a p-type Si substrate 510, a gradient SiGe film 513 having the same structure as in FIG. 40, a relaxed SiGe film 514 provided on the gradient SiGe film 513 and having the same structure as in FIG. 40, and a Si film 515 under tensile strain that is epitaxially grown by the UHV-CVD method on the relaxed SiGe film 514. Then, in this embodiment, a buried oxide film 511 is formed by oxygen ion implantation into the relaxed SiGe film 514, or the like. On the Si film under strain, the same structure as that shown in FIG. 40 is provided. In this variation, the same effects as those in the eighth embodiment shown in FIG. 40 can be provided, and in addition, the operation speed can be improved by reduction of parasitic capacitance.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
    a substrate;
    a semiconductor layer provided in a part of the substrate;
    a gate insulator film provided on the semiconductor layer;
    a gate electrode provided on the gate insulator film;
    source and drain regions of a first conductivity type provided in regions on both sides of the gale electrode of the semiconductor layer;
    a channel region made of a first semiconductor provided in a region between the source and drain regions of the semiconductor layer;
    a body region made of a second semiconductor of a second conductivity type having a larger potential for carriers at a band edge where carriers travel than that of the first semiconductor, provided in a region below the channel region of the semiconductor layer; and
    a conductor member for electrically connecting the gate electrode and the body region,
    wherein the concentration of impurities in the body region is equal to or more than $5 \times 10^{17}$ cm$^{-3}$, and
    the threshold voltage is equal to or less than 0.3 v.

2. The semiconductor device according to claim 1, further comprising a cap layer made of a semiconductor having a larger potential for carriers at a band edge where carriers travel than that of the first semiconductor, provided in a region between the channel region and the gate insulator film of the semiconductor layer.

3. The semiconductor device according to claim 1, wherein at least an uppermost portion of the substrate is constituted by an insulator.

4. The semiconductor device according to claim 1, wherein the channel region contains impurities in a lower concentration than that of the body region by 1/10 or less.

5. The semiconductor device according to claim 1, wherein the gate electrode is constituted by polysilicon or polysilicon germanium containing impurities of the first conductivity type.

6. The semiconductor device according to claim 1, wherein the first semiconductor constituting the channel region contains at least Si as a constituent element, and
a portion of the semiconductor layer further includes a region for preventing impurities from diffusing to the channel that contains carbon in a concentration from 0.01% to 2%.

7. The semiconductor device according to claim 1, wherein the first semiconductor is a semiconductor containing Si (silicon) and Ge (germanium) as constituent elements, and the second semiconductor is Si.

8. The semiconductor device according to claim 7, further comprising a cap layer made of Si, provided between the gate insulator film and the channel region.

9. The semiconductor device according to claim 7, wherein the source and drain regions are p-type source and drain regions, the channel region is a channel region for p-channel MOSFET, and the body region is an n-type body region.

10. The semiconductor device according to claim 7, wherein the source and drain regions are n-type source and drain regions, the channel region is a channel region for n-channel MOSFET, and the body region is a p-type body region.

11. The semiconductor device according to claim 9, comprising:
another semiconductor layer provided on the substrate;
another gate insulator film provided on the other semiconductor layer;
another gate electrode provided on the other gate insulator film;
n-type source and drain regions provided in regions on both sides of the other gate electrode of the other semiconductor layer;
a channel region for n-channel containing Si and Ge as constituent elements, and provided in a region between the n-type source and drain regions of the other semiconductor layer;
a p-type body region made of Si provided in a region below the channel region for n-channel of the other semiconductor layer; and
another conductor member for electrically connecting the other gate electrode and the p-type body region,
wherein the semiconductor device functions as a complementary type device.

12. The semiconductor device according to claim 1, wherein the first semiconductor is a semiconductor containing Si and C (carbon) as constituent elements, and the second semiconductor is Si.

13. The semiconductor device according to claim 12, further comprising a cap layer made of Si provided between the gate insulator film and the channel region.

14. The semiconductor device according to claim 12, wherein the source and drain regions are p-type source and drain regions, the channel region is a channel region for p-channel MOSFET, and the body region is an n-type body region.

15. The semiconductor device according to claim 14, comprising:
another semiconductor layer provided on the substrate;
another gate insulator film provided on the another semiconductor layer;
another gate electrode provided on the another gate insulator film;
n-type source and drain regions provided in regions on both sides of the another gate electrode of the another semiconductor layer;
a channel region for n-channel containing Si and C as constituent elements, provided in a region between the n-type source and drain regions of the another semiconductor layer;
a p-type body region made of Si, provided in a region below the channel region for n-channel of the other semiconductor layer; and
another conductor member for electrically connecting the another gate electrode and the p-type body region,
wherein the semiconductor device functions as a complementary type device.

16. The semiconductor device according to claim 12, wherein the source and drain regions are n-type source and drain regions, the channel region is a channel region for n-channel MOSFET, and the body region is a p-type body region.

17. The semiconductor device according to claim 1, wherein the first semiconductor is Si under tensile strain, and the second semiconductor is SiGe where lattice strain is relaxed.

18. The semiconductor device according to claim 1, wherein the first semiconductor is a semiconductor containing Si, Ge and C as constituent elements, and the second semiconductor is Si.

19. The semiconductor device according to claim 18, further comprising a cap layer made of Si provided between the gate insulator film and the channel region.

20. The semiconductor device according to claim 18, wherein the source and drain regions are p-type source and drain regions, the channel region is a channel region for p-channel MOSFET, and the body region is an n-type body region.

21. The semiconductor device according to claim 20, comprising:
another semiconductor layer provided on the substrate;
another gate insulator film provided on the another semiconductor layer;
another gate electrode provided on the another gate insulator film;
n-type source and drain regions provided in regions on both sides of the another gate electrode of the another semiconductor layer;
a channel region for n-channel containing Si, Ge and C as constituent elements, provided in a region between the n-type source and drain regions of the another semiconductor layer;
a p-type body region made of Si, provided in a region below the channel region of the another semiconductor layer; and
another conductor member for electrically connecting the another gate electrode and the p-type body region,
wherein the semiconductor device functions as a complementary type device.

22. The semiconductor device according to claim 18, wherein the source and drain regions are n-type source and drain regions, the channel region is a channel region for n-channel MOSFET, and the body region is a p-type body region.

23. The semiconductor device according to claim 1 wherein the source and drain regions are p-type source and drain regions, the channel region is a channel region for p-channel MOSFET containing Si and Ge as constituent elements, and the body region is an n-type body region made of Si, the semiconductor device further comprising:
- a SIC layer containing Si and C as constituent elements, provided in contact with either one face of an upper face and a lower face of the channel region for p-channel MOSFET;
- another semiconductor layer provided on the substrate;
- another gate insulator film provided on the another semiconductor layer;
- another gate electrode provided on the another gate insulator film;
- n-type source and drain regions provided in regions at both sides of the another gate electrode of the another semiconductor layer;
- a channel region for n-channel containing Si and C as constituent elements, provided in a region between the n-type source and drain regions of the another semiconductor layer;
- a SiGe layer containing Si and Ge as constituent elements, provided in contact with either one face of an upper face and a lower face of the channel region for n-channel MOSFET;
- a p-type body region made of Si, provided in a region below the channel region for n-channel MOSFET of the another semiconductor layer; and
- another conductor member for electrically connecting the another gate electrode and the p-type body region.

24. The semiconductor device according to claim 23, further comprising;
- a cap layer made of Si provided between the gate insulator film and the channel region for p-channel MOSFET; and
- another cap layer made of Si provided between the other gate insulator film and the channel region for n-channel MOSFET.

* * * * *